US008654306B2

(12) United States Patent
Shiraishi et al.

(10) Patent No.: US 8,654,306 B2
(45) Date of Patent: Feb. 18, 2014

(54) EXPOSURE APPARATUS, CLEANING METHOD, AND DEVICE FABRICATING METHOD

(75) Inventors: Kenichi Shiraishi, Saitama (JP); Yosuke Shirata, Saitama (JP); Masahiko Okumura, Tokyo (JP)

(73) Assignee: Nikon Corporation, Tokyo (JP)

( * ) Notice: Subject to any disclaimer, the term of this patent is extended or adjusted under 35 U.S.C. 154(b) by 810 days.

(21) Appl. No.: 12/385,506

(22) Filed: Apr. 9, 2009

(65) Prior Publication Data

US 2009/0316120 A1    Dec. 24, 2009

Related U.S. Application Data

(60) Provisional application No. 61/071,132, filed on Apr. 14, 2008, provisional application No. 61/071,416, filed on Apr. 28, 2008.

(51) Int. Cl.
*G03B 27/52* (2006.01)

(52) U.S. Cl.
USPC .......................................... 355/30

(58) Field of Classification Search
USPC ................... 355/30, 53, 67, 72, 77
See application file for complete search history.

(56) References Cited

U.S. PATENT DOCUMENTS

| | | | |
|---|---|---|---|
| 4,465,368 A | 8/1984 | Matsuura et al. | |
| 5,493,403 A | 2/1996 | Nishi | |
| 6,208,407 B1 | 3/2001 | Loopstra et al. | |
| 6,262,796 B1 | 7/2001 | Loopstra et al. | |
| 6,341,007 B1 | 1/2002 | Nishi et al. | |
| 6,611,316 B2 | 8/2003 | Sewell | |
| 6,721,039 B2 | 4/2004 | Ozawa | |
| 6,778,257 B2 | 8/2004 | Bleeker et al. | |
| 6,897,963 B1 | 5/2005 | Taniguichi et al. | |
| 7,023,610 B2 | 4/2006 | Ohtsuki et al. | |
| 7,119,874 B2 | 10/2006 | Cox et al. | |
| 2002/0041377 A1 | 4/2002 | Hagiwara et al. | |
| 2002/0061469 A1 | 5/2002 | Tanaka | |
| 2004/0114117 A1 | 6/2004 | Bleeker | |
| 2005/0205108 A1 | 9/2005 | Chang et al. | |
| 2006/0023185 A1 | 2/2006 | Hazelton et al. | |

(Continued)

FOREIGN PATENT DOCUMENTS

| | | |
|---|---|---|
| EP | 1 079 223 A1 | 2/2001 |
| EP | 1 510 871 A2 | 3/2005 |

(Continued)

OTHER PUBLICATIONS

Written Opinion of the International Searching Authority based on International Application No. PCT/JP2009/057817 dated Sep. 24, 2009.

(Continued)

*Primary Examiner* — Glen Kao
(74) *Attorney, Agent, or Firm* — Oliff PLC

(57) ABSTRACT

An exposure apparatus exposes a substrate with exposure light that passes through an exposure liquid. The exposure apparatus comprises: an optical member, which has an emergent surface wherefrom the exposure light emerges; a first supply port, which supplies the exposure liquid; a liquid immersion member, which is capable of forming an immersion space so that an optical path of the exposure light that emerges from the optical member is filled with the exposure liquid; a second supply port, which supplies a cleaning liquid so that it contacts the liquid immersion member; and a preventive apparatus, which prevents the cleaning liquid and the optical member from contacting one another.

38 Claims, 25 Drawing Sheets

(56) References Cited

U.S. PATENT DOCUMENTS

2006/0023186 A1    2/2006  Binnard
2006/0103818 A1    5/2006  Holmes et al.
2006/0164616 A1    7/2006  Okada
2006/0209281 A1    9/2006  Hayashi
2007/0127006 A1    6/2007  Shibazaki
2007/0222958 A1    9/2007  Nishii
2007/0247601 A1   10/2007  Hazelton et al.
2007/0258072 A1   11/2007  Nagasaka et al.
2007/0291239 A1   12/2007  Shiraishi
2008/0002164 A1    1/2008  Chang et al.

FOREIGN PATENT DOCUMENTS

| EP | 1 713 113 A1 | 10/2006 |
| EP | 1 791 164 A1 | 5/2007 |
| EP | 1 821 337 A1 | 8/2007 |
| EP | 1 865 542 A1 | 12/2007 |
| EP | 1 895 571 A1 | 3/2008 |
| JP | A-10-303114 | 11/1998 |
| WO | WO 01/35168 A1 | 5/2001 |
| WO | WO 2004/019128 A2 | 3/2004 |
| WO | WO 2005/122218 A1 | 12/2005 |
| WO | WO 2006/062065 A1 | 6/2006 |

OTHER PUBLICATIONS

International Search Report based on International Application No. PCT/JP2009/057817 dated Sep. 24, 2009.
Written Opinion of the International Searching Authority based on International Application No. PCT/JP2009/057817 completed on Sep. 18, 2009.
International Search Report based on International Application No. PCT/JP2009/057817 completed on Sep. 18, 2009.
Singapore Patent Office, Office Action mailed Mar. 28, 2012 in Singapore Patent Application No. 201007434-2.
Jul. 12, 2013 Office Action issued in European Patent Application No. 09732306.7.
European Office Action issued Nov. 30, 2012 in European Patent Application No. 09732306.7.

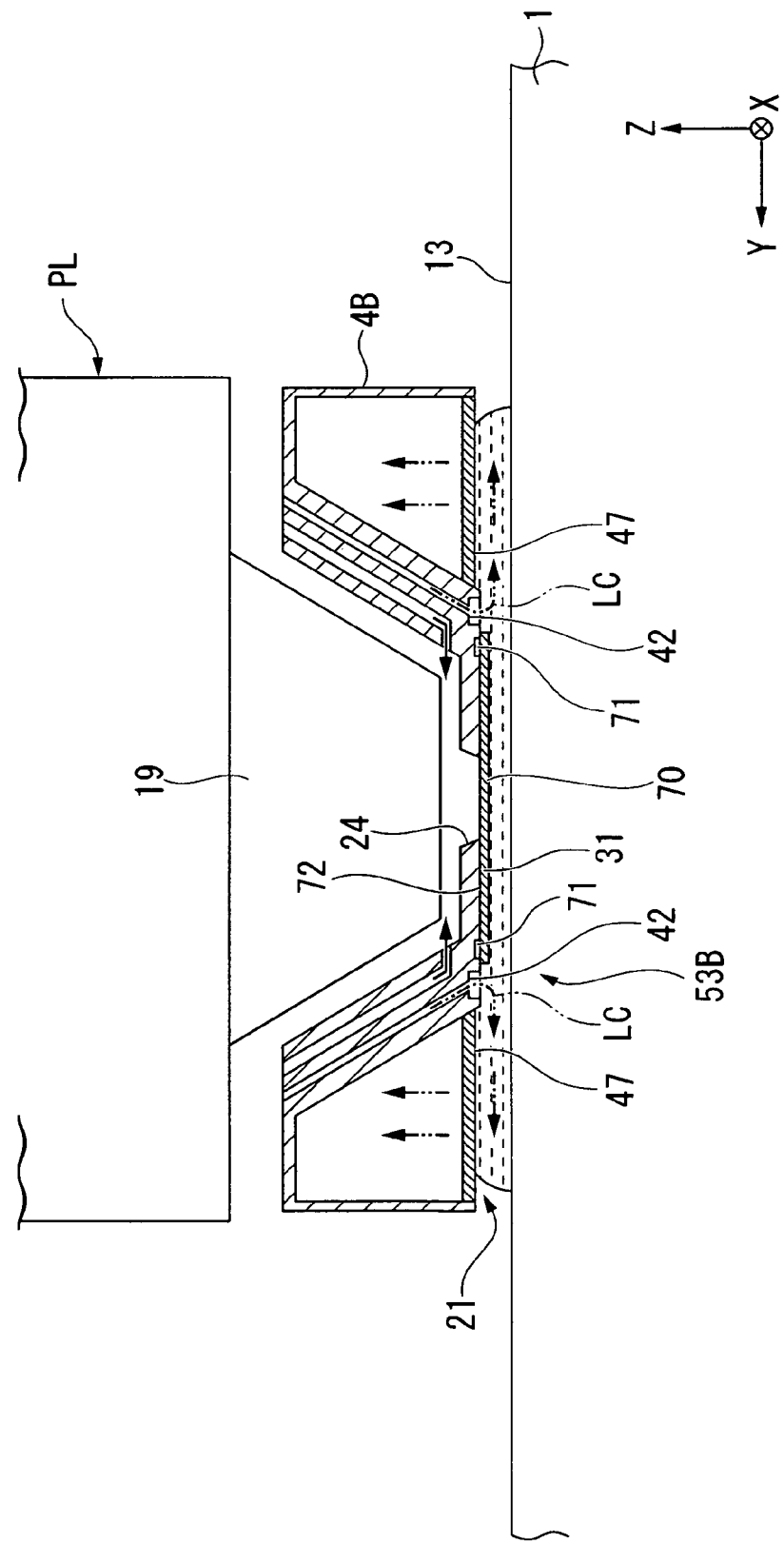

EXPOSURE APPARATUS, CLEANING METHOD, AND DEVICE FABRICATING METHOD

CROSS-REFERENCE TO RELATED APPLICATION

This application is a non-provisional application claiming priority to and the benefit of U.S. provisional application No. 61/071,132, filed Apr. 14, 2008, and U.S. Provisional Application No. 61/071,416, filed Apr. 28, 2008. The entire contents of which are incorporated herein by reference.

BACKGROUND

1. Field of the Invention

The present invention relates to an exposure apparatus that exposes a substrate with exposure light that passes through a liquid, a method of cleaning the exposure apparatus, and a device fabricating method.

2. Description of Related Art

Among exposure apparatuses used in photolithography, one that is well known to those skilled in the art is an immersion exposure apparatus that exposes a substrate with exposure light that passes through a liquid. U.S. Pat. No. 7,119,874 and U.S. Patent Application Publication No. 2006/0023185 disclose examples of technology related to an immersion exposure apparatus that comprises a liquid immersion member capable of holding a liquid between itself and a substrate.

In an immersion exposure apparatus, it is possible that members that contact the liquid will become contaminated. For example, if foreign matter adheres to the liquid contact surface of a member that contacts the liquid, then it is possible that such foreign matter will cause exposure failures, such as defects in the pattern formed on the substrate. As a result, defective devices could be produced.

An object of the present invention is to provide an immersion exposure apparatus that can prevent exposure failures from occurring. Another object of the present invention is to provide a cleaning method that can prevent exposure failures from occurring. Yet another object of the present invention is to provide a device fabricating method that can prevent the production of defective devices.

SUMMARY

A first aspect of the present invention provides an exposure apparatus that exposes a substrate with exposure light that passes through an exposure liquid and comprises: an optical member, which has an emergent surface wherefrom the exposure light emerges; a first supply port, which supplies the exposure liquid; a liquid immersion member, which is capable of forming an immersion space so that an optical path of the exposure light that emerges from the optical member is filled with the exposure liquid; a second supply port, which supplies a cleaning liquid so as to contact the liquid immersion member; and a preventive apparatus, which prevents the cleaning liquid and the optical member from contacting one another.

A second aspect of the present invention provides a device fabricating method that comprises: exposing a substrate using an exposure apparatus according to the first aspect of the present invention; and developing the exposed substrate.

A third aspect of the present invention provides a method of cleaning an exposure apparatus that exposes a substrate with exposure light, which emerges from an optical member and passes through an exposure liquid, and comprises: disposing a prescribed member so as to oppose a liquid immersion member, which is capable of forming an immersion space, so that an optical path of the exposure light that emerges from the optical member is filled with the exposure liquid; and supplying a cleaning liquid to a space between the liquid immersion member and the prescribed member; wherein, the cleaning liquid is supplied while the cleaning liquid and the optical member are prevented from contacting one another.

A fourth aspect of the present invention provides a device fabricating method that comprises: cleaning an exposure apparatus, which exposes a substrate with exposure light that passes through an exposure liquid, with a cleaning method according to a third aspect of the present invention; exposing the substrate using the exposure apparatus after the cleaning is performed; and developing the exposed substrate.

A fifth aspect of the present invention provides an exposure apparatus that exposes a substrate with exposure light that passes through an exposure liquid and comprises: an optical member, which has an emergent surface wherefrom the exposure light emerges; a partitioning member, which is disposed in the optical path of the exposure light between the emergent surface and a prescribed member; a first supply port, which supplies a first cleaning liquid to a first space between the optical member and the partitioning member; and a second supply port, which supplies a second cleaning liquid to a second space between the partitioning member and the prescribed member.

A sixth aspect of the present invention provides a device fabricating method that comprises: exposing a substrate using an exposure apparatus according to the fifth aspect of the present invention; and developing the exposed substrate.

A seventh aspect of the present invention provides a method of cleaning an exposure apparatus that exposes a substrate with exposure light, which emerges from an optical member, via an exposure liquid and comprises the steps of: disposing a partitioning member between the optical member and a prescribed member; supplying a first cleaning liquid to a space between the partitioning member and the optical member; and supplying a second cleaning liquid to a space between the partitioning member and the prescribed member.

An eighth aspect of the present invention provides a device fabricating method that comprises the steps of: cleaning an exposure apparatus, which exposes a substrate with exposure light that passes through an exposure liquid, with a cleaning method according to the seventh aspect of the present invention; exposing the substrate using the exposure apparatus after the cleaning is performed; and developing the exposed substrate.

According to some aspects of the present invention, exposure failures can be prevented. In addition, according to some aspects of the present invention, it is also possible to prevent the production of defective devices.

According to some aspects of the present invention, exposure failures can be prevented. In addition, according to some aspects of the present invention, the production of defective devices can be prevented.

BRIEF DESCRIPTION OF THE DRAWINGS

FIG. 10 is a diagram that shows one example of a preventive apparatus according to a second embodiment.

DESCRIPTION OF EMBODIMENTS

The following text explains the embodiments of the present invention referencing the drawings, but the present invention is not limited thereto. The explanation below defines an XYZ orthogonal coordinate system, and the positional relationships among members are explained referencing this system. Prescribed directions within the horizontal plane are the X axial directions, directions orthogonal to the X axial directions in the horizontal plane are the Y axial directions, and directions orthogonal to the X axial directions and the Y axial directions (i.e., the vertical directions) are the Z axial directions. In addition, the rotational (inclined) directions around the X, Y, and Z axes are the $\theta X$, $\theta Y$, and $\theta Z$ directions, respectively.

<First Embodiment>

Figure 1:
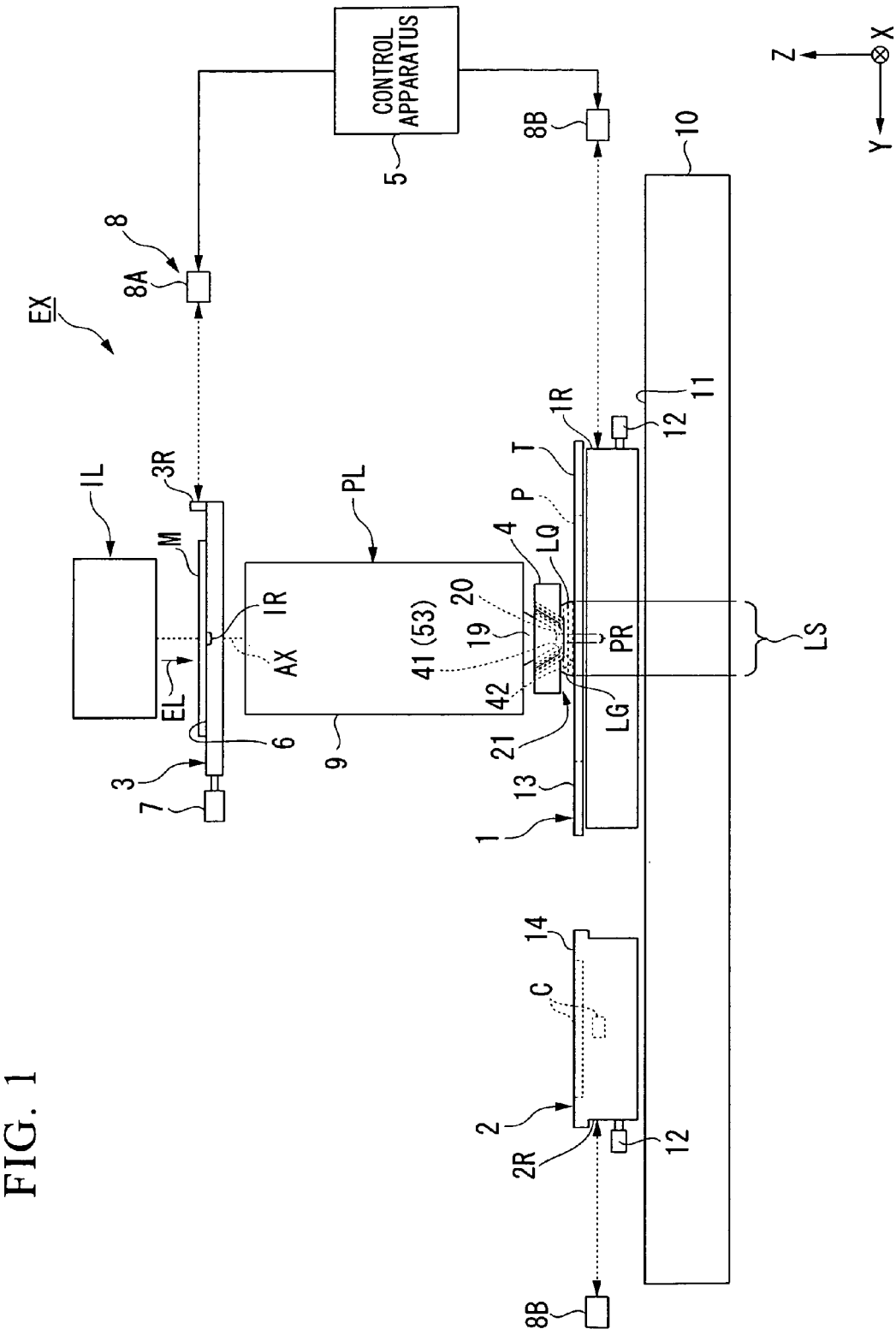
FIG. 1 is a schematic block diagram that shows one example of an exposure apparatus according to a first embodiment.

A first embodiment will now be explained. FIG. 1 is a schematic block diagram that shows one example of an exposure apparatus EX according to the first embodiment. The exposure apparatus EX of the present embodiment is an immersion exposure apparatus that exposes a substrate P with exposure light EL that passes through an exposure liquid LQ. In the present embodiment, the exposure apparatus EX comprises first supply ports 41, which supply the exposure liquid LQ. The exposure apparatus EX exposes the substrate P with the exposure light EL that passes through the exposure liquid LQ, which is supplied via the first supply ports 41. In the present embodiment, water (pure water) is used as the exposure liquid LQ. Furthermore, in the explanation below, the exposure liquid LQ is discretionarily called the first liquid LQ.

In addition, in the present embodiment, members inside the exposure apparatus EX are cleaned with a cleaning liquid LC (not shown in FIG. 1). The exposure apparatus EX comprises second supply ports 42, which supply the cleaning liquid LC. The exposure apparatus EX cleans the members inside the exposure apparatus EX with the cleaning liquid LC, which is supplied via the second supply ports 42. Furthermore, in the explanation below, the cleaning liquid LC is discretionarily called the second liquid LC.

The second liquid LC is a liquid capable of cleaning the members inside the exposure apparatus EX. The second liquid LC is also capable of eliminating foreign matter (contaminants) that adhere to the members inside the exposure apparatus EX. In the present embodiment, an alkali cleaning liquid that contains alkali serves as the second liquid LC. The alkali cleaning liquid includes, for example, ammonia. Using the alkali cleaning liquid as the second liquid LC makes it possible to satisfactorily eliminate contaminants, such as organic substances, that adhere to the members inside the exposure apparatus EX.

The present embodiment explains an exemplary case wherein the exposure apparatus EX is an exposure apparatus that comprises a substrate stage 1, which is capable of holding and moving the substrate P, and a measurement stage 2, which does not hold the substrate P, that is capable of moving measuring instruments C, which can be mounted on the measurement stage 2 and can perform exposure-related prescribed measurements, as disclosed in, for example, U.S. Pat. No. 6,897,963 and European Patent Application Publication No. 1713113.

In FIG. 1, the exposure apparatus EX comprises: a movable mask stage 3 that holds a mask M; the substrate stage 1; the measurement stage 2; an illumination system IL that illuminates the mask M with the exposure light EL; a projection optical system PL that projects an image of a pattern of the mask M, which is illuminated by the exposure light EL, onto the substrate P; a liquid immersion member 4, which is capable of forming an immersion space LS so that at least part of the optical path of the exposure light EL is filled with the first liquid LQ; and a control apparatus 5 that controls the operation of the entire exposure apparatus EX.

The mask M may be, for example, a reticle wherein a device pattern is formed that is projected onto the substrate P. The mask M may be, for example, a light transmissive mask wherein a light shielding film made of chrome and the like is used to form a prescribed pattern on a transparent plate, such as a glass plate. Furthermore, the mask M may alternatively be a reflective mask. The substrate P is a substrate for fabricating devices. The substrate P comprises a base material (e.g., a semiconductor wafer, such as a silicon wafer) and a photosensitive film that is formed thereon. The photosensitive film is made of a photosensitive material (photoresist). In addition to the photosensitive film, the substrate P may include a separate film. For example, the substrate P may include an antireflection film or a protective film (topcoat film) that protects the photosensitive film.

The illumination system IL illuminates a prescribed illumination region IR with the exposure light EL, which has a uniform luminous flux intensity distribution. The illumination system IL illuminates at least part of the mask M disposed in the illumination region IR with the exposure light EL, which has a uniform luminous flux intensity distribution. Examples of light that can be used as the exposure light EL emitted from the illumination system IL include: deep ultraviolet (DUV) light such as a bright line (g-line, h-line, or i-line) light emitted from, for example, a mercury lamp and KrF excimer laser light (with a wavelength of 248 nm); and vacuum ultraviolet (VUV) light such as ArF excimer laser light (with a wavelength of 193 nm) and $F_2$ laser light (with a wavelength of 157 nm). In the present embodiment, ArF excimer laser light, which is ultraviolet light (vacuum ultraviolet light), is used as the exposure light EL.

The mask stage 3 comprises a mask holding part 6 that releasably holds the mask M. In the present embodiment, the mask holding part 6 holds the mask M so that a patterned surface (lower surface) of the mask M is substantially parallel with the XY plane. In the state wherein it holds the mask M, the mask stage 3 is capable of moving within an XY plane that includes the illumination region IR. In the present embodiment, the operation of a first drive system 7, which includes actuators such as linear motors, moves the mask stage 3 in three directions: the X axial, Y axial, and θZ directions.

A laser interferometer 8A of the interferometer system 8 measures the position of the mask stage 3 (mask M). The laser interferometer 8A measures the position using reflecting mirror 3R, which is provided to the mask stage 3. Based on the measurement results of the laser interferometer 8A, the control apparatus 5 controls the position of the mask M, which is held by the mask stage 3, by operating the first drive system 7.

The projection optical system PL radiates the exposure light EL to the prescribed projection region PR. The projection optical system PL projects with a prescribed projection magnification an image of the pattern of the mask M to at least part of the substrate P, which is disposed in the projection region PR. A lens barrel 9 holds the plurality of optical elements of the projection optical system PL. The projection optical system PL of the present embodiment is a reduction system that has a projection magnification of, for example, ¼, ⅕, or ⅛. Furthermore, the projection optical system PL may also be a unity magnification system or an enlargement system. In the present embodiment, an optical axis AX of the projection optical system PL is parallel to the Z axis. In addition, the projection optical system PL may be a dioptric system that does not include catoptric elements, a catoptric system that does not include dioptric elements, or a catadioptric system that includes both catoptric and dioptric elements. In addition, the projection optical system PL may form either an inverted or an erect image.

The substrate stage 1 and the measurement stage 2 are each capable of moving on a guide surface 11 of a base member 10. In the present embodiment, the guide surface 11 is substantially parallel to the XY plane.

In the state wherein it holds the substrate P, the substrate stage 1 is capable of moving along the guide surface 11 within an XY plane that includes the projection region PR. In the state wherein at least one of the measuring instruments C is mounted thereon, the measurement stage 2 is capable of moving along the guide surface 11 within the XY plane that includes the projection region PR. In the present embodiment, the operation of a second drive system 12, which includes actuators such as linear motors, moves the substrate stage 1 and the measurement stage 2 in six directions: the X, Y, and Z axial directions and the θX, θY, and θZ directions.

In the present embodiment, the positions of the projection optical system PL and the liquid immersion member 4 are substantially fixed. The substrate stage 1 and the measurement stage 2, however, are both capable of moving with respect to the projection optical system PL and the liquid immersion member 4.

A Laser interferometer 8B of the interferometer system 8 measures the positions of the substrate stage 1 (the substrate P) and the measurement stage 2 (the measuring instruments C). The laser interferometer 8B measures both the position of the substrate stage 1 using reflecting mirror 1R, which is provided thereto, and the position of the measurement stage 2 using reflecting mirror 2R, which is provided thereto. In addition, a focus and level detection system (not shown) detects the position (in the Z axial, θX, and θY directions) of a front surface of the substrate P, which is held by the substrate stage 1. The focus and level detection system is capable of detecting not only the position of the front surface of the substrate P, but also the positions of an upper surface 13 of the substrate stage 1 and an upper surface 14 of the measurement stage 2. Based on the measurement results of the laser interferometers 8B and the detection results of the focus and level detection system, the control apparatus 5 operates the second drive system 12 to control the positions of the substrate P, which is held by the substrate stage 1, and the measuring instruments C, which are mounted to the measurement stage 2.

Figure 2:
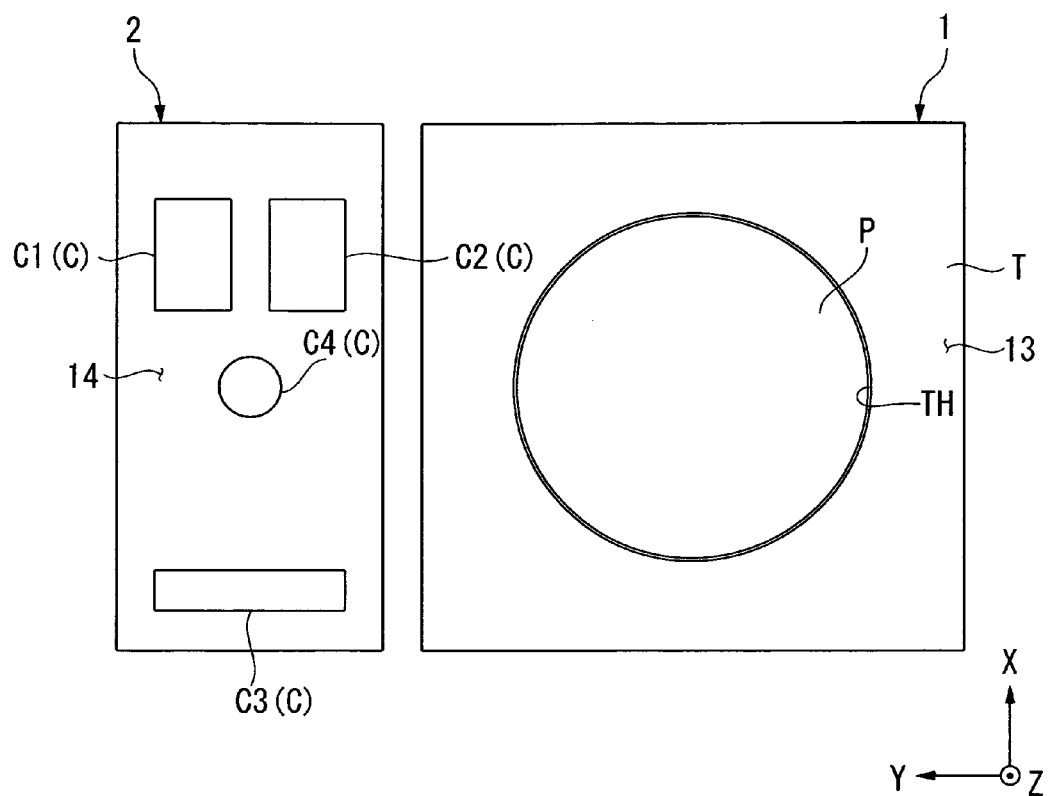
FIG. 2 is a plan view of a substrate stage and a measurement stage according to the first embodiment.
Figure 3:
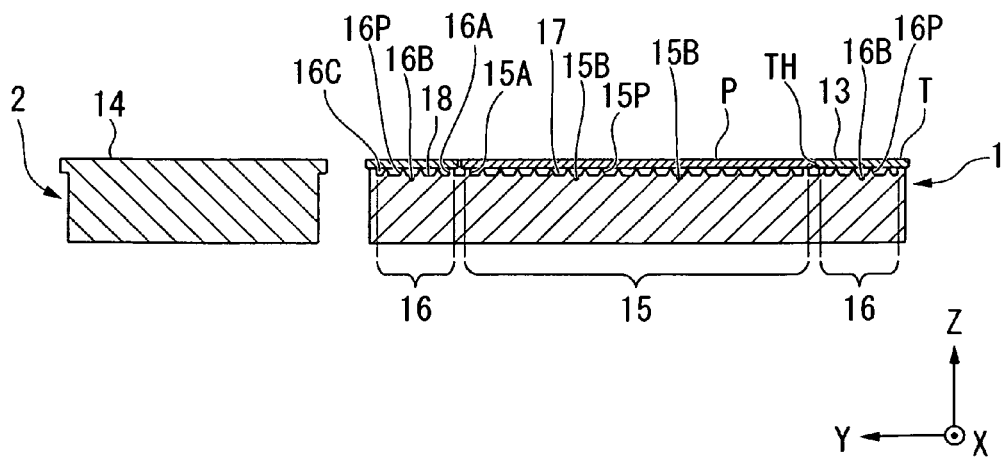
FIG. 3 is a side cross sectional view that shows the substrate stage and the measurement stage according to the first embodiment.

FIG. 2 is a plan view from above of the substrate state 1 and the measurement stage 2; furthermore, FIG. 3 is a side cross sectional view thereof. In FIG. 2 and FIG. 3, the substrate stage 1 comprises a substrate holding part 15, which releasably holds the substrate P. The substrate holding part 15 opposes and holds a rear surface of the substrate P. The upper surface 13 of the substrate state 1 is disposed around the substrate holding part 15. The substrate holding part 15 holds the substrate P so that the front surface thereof is substantially parallel to the XY plane. In the present embodiment, the front surface of the substrate P, which is held by the substrate holding part 15, and the upper surface 13 of the substrate stage 1 are substantially parallel. In addition, in the present embodiment, the front surface of the substrate P, which is held by the substrate holding part 15, and the upper surface 13 of the substrate stage 1 are disposed substantially within the same plane (i.e., they are substantially flush with one another).

In the present embodiment, the substrate state 1 comprises a plate member T, which is disposed around the substrate P, and a plate member holding part 16, which is disposed around the substrate holding part 15 and releasably holds the plate member T. The plate member holding part 16 opposes and holds the lower surface of the plate member T. In the explanation below, the substrate holding part 15 is discretionarily called the first holding part 15, and the plate member holding part 16 is discretionarily called the second holding part 16.

The plate member T has an opening TH in which the substrate P is capable of being disposed. The plate member T held by the second holding part 16 is disposed around the substrate P, which is held by the first holding part 15. In the present embodiment, the upper surface 13 of the substrate state 1 includes the upper surface of the plate member T held by the second holding part 16.

In the present embodiment, the inner surface (inner side edge) of the opening TH of the plate member T held by the second holding part 16 and the outer surface (outer side edge) of the substrate P held by the first holding part 15 are disposed so that they oppose one another with a prescribed gap interposed therebetween. The second holding part 16 holds the plate member T so that the upper surface 13 of the plate member T is substantially parallel to the XY plane. In addition, the second holding part 16 holds the plate member T so that the upper surface 13 of the plate member T and the front surface of the substrate P held by the first holding part 15 are substantially flush with one another.

The first holding part 15 and the second holding part 16 each constitute at least part of a so-called pin chuck mechanism. As shown in FIG. 3, the first holding part 15 comprises: a plurality of protruding parts 15P, which are disposed in a first chuck surface 17 of the substrate state 1 and support the rear surface of the substrate P; a first circumferential wall 15A, which is disposed in the first chuck surface 17 around the plurality of protruding parts 15P; and a plurality of first suction ports 15B, which are provided in the first chuck surface 17 inside of the first circumferential wall 15A and are capable of suctioning gas. The second holding part 16 comprises: a second circumferential wall 16A, which is formed in a second chuck surface 18 of the substrate state 1 around the first circumferential wall 15A; a third circumferential wall 16C, which is formed in the second chuck surface 18 around the second circumferential wall 16A; a plurality of protruding parts 16P, which are formed in the second chuck surface 18 between the second circumferential wall 16A and the third circumferential wall 16C and support the lower surface of the plate member T; and a plurality of second suction ports 16B, which are provided in the second chuck surface 18 between the second circumferential wall 16A and the third circumferential wall 16C and are capable of suctioning gas.

The rear surface of the substrate P is chucked to the protruding parts 15P by suctioning, via the first suction ports 15B, the gas in a space enclosed by the rear surface of the substrate P, the first circumferential wall 15A, and the first chuck surface 17, thereby negatively pressurizing the space. In addition, by stopping the suction operation wherein the first suction ports 15B are used, the substrate P can be dechucked from the first holding part 15. Likewise, the lower surface of the plate member T is chucked to the protruding parts 16P by suctioning, via the second suction ports 16B, the gas in a space enclosed by the lower surface of the plate member T, the second circumferential wall 16A, the third circumferential wall 16C, and the second chuck surface 18, thereby negatively pressurizing this space. In addition, by stopping the suction operation wherein the second suction ports 16B are used, the plate member T can be dechucked from the second holding part 16.

The measurement stage 2 comprises the measuring instruments C, which can perform exposure-related measurements. The measuring instruments C may be, for example, measuring members (optical parts). In the present embodiment, a slit plate C1, wherein an opening pattern is formed through which the exposure light EL can be transmitted, is disposed at a prescribed position in the upper surface 14 of the measurement stage 2 and serves as one of the measuring instruments (measuring members) C. The slit plate C1 constitutes part of an aerial image measuring system, which can measure an aerial image formed by the projection optical system PL, as disclosed in, for example, U.S. Patent Application Publication No. 2002/0041377. The aerial image measuring system comprises the slit plate C1 and a light receiving device that receives the exposure light EL via the opening pattern of the slit plate C1. The control apparatus 5 radiates the exposure light EL to the slit plate C1 and, using the light receiving device to receive the exposure light EL that passes through the opening pattern of the slit plate C1, measures the image forming characteristics of the projection optical system PL.

In addition, an upper plate C2, wherein a transmissive pattern is formed through which the exposure light EL can be transmitted, is disposed at a prescribed position in the upper surface 14 of the measurement stage 2 and serves as another of the measuring instruments (measuring members) C. The upper plate C2 constitutes part of a luminous flux intensity nonuniformity measuring system that can measure the nonuniformity of the luminous flux intensity of the exposure light EL, as disclosed in, for example, U.S. Pat. No. 4,465,368. The luminous flux intensity nonuniformity measuring system comprises the upper plate C2 and a light receiving device, which receives the exposure light EL that passes through the opening pattern of the upper plate C2. The control apparatus 5 measures the nonuniformity of the luminous flux intensity of the exposure light EL by radiating the exposure light EL to the upper plate C2 and using the light receiving device to receive the exposure light EL that passes through the opening pattern of the upper plate C2.

Furthermore, the upper plate C2 may constitute part of either a measuring system that can measure the amount of fluctuation in the transmittance of the exposure light EL of the projection optical system PL (e.g., as disclosed in U.S. Pat. No. 6,721,039), an irradiance measuring system, namely, a luminous flux intensity measuring system (e.g., as disclosed in U.S. Patent Application Publication No. 2002/0061469), or a measuring system, such as a wavefront aberration measuring system, that can measure the exposure energy of the exposure light EL (e.g., as disclosed in European Patent Application Publication No. 1079223). In this case, the exposure apparatus EX comprises a light receiving device that constitutes part of such a measuring system.

In addition, a fiducial plate C3 is disposed at a prescribed position in the upper surface 14 of the measurement stage 2 and serves as yet another of the measuring instruments (measuring members) C. The fiducial plate C3 has a fiducial mark, which is measured by a field image alignment (FIA) type alignment system (e.g., as disclosed in U.S. Pat. No. 5,493,403).

In addition, an upper plate C4, through which light can be transmitted, is disposed at a prescribed position in the upper surface 14 of the measurement stage 2 and serves as yet another of the measuring instruments (measuring members) C. The upper plate C4 constitutes part of an observation system, which is capable of capturing an optical image (image) of, for example, the projection optical system PL and the liquid immersion member 4 (e.g., as disclosed in European Patent Application Publication No. 1791164). The observation system comprises the upper plate C4 and an image capturing apparatus (observation camera), which captures images through the upper plate C4. The control apparatus 5 captures an image by causing the upper plate C4 to oppose either the projection optical system PL or the liquid immersion member 4, or both.

In the present embodiment, the upper surface of the slit plate C1, the upper surface of the upper plate C2, the upper surface of the fiducial plate C3, the upper surface of the upper plate C4, and the upper surface 14 of the measurement stage 2 are disposed within substantially the same plane (the XY plane); namely, they are substantially flush with one another.

Figure 4:
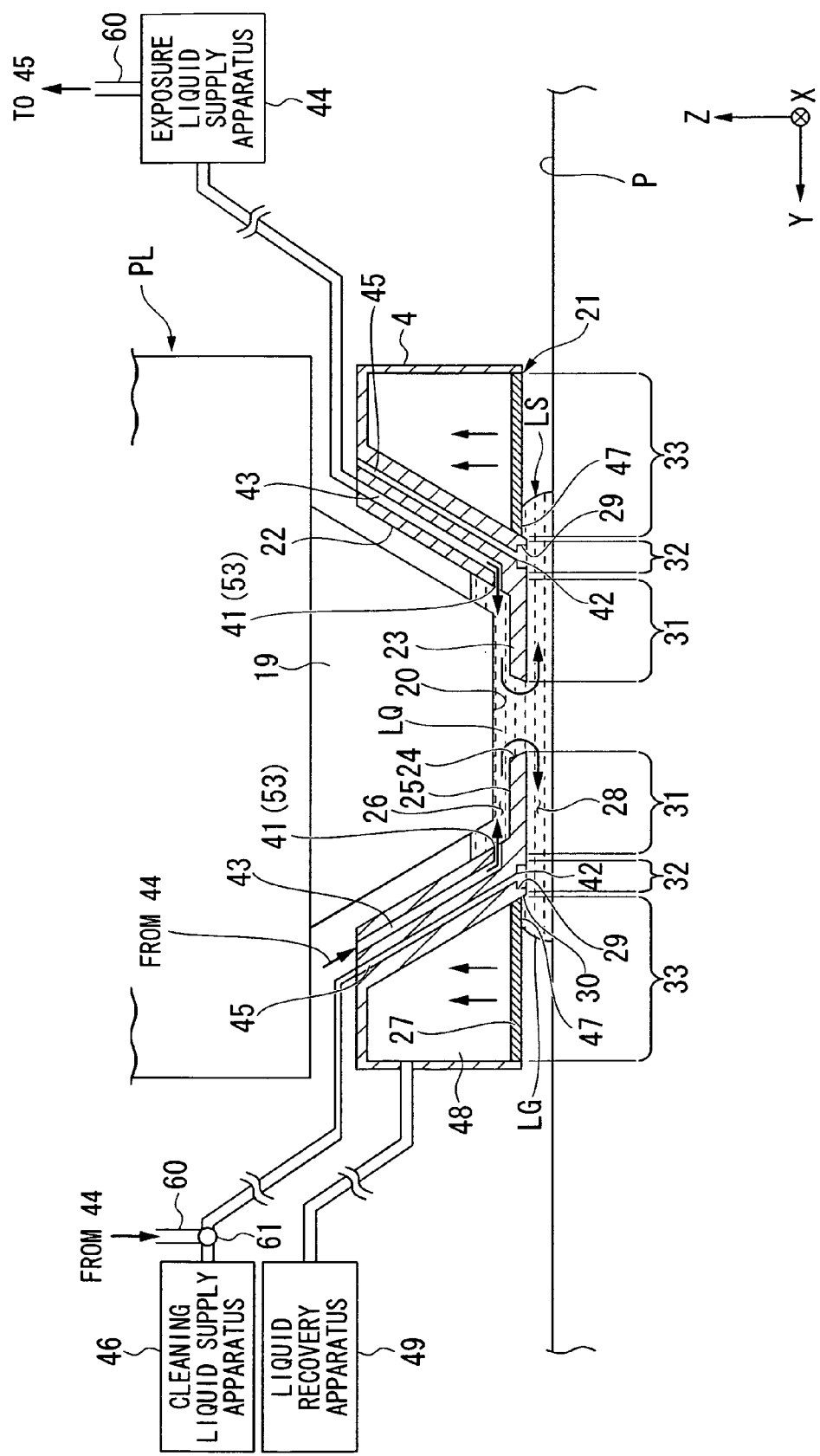
FIG. 4 is a side cross sectional view that is parallel to the YZ plane and shows the vicinity of a liquid immersion member according to the first embodiment.
Figure 5:
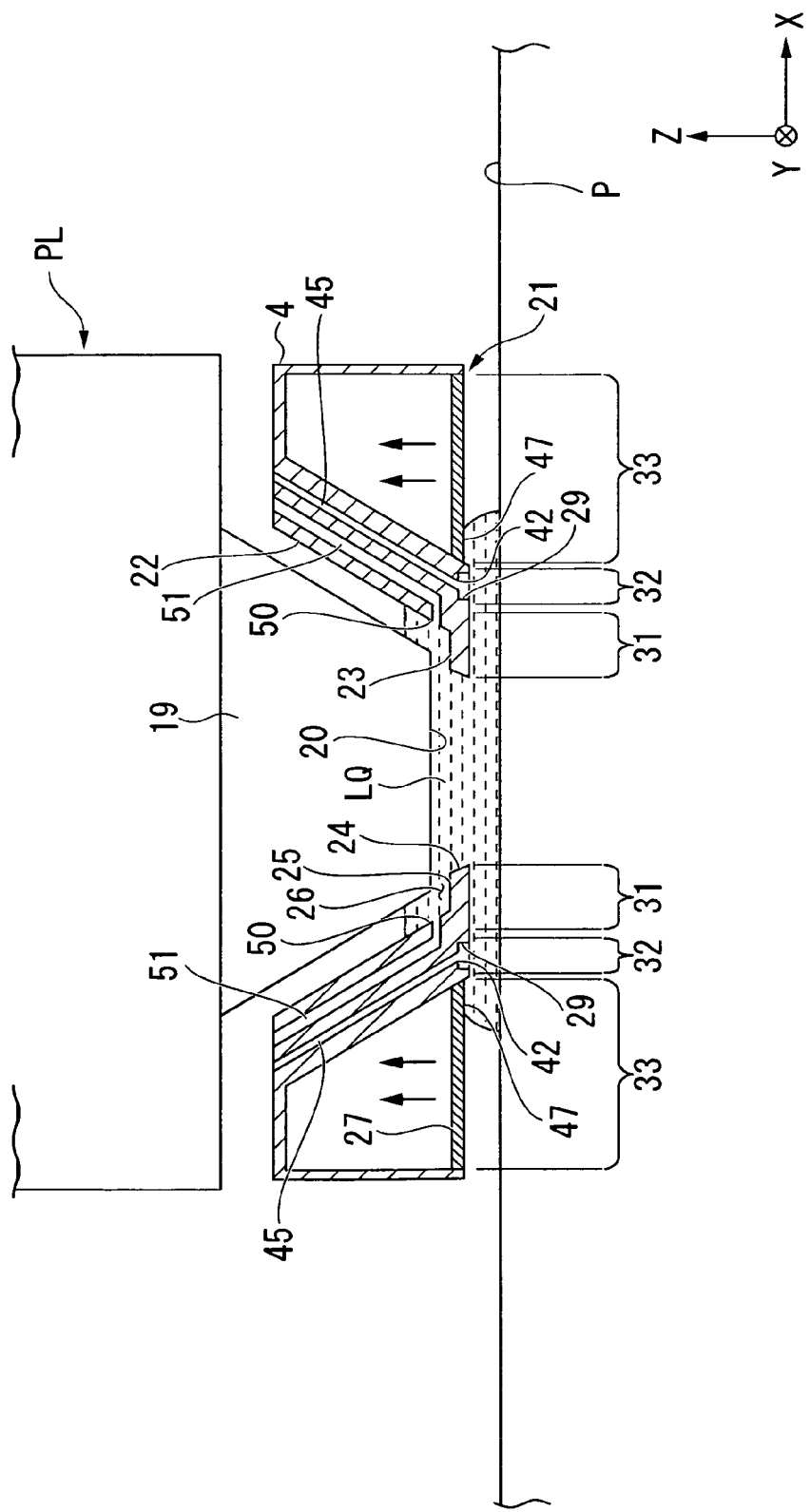
FIG. 5 is a side cross sectional view that is parallel to the XZ plane and shows the vicinity of the liquid immersion member according to the first embodiment.
Figure 6:
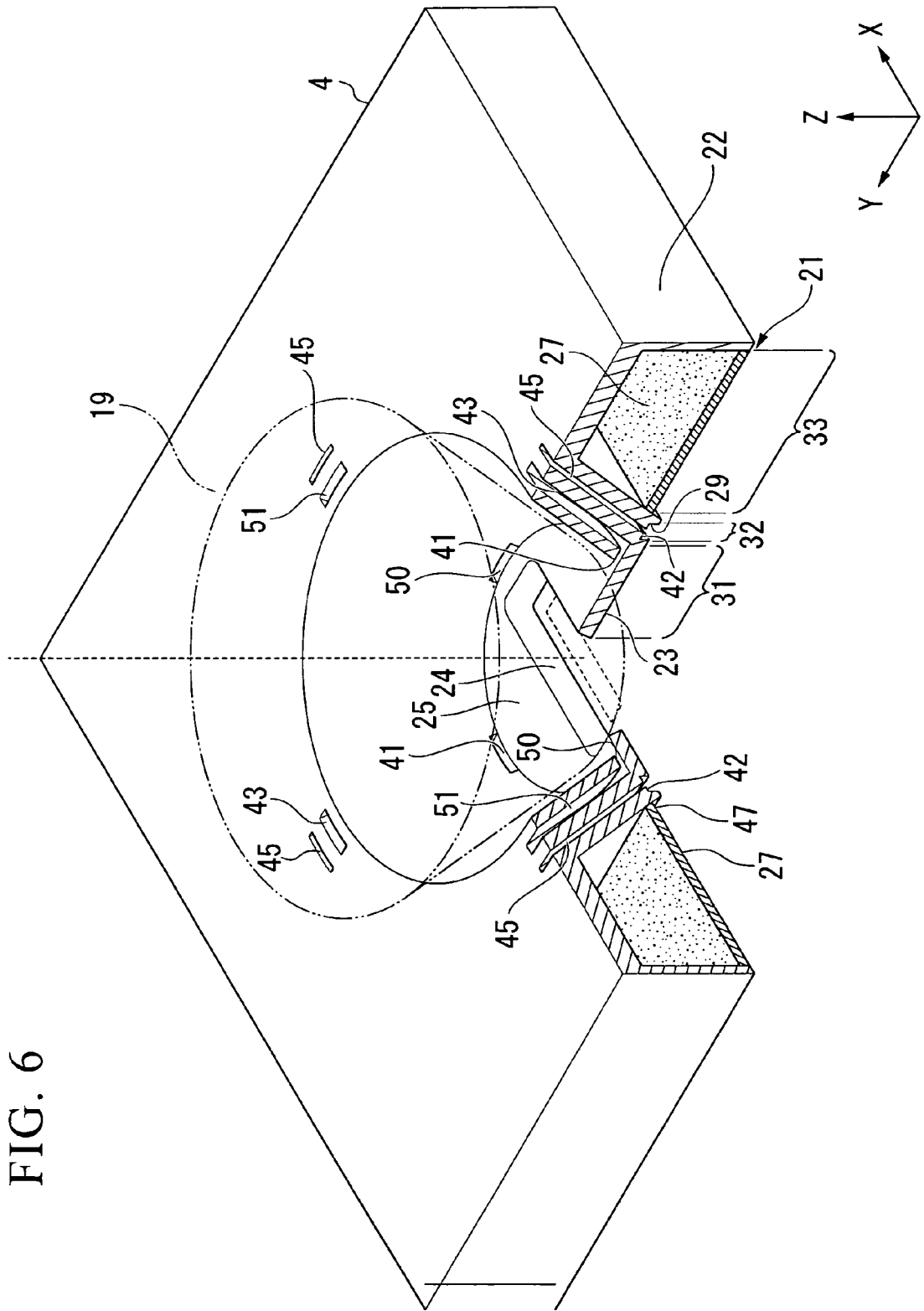
FIG. 6 is a partial, broken, schematic oblique view that shows the liquid immersion member according to the first embodiment.
Figure 7:
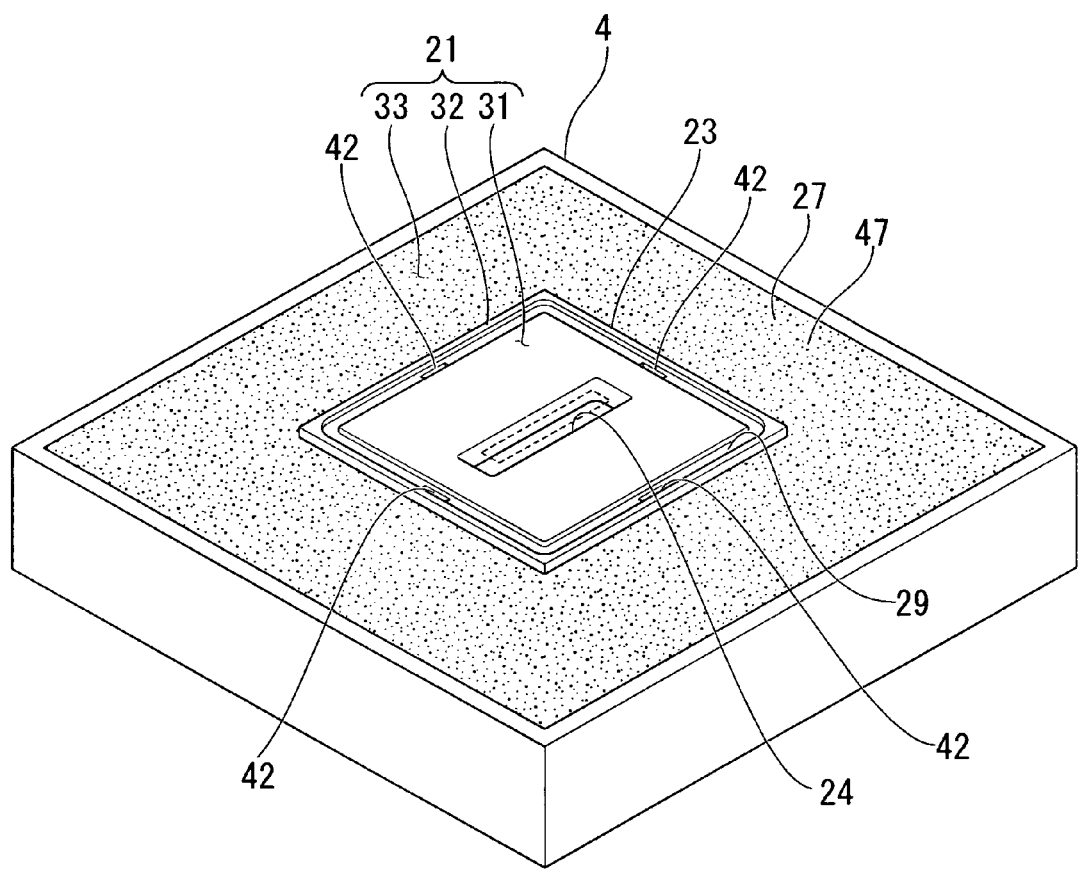
FIG. 7 is an oblique view that shows the liquid immersion member according to the first embodiment, viewed from the lower side.

The following text explains the liquid immersion member 4, referencing FIG. 4 through FIG. 7. FIG. 4 is a side cross sectional view parallel to the YZ plane that shows the vicinity of the liquid immersion member 4; FIG. 5 is a side cross sectional view parallel to the XZ plane; FIG. 6 is a partially broken schematic oblique view that shows the liquid immersion member 4; and FIG. 7 is an oblique view from the lower side (−Z side) that shows the liquid immersion member 4. FIG. 4 and FIG. 5 show states wherein the substrate P is exposed through the first liquid LQ.

The liquid immersion member 4 forms the immersion space LS so that at least part of the optical path of the exposure light EL is filled with the first liquid LQ. The immersion space LS is a portion (space or area) that is filled with liquid.

The liquid immersion member 4 is disposed in the vicinity of the last optical element 19, which is the optical element of the plurality of optical elements of the projection optical system PL that is closest to the image plane of the projection optical system PL. The last optical element 19 has an emergent surface (lower surface) 20 that emits the exposure light EL toward the image plane of the projection optical system PL. In the present embodiment, the liquid immersion member 4 can form the immersion space LS so that the optical path of the exposure light EL that emerges from the last optical element 19 is filled with the first liquid LQ.

The last optical element 19 is formed from, for example, synthetic quartz. Furthermore, the last optical element 19 may be formed from fluorite. The liquid immersion member 4 is formed from, for example, titanium. Furthermore, the liquid immersion member 4 may be formed from stainless steel.

The liquid immersion member 4 forms the immersion space LS so that the optical path of the exposure light EL between the last optical element 19 and a prescribed member, which is disposed at the irradiation position of the exposure light EL that emerges from the emergent surface 20, is filled with the first liquid LQ. In the present embodiment, the irradiation position (irradiation area) of the exposure light EL that emerges from the emergent surface 20 includes both the projection region PR of the projection optical system PL and a position that opposes the emergent surface 20. In the explanation below, the irradiation position of the exposure light EL that emerges from the emergent surface 20 is discretionarily called the exposure position.

The liquid immersion member 4 has a lower surface 21, which is disposed around the optical path of the exposure light EL that emerges from the emergent surface 20 and is capable of holding the first liquid LQ between itself and the front surface of the prescribed member disposed at the exposure position. In the present embodiment, the prescribed member that is capable of opposing the emergent surface 20 is also capable of opposing the lower surface 21. When the front surface of the prescribed member is disposed at a position at which it opposes the emergent surface 20, at least part of the lower surface 21 and the front surface of the prescribed member are opposed. When the emergent surface 20 and the front surface of the prescribed member oppose one another, the space between the emergent surface 20 of the last optical element 19 and the front surface of the prescribed member can hold the first liquid LQ. In addition, when the lower surface 21 of the liquid immersion member 4 and the front surface of the prescribed member are opposed, the first liquid LQ can be held in the space therebetween. Holding the first liquid LQ between the emergent surface 20 and the lower surface 21 on one side and the front surface of the prescribed member on the other side forms the immersion space LS so that the optical path of the exposure light EL between the emergent surface 20 of the last optical element 19 and the front surface of the prescribed member is filled with the first liquid LQ.

In the present embodiment, the prescribed member that can oppose the emergent surface 20 and the lower surface 21 comprises both a member that can move with respect to the last optical element 19 and the liquid immersion member 4 on the emergent side (image plane side) of the last optical element 19 and a member that can move with respect to the optical path of the exposure light EL within a prescribed plane that includes the exposure position. In the present embodiment, the prescribed member comprises either the substrate state 1 or the measurement stage 2, or both. In addition, the prescribed member comprises either the substrate P, which is held by the substrate stage 1, or the measuring instruments C, which are mounted to the measurement stage 2, or both.

When the substrate P, which is held by the substrate stage 1, is to be exposed, the substrate P is disposed at the exposure position so that it opposes the last optical element 19 and the liquid immersion member 4. The immersion space LS is formed, at least at the time the substrate P is to be exposed, by holding the first liquid LQ between the last optical element 19 and the liquid immersion member 4 on one side and the substrate P on the other side so that the optical path of the exposure light EL that emerges from the emergent surface 20 of the last optical element 19 is filled with the first liquid LQ.

In the present embodiment, when the substrate P is being irradiated with the exposure light EL, the immersion space LS is formed so that part of the area of the front surface of the substrate P that includes the projection region PR of the projection optical system PL is covered with the first liquid LQ. Namely, at least part of an interface (i.e., a meniscus or an edge) LG of the first liquid LQ is formed between the lower surface 21 of the liquid immersion member 4 and the front surface of the substrate P. Namely, the exposure apparatus EX of the present embodiment adopts a local liquid immersion system.

Furthermore, to simplify the explanation, the following text explains an exemplary state wherein the substrate P is disposed at a position at which it opposes the emergent surface 20 of the last optical element 19 and the lower surface 21 of the liquid immersion member 4.

As shown in FIG. 4 through FIG. 7, the liquid immersion member 4 is an annular member (a shaped annular member). The liquid immersion member 4 is disposed around the optical path of the exposure light EL. In the present embodiment, the liquid immersion member 4 comprises a first plate part 22, which is disposed around the last optical element 19, and a second plate part 23, at least part of which is disposed between the emergent surface 20 of the last optical element 19 and the front surface of the substrate P in the Z axial directions.

The first plate part 22 has an inner circumferential surface that opposes and is formed along an outer circumferential surface of the last optical element 19. The inner circumferential surface of the liquid immersion member 4 and the outer circumferential surface of the last optical element 19 oppose one another with a prescribed gap interposed therebetween.

The second plate part 23 has an opening 24 at its center. The exposure light EL that emerges from the emergent surface 20 of the last optical element 19 can pass through the opening 24. For example, during an exposure of the substrate P, the exposure light EL that emerges from the emergent surface 20 passes through the opening 24 and is radiated through the first liquid LQ to the front surface of the substrate P. In the present embodiment, the cross sectional shape of the exposure light EL in the opening 24 is substantially rectangular (slit shaped) with the longitudinal directions in the X axial directions. In accordance with the cross sectional shape of the exposure light EL, the opening 24 is formed in a substantially rectangular shape (a slit shape) in the X and Y directions. In addition, the cross sectional shape of the exposure light EL in the opening 24 and the shape of the projection region PR of the projection optical system PL on the substrate P are substantially the same.

In the present embodiment, the liquid immersion member 4 has an upper surface 25 that is disposed around the opening 24 and opposes the emergent surface 20 of the last optical element 19 with a prescribed gap interposed therebetween. In the present embodiment, the upper surface 25 includes the upper surface of the second plate part 23. In the present embodiment, the upper surface 25 is a flat surface that is disposed around the opening 24. The upper surface 25 is substantially parallel to the XY plane. The upper surface 25 faces a space 26 on the upper side (the +Z side) of the opening 24. The space 26 includes a space between the upper surface 25 and the emergent surface 20. In the explanation below, the space 26 is discretionarily called the upper side space 26. Furthermore, the upper surface 25 may be a curved or an uneven surface.

The lower surface 21 of the liquid immersion member 4 includes the lower surface of the second plate part 23 and the lower surface of a porous member 27, which is disposed around the second plate part 23. In the present embodiment, the external shape of the lower surface of the second plate part 23 in the XY plane is substantially square. The porous member 27 is plate shaped and has a plurality of holes (openings or pores). Furthermore, the porous member 27 is a mesh filter, which is a porous member wherein numerous small holes are formed as a mesh. In the present embodiment, the shape of the porous member 27 within the XY plane is a rectangular ring. The porous member 27 is made of titanium. Furthermore, the porous member 27 may be made of stainless steel.

The lower surface 21 of the liquid immersion member 4 comprises: a first area 31, which is disposed around the opening 24; a second area 32, which is disposed around the first area 31; and a third area 33, which is disposed around the second area 32. In the present embodiment, the lower surface of the second plate part 23 comprises the first area 31 and the second area 32, and the lower surface of the porous member 27 comprises the third area 33.

The first area 31 is a flat surface that is disposed around the opening 24. The flat surface (first area) 31 is substantially parallel to the front surface of the substrate P (the XY plane). The flat surface 31 faces a space 28 on the lower side (+Z side) of the opening 24. The space 28 includes a space between the flat surface 31 and the front surface of the substrate P. The space between the flat surface 31 and the front surface of the substrate P is capable of holding the first liquid LQ. In the explanation below, the space 28 is discretionarily called the lower side space 28.

The second area 32 has a groove 29, which is disposed around the flat surface 31. In the present embodiment, the shape of the groove 29 within the XY plane is a rectangular ring.

The third area 33 includes a liquid recovery surface that is capable of recovering liquid. In the present embodiment, the liquid recovery surface (third area) 33 is substantially parallel to the front surface of the substrate P (the XY plane). During the exposure of the substrate P, the liquid recovery surface 33 is capable of recovering the first liquid LQ on the substrate P that opposes the liquid recovery surface 33. The liquid recovery surface 33 includes the lower surface of the porous member 27. At least some of the first liquid LQ on the substrate P, which is disposed at a position at which it opposes the liquid recovery surface 33, is recovered via holes of the porous member 27. The liquid recovery surface 33 is capable of recovering any liquid that contacts it (i.e., the lower surface of the porous member 27).

In the present embodiment, the flat surface 31 and the liquid recovery surface 33 are disposed at different positions in the Z axial directions. In the present embodiment, the liquid recovery surface 33 is disposed on the +Z side of the flat surface 31. Namely, the liquid recovery surface 33 is disposed at a position at which it is further from the front surface of the substrate P than the flat surface 31 is. In the present embodiment, a step 30 is formed between the flat surface 31 and the liquid recovery surface 33.

Furthermore, the flat surface 31 and the liquid recovery surface 33 may be disposed in the same plane. In addition, the liquid recovery surface 33 does not have to be parallel to the XY plane and may be a curved surface.

The liquid immersion member 4 comprises first supply ports 41, which supply the first liquid LQ. In addition, the liquid immersion member 4 comprises second supply ports 42, which are capable of supplying the second liquid LC. The first supply ports 41 are capable of supplying the first liquid LQ to the optical path of the exposure light EL. The second supply ports 42 are capable of supplying the second liquid LC so that it contacts the liquid immersion member 4.

The first supply ports 41 are disposed closer to the last optical element 19 than the second supply ports 42 are. In the present embodiment, the first supply ports 41 are disposed above (on the +Z side of) the second supply ports 42.

The first supply ports 41 are disposed in the vicinity of the optical path of the exposure light EL at prescribed positions in the liquid immersion member 4 so that they face the optical path. In the present embodiment, the first supply ports 41 are disposed at prescribed positions in the inner circumferential surface of the first plate part 22. In the present embodiment, the first supply ports 41 are disposed in the vicinity of the upper side space 26. The first supply ports 41 are capable of supplying the first liquid LQ to the upper side space 26. In the present embodiment, the first supply ports 41 are provided on opposite sides (one on each side) of the optical path of the exposure light EL in the Y axial directions.

The second supply ports 42 are disposed at prescribed positions in the lower surface 21 of the liquid immersion member 4. In the present embodiment, the second supply ports 42 are disposed outward from the flat surface 31 with respect to the opening 24. The second supply ports 42 are disposed at least partly around the flat surface 31. In the present embodiment, the second supply ports 42 are disposed in the second area 32 of the lower surface 21 of the liquid immersion member 4.

In the present embodiment, the second supply ports 42 are disposed in the groove 29. As shown in FIG. 7 and the like, in the present embodiment, the second supply ports 42 are disposed at four positions around the flat surface 31 in the groove 29.

As shown in FIG. 4, the first supply ports 41 are connected to an exposure liquid supply apparatus 44 via passageways 43. In the explanation below, the exposure liquid supply apparatus 44 is discretionarily called the first supply apparatus 44. The first supply apparatus 44 is capable of feeding the first liquid LQ, which is pure and temperature adjusted. Each passageway 43 comprises a supply passageway, which is formed inside the liquid immersion member 4, and a passageway, which is formed from a supply pipe that connects the supply passageway and the first supply apparatus 44. The first liquid LQ fed from the first supply apparatus 44 is supplied to the first supply ports 41 through the passageways 43. The first supply ports 41 supply the first liquid LQ from the first supply apparatus 44 to the optical path of the exposure light EL.

The second supply ports 42 are connected to a cleaning liquid supply apparatus 46 via passageways 45. In the explanation below, the cleaning liquid supply apparatus 46 is discretionarily called the second supply apparatus 46. The second supply apparatus 46 is capable of feeding the second liquid LC. Each passageway 45 comprises a supply passageway, which is formed inside the liquid immersion member 4, and a passageway, which is formed from a supply pipe that connects the supply passageway and the second supply apparatus 46. The second liquid LC fed from the second supply apparatus 46 is supplied to the second supply ports 42 through the passageways 45. The second supply ports 42 are capable of supplying the second liquid LC from the second supply apparatus 46 to a space between the lower surface 21 of the liquid immersion member 4 and the front surface of the prescribed member that opposes the lower surface 21. The space between the lower surface 21 of the liquid immersion member 4 and the front surface of the prescribed member includes the lower side space 28.

In the present embodiment, the passageways 45 can connect to the first supply apparatus 44 via linking passageways 60. The passageways 45 and the linking passageways 60 are connected via a passageway switching mechanism 61, which includes, for example, a valve mechanism. In the present embodiment, by controlling the first supply apparatus 44, the second supply apparatus 46, and the passageway switching mechanism 61, the control apparatus 5 can supply the second liquid LC from the second supply apparatus 46 to the second supply ports 42 through the passageways 45 in the state wherein the supply of the first liquid LQ from the first supply apparatus 44 to the passageways 45 is stopped, and can supply the first liquid LQ from the first supply apparatus 44 to the second supply ports 42 through the passageways 45 in the state wherein the supply of the second liquid LC from the second supply apparatus 46 to the passageways 45 is stopped.

In addition, the liquid immersion member 4 has a liquid recovery port 47, which is capable of recovering liquid. The liquid recovery port 47 recovers the liquid on the prescribed member that opposes the lower surface 21 of the liquid immersion member 4.

The liquid recovery port 47 is disposed at a prescribed position in the liquid immersion member 4 so that it opposes the front surface of the substrate P. The liquid recovery port 47 is disposed outward from the flat surface 31 and the second supply ports 42 (the second area 32) with respect to the optical path of the exposure light EL. The porous member 27 is disposed in the liquid recovery port 47. The lower surface of the porous member 27 disposed in the liquid recovery port 47 is the liquid recovery surface 33.

The liquid recovery port 47 (the liquid recovery surface 33) is connected to a liquid recovery apparatus 49 via a passageway 48. The liquid recovery apparatus 49 comprises a vacuum system and is capable of recovering the liquid via suctioning. The passageway 48 comprises a recovery passageway, which is formed inside the liquid immersion member 4, and a passageway, which is formed from a recovery pipe that connects the recovery passageway and the liquid recovery apparatus 49. The liquid recovered via the liquid recovery port 47 (the liquid recovery surface 33) is recovered by the liquid recovery apparatus 49 through the passageway 48.

In addition, in the present embodiment, the liquid immersion member 4 has exhaust ports 50, which serve to bring the upper side space 26 and an external space (ambient environment) surrounding the liquid immersion member 4 (the immersion space LS) into communication. The exhaust ports 50 are disposed in the vicinity of the upper side space 26 and are capable of exhausting the gas therein. In the present embodiment, the exhaust ports 50 are provided on opposite sides (one on each side) of the optical path of the exposure light EL in the X axial directions. The exhaust ports 50 are connected to exhaust passageways 51, which are formed inside the liquid immersion member 4. The openings at the upper ends of the exhaust passageways 51 are disposed at positions at which they can contact the gas in the external space. The gas in the external space can flow into the upper side space 26 via the exhaust passageways 51, and the gas in the upper side space 26 can flow out to the external space via the exhaust passageways 51. In the present embodiment, the gas can flow continuously back and forth between the upper side space 26 and the external space (the atmospheric space), which is outside of the upper side space 26, via the exhaust passageways 51, and the upper side space 26 is open to the atmosphere via the exhaust passageways 51. Furthermore, the exhaust passageways 51 may be omitted.

One example of an operation that forms the immersion space LS with the first liquid LQ will now be explained. To form the immersion space LS, the control apparatus 5 uses the first supply ports 41 to supply the first liquid LQ to the optical path of the exposure light EL. When the first liquid LQ is being supplied, the control apparatus 5 disposes the prescribed member at a position at which it opposes both the emergent surface 20 of the last optical element 19 and the lower surface 21 of the liquid immersion member 4. The first liquid LQ that is fed from the first supply apparatus 44 is supplied to the first supply ports 41 through the passageways 43. The first supply ports 41 supply the first liquid LQ to the upper side space 26. The first liquid LQ flows through the upper side space 26 and into the lower side space 28 through the opening 24. Thus, the immersion space LS is formed so that the optical path of the exposure light EL between the emergent surface 20 of the last optical element 19 and the front surface of the prescribed member is filled with the first liquid LQ.

In addition, in the present embodiment, the control apparatus 5 performs the operation of recovering the first liquid LQ using the liquid recovery port 47 in parallel with the operation of supplying the first liquid LQ using the first supply ports 41. At least some of the first liquid LQ on the prescribed member contacts the liquid contact surface 33 (the lower surface of the porous member 27) and is recovered thereby. The first liquid LQ that is recovered by the liquid recovery surface 33 is then recovered by the liquid recovery apparatus 49 through the passageway 48.

By performing the operation of recovering the first liquid LQ using the liquid recovery port 47 in parallel with the operation of supplying the first liquid LQ using the first supply ports 41, the control apparatus 5 can form the immersion space LS with the first liquid LQ between the last optical element 19 and the liquid immersion member 4 on one side and the prescribed member on the other side.

In the present embodiment, the control apparatus 5 can synchronously move the substrate stage 1 and the measurement stage 2 in the X and Y directions with respect to the last optical element 19 while, at the same time, causing the emergent surface 20 of the last optical element 19 to oppose either the upper surface 13 of the substrate stage 1 or the upper surface 14 of the measurement stage 2, or both, in the state wherein the upper surface 13 of the substrate stage 1 and the upper surface 14 of the measurement stage 2 are brought into proximity or contact with one another so that a space capable of holding the liquid between the last optical element 19 and either the substrate state 1 or the measurement stage 2, or both, is formed continuously, as disclosed in, for example, U.S. Patent Application Publication No. 2006/0023186 and U.S. Patent Application Publication No. 2007/0127006. Thereby, the immersion space of the liquid can move from the upper surface 13 of the substrate stage 1 to the upper surface 14 of the measurement stage 2, or from the upper surface 14 of the measurement stage 2 to the upper surface 13 of the substrate stage 1, and, at the same time, leakage of the liquid can be prevented.

The following text explains one example of a method of using the exposure apparatus EX discussed above to expose the substrate P.

The control apparatus 5 moves the substrate stage 1 to the substrate exchange position and uses a transport system (not shown) to load the substrate P—prior to its exposure—onto the substrate stage 1, which is disposed at the substrate exchange position. When the substrate stage 1 is disposed at the substrate exchange position, the measurement stage 2 is disposed at the exposure position and the immersion space LS is formed with the first liquid LQ between the last optical element 19 and liquid immersion member 4 on one side and the measurement stage 2 on the other side. As needed, the control apparatus 5 uses the first liquid LQ and the measurement stage 2 to perform prescribed measurements related to the exposure.

After the control apparatus 5 has loaded the substrate P onto the substrate stage 1 at the substrate exchange position and has performed the measurements using the measurement stage 2, the control apparatus 5 moves the substrate stage 1, which holds the substrate P prior to its exposure, to the exposure position and forms the immersion space LS with the first liquid LQ between the last optical element 19 and the liquid immersion member 4 on one side and the substrate stage 1 (the substrate P) on the other side.

The exposure apparatus EX of the present embodiment is a scanning type exposure apparatus (a so-called scanning stepper) that projects the image of the pattern of the mask M to the substrate P while synchronously moving the mask M and the substrate P in prescribed scanning directions. When the substrate P is to be exposed, the control apparatus 5 controls the mask stage 3 and the substrate stage 1 so as to move the mask M and the substrate P in the prescribed scanning directions within the XY plane, which is orthogonal to the optical axis AX (i.e., the optical path of the exposure light EL). In the present embodiment, the scanning directions (the synchronous movement directions) of the substrate P and the mask M are the Y axial directions. The control apparatus 5 both moves the substrate P in one of the Y axial directions with respect to the projection region PR of the projection optical system PL and radiates the exposure light EL to the substrate P through the projection optical system PL and the first liquid LQ in the immersion space LS on the substrate P while, at the same time, moving the mask M in the other Y axial direction with respect to the illumination region IR of the illumination system IL such that this movement is synchronized with the movement of the substrate P. As a result, the image of the pattern of the mask M is projected to the substrate P, which is thereby exposed by the exposure light EL.

In the present embodiment, when the substrate P is being exposed using the first liquid LQ or when a measurement is being performed with the measuring instruments C using the first liquid LQ, the supply of the second liquid LC via the second supply ports 42 is stopped.

The exposed substrate P is then unloaded from the substrate stage 1. In order to unload the substrate P from the substrate state 1 after the exposure, the control apparatus 5 moves the substrate stage 1 to the substrate exchange position. When the substrate state 1 is to be moved to the substrate exchange position, the control apparatus 5 moves the measurement stage 2 to the exposure position and forms the immersion space LS with the first liquid LQ between the last optical element 19 and the liquid immersion member 4 on one side and the measurement stage 2 on the other side. The control apparatus 5 uses the transport system to unload the exposed substrate P from the substrate stage 1, which is disposed at the substrate exchange position.

The control apparatus 5 successively performs immersion exposures on a plurality of substrates P by repetitively performing the loading operation, which loads the substrate P prior to its exposure, the exposure operation, which exposes the substrate P, and the unloading operation, which unloads the exposed substrate P.

Thus, in the present embodiment, during the exposure of the substrate P, the first liquid LQ contacts the last optical element 19, the liquid immersion member 4, the substrate state 1 (the plate member T), and the measurement stage 2.

During the exposure of the substrate P, it is possible that a substance (e.g., an organic substance like a photosensitive material) produced (eluted) from the substrate P will intermix with the first liquid LQ. It is further possible that the substance that intermixes with the first liquid LQ will adhere as foreign matter (contaminant) to the lower surface 21 of the liquid immersion member 4. In addition, it is possible that, along with the substance produced by the substrate P, foreign matter suspended in midair will intermix with the first liquid LQ and adhere to the lower surface 21 of the liquid immersion member 4. If the foreign matter (contaminant) is left in a state wherein it adheres to the lower surface 21 of the liquid immersion member 4, then it is possible that that foreign matter will likewise adhere to the substrate P during an exposure or will contaminate the first liquid LQ supplied via the first supply ports 41. As a result, exposure failures could occur such as, for example, the generation of defects in the pattern formed on the substrate P.

Accordingly, in the present embodiment, to clean the liquid immersion member 4, the control apparatus 5 supplies, according to a prescribed timing, the second liquid LC via the second supply ports 42 so that the second liquid LC contacts the lower surface 21 of the liquid immersion member 4; thereby, the control apparatus 5 cleans the lower surface 21 of the liquid immersion member 4 with the second liquid LC. As discussed above, in the present embodiment, an alkali cleaning liquid is used as the second liquid LC. Using an alkali cleaning liquid as the second liquid LC makes it possible to satisfactorily eliminate organic substances (contaminants) produced by the photosensitive material and the like that adhere to the lower surface 21 of the liquid immersion member 4.

In the present embodiment, a preventive apparatus 53 is capable of preventing contact between the last optical element 19 and the second liquid LC; furthermore, the liquid immersion member 4 is cleaned with the second liquid LC, while, at the same time, using the preventive apparatus 53 to prevent contact between the last optical element 19 and the second liquid LC supplied via the second supply ports 42. In the present embodiment, the preventive apparatus 53 includes the first supply ports 41.

If the second liquid LC, which may be, for example, an alkali cleaning liquid, contacts the last optical element 19, then the state of, for example, the front surface of the last optical element 19 could change. If, for example, the last optical element 19 is formed from quartz, then, the second liquid LC and the last optical element 19 to come into contact, the state of the front surface of the last optical element 19 could change or the optical characteristics could change, or the like.

Consequently, in the present embodiment, the control apparatus 5 supplies the second liquid LC via the second supply ports 42 while using the preventive apparatus 53 to prevent contact between the second liquid LC and the last optical element 19.

Figure 8:
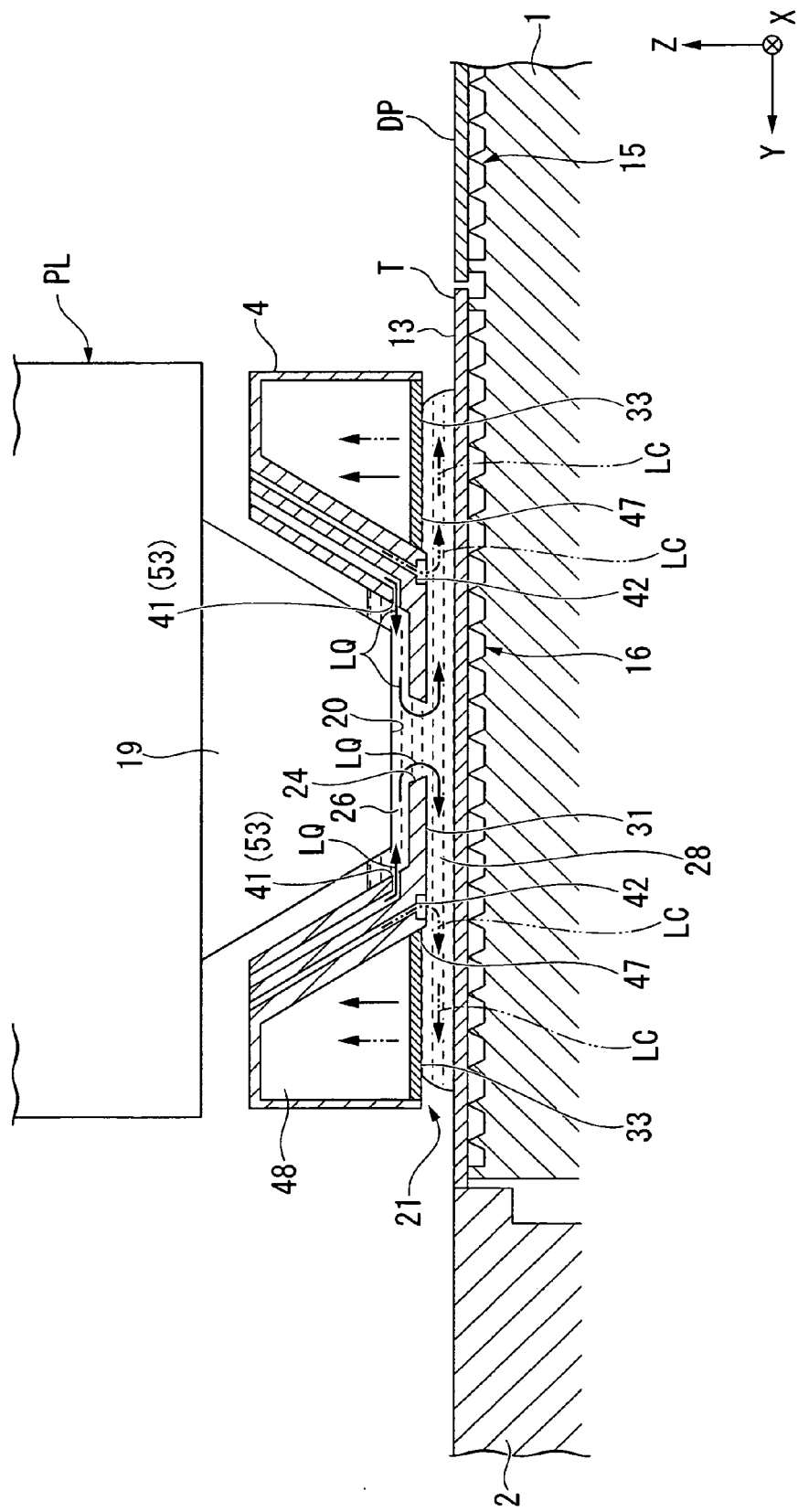
FIG. 8 is a schematic drawing that shows one example of a cleaning method according to the first embodiment.
Figure 9:
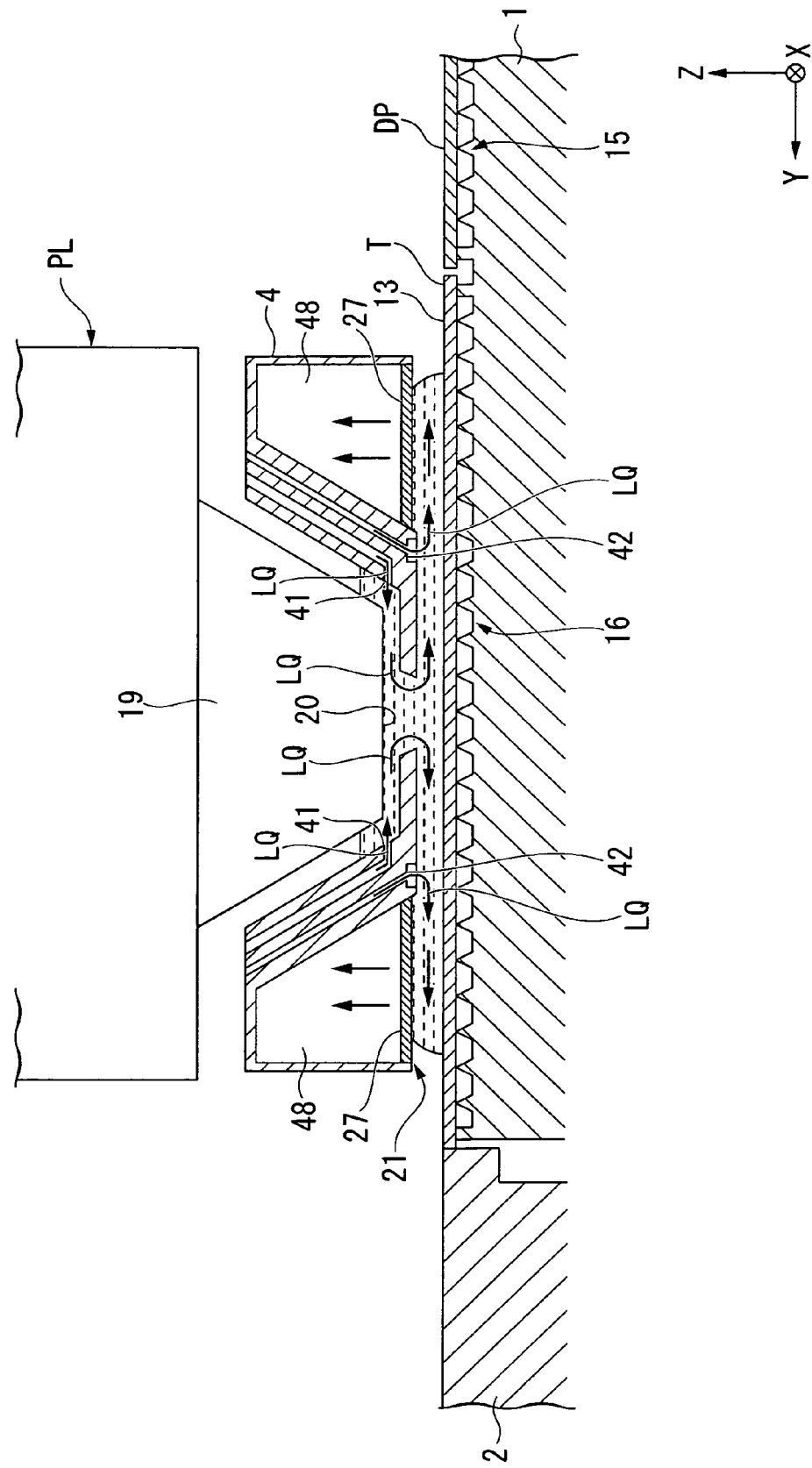
FIG. 9 is a schematic drawing that shows one example of the cleaning method according to a first embodiment.

The following text explains one example of a method of cleaning the liquid immersion member 4 and the like with the second liquid LC, referencing the schematic drawings of FIG. 8 and FIG. 9.

As shown in FIG. 8, in the present embodiment, when the liquid immersion member 4 is cleaned, a dummy substrate DP is held by the first holding part 15. The dummy substrate DP is a member (a clean member) that is distinct from the substrate P used for exposure and that has a high cleanliness level that tends not to release foreign matter. The external shape of the dummy substrate DP is substantially the same as that of the substrate P, and the first holding part 15 can hold the dummy substrate DP.

The control apparatus 5 disposes the substrate state 1 or the measurement stage 2, or both, so that it opposes the last optical element 19 and the liquid immersion member 4. In the present embodiment, the control apparatus 5 disposes the substrate stage 1 or the measurement stage 2, or both, so that it opposes the second supply ports 42 in the state wherein the upper surface 13 of the substrate state 1 and the upper surface 14 of the measurement stage 2 are brought into proximity or contact with one another. FIG. 8 shows an example wherein the upper surface 13 of the substrate state 1 (the plate member T) is disposed so that it opposes the second supply ports 42. Furthermore, during the cleaning operation, the upper surface 13 of the substrate stage 1 and the upper surface 14 of the measurement stage 2 do not have to be proximate or in contact with one another.

To clean the liquid immersion member 4, the control apparatus 5 starts the supply of the second liquid LC via the second supply ports 42. The control apparatus 5 controls the passageway switching mechanism 61 so as to feed the second liquid LC from the second supply apparatus 46 to the passageways 45 so that the first liquid LQ does not flow from the first liquid supply apparatus 44 into the passageways 45. The second liquid LC that is fed from the second supply apparatus 46 and flows through the passageways 45 is supplied to the second supply ports 42. The second supply ports 42 supply the second liquid LC so that it contacts the liquid immersion member 4.

In the present embodiment, the control apparatus 5 starts the supply of the second liquid LC via the second supply ports 42 while continuing to supply the first liquid LQ via the first supply ports 41. The second liquid LC from the second supply ports 42 is supplied to the lower side space 28 between the liquid immersion member 4 and the substrate state 1 (the plate member T).

In the present embodiment, the control apparatus 5 performs the supply operation, which supplies the second liquid LC via the second supply ports 42, while using the preventive apparatus 53, which includes the first supply ports 41, to prevent contact between the second liquid LC and the last optical element 19.

In the present embodiment, the preventive apparatus 53 prevents the second liquid LC, which is supplied to the lower side space 28 via the second supply ports 42, from flowing into the upper side space 26 via the opening 24. Thereby, contact between the second liquid LC and the last optical element 19, which is disposed in the upper side space 26, is prevented.

In the present embodiment, the preventive apparatus 53 prevents the second liquid LC from flowing into the upper side space 26 via the opening 24 by supplying the first liquid LQ to the upper side space 26 via the first supply ports 41.

Namely, in the present embodiment, the control apparatus 5 performs the operation of supplying the second liquid LC using the second supply ports 42 in parallel with the operation of supplying the first liquid LQ using the first supply ports 41. In addition, the control apparatus 5 performs the operation of recovering the liquid (either the first liquid LQ or the second liquid LC, or both) using the liquid recovery port 47 in parallel with the operation of supplying the first liquid LQ using the first supply ports 41 and the operation of supplying the second liquid LC using the second supply ports 42. Thereby, as shown in FIG. 8, the immersion space is formed with the liquid between the last optical element 19 and the liquid immersion member 4 on one side and the substrate state 1 on the other side.

The first liquid LQ supplied to the upper side space 26 via the first supply ports 41 flows through the upper side space 26 and into the lower side space 28 via the opening 24. The flow of the first liquid LQ prevents the second liquid LC, which is supplied to the lower side space 28 via the second supply ports 42, from flowing into the upper side space 26 via the opening 24.

Thus, in the present embodiment, by supplying the first liquid LQ via the first supply ports 41, the preventive apparatus 53 prevents the second liquid LC from contacting the last optical element 19.

The second supply ports 42 are disposed outward from the flat surface 31 with respect to the opening 24, and the second liquid LC supplied via the second supply ports 42 to the lower side space 28 is recovered together with the first liquid LQ via the liquid recovery surface 33.

The second liquid LC contacts the lower surface (the liquid recovery surface 33) of the porous member 27. Thereby, the second liquid LC cleans the lower surface of the porous member 27. In addition, the second liquid LC flows into the passageway 48 via the holes of the porous member 27, flows through the passageway 48, and is recovered by the liquid recovery apparatus 49. Accordingly, the inner surfaces of the holes of the porous member 27, the upper surface of the porous member 27, and the inner surface of the passageway 48 are all cleaned by the second liquid LC.

In the present embodiment, the size (within the XY plane) of the immersion space formed with the first liquid LQ and the second liquid LC during cleaning is larger than the size (within the XY plane) of the immersion space formed with the first liquid LQ alone when the substrate P is exposed. Accordingly, a large area of the lower surface 21 of the liquid immersion member 4 contacts the second liquid LC and is cleaned thereby.

In addition, the control apparatus 5, while supplying the second liquid LC via the second supply ports 42, can move the substrate state 1 with respect to the liquid immersion member 4 in the X and Y directions under prescribed movement conditions. By moving the substrate stage 1 with respect to the liquid immersion member 4 in the X and Y directions, at least some of the second liquid LC supplied to the lower side space 28 via the second supply ports 42 contacts the flat surface 31. Thereby, the flat surface 31 is cleaned by the second liquid LC.

In addition, the upper surface 13 of the substrate stage 1 is disposed so that it opposes the second supply ports 42 and contacts the second liquid LC supplied via the second supply ports 42. Thereby, the upper surface 13 of the substrate stage 1 (the plate member T) is cleaned by the second liquid LC.

In addition, by moving the substrate stage 1 with respect to the liquid immersion member 4 in the X and Y directions while the second liquid LC is supplied via the second supply ports 42, a larger area of the upper surface 13 of the substrate state 1 (the plate member T) is cleaned by the second liquid LC.

In the present embodiment, because cleaning with the second liquid LC is performed in the state wherein the first holding part 15 holds the dummy substrate DP, contact between the second liquid LC and the first holding part 15 is prevented. Furthermore, by supplying the second liquid LC via the second supply ports 42 in the state wherein the dummy substrate DP is disposed at a position at which it opposes the second supply ports 42, the lower surface 21 of the liquid immersion member 4 alone may be cleaned.

In addition, the control apparatus 5 can clean the upper surface 14 of the measurement stage 2 with the second liquid LC by disposing the upper surface 14 of the measurement stage 2, which includes the upper surfaces of the measuring instruments C, so that it opposes the second supply ports 42 and by supplying the second liquid LC via the second supply ports.

After cleaning with the second liquid LC is complete, the control apparatus 5 stops the operation of the second supply apparatus 46 and the supply of the second liquid LC using the second supply ports 42. Furthermore, prior to the exposure of the substrate P, the control apparatus 5 performs a process that eliminates the second liquid LC from the liquid immersion member 4.

In the present embodiment, the process that eliminates the second liquid LC from the liquid immersion member 4 includes a flushing process that supplies the first liquid LQ.

As shown in FIG. 9, the control apparatus 5—in the state wherein the supply of the second liquid LC is stopped and the substrate stage 1, on which the dummy substrate DP is held by the first holding part 15, is disposed so that it opposes the last optical element 19 and the liquid immersion member 4—performs the recovery operation, which recovers the first liquid LQ using the liquid recovery port 47, in parallel with the supply operation, which supplies the first liquid LQ using the first supply ports 41. Thereby, the second liquid LC that remains on, for example, the lower surface 21 of the liquid immersion member 4 and the porous member 27, and in, for example, the recovery passageway 48 is washed away.

In addition, in the present embodiment, the control apparatus 5 controls the first supply apparatus 44, the second supply apparatus 46, and the passageway switching mechanism 61 so as to supply the first liquid LQ from the first supply apparatus 44 to the second supply ports 42 via the passageways 45 in the state wherein the supply of the second liquid LC from the second supply apparatus 46 to the passageways 45 is stopped. By supplying the first liquid LQ to the second supply ports 42 via the passageways 45, the control apparatus 5 can wash away the second liquid LC that remains in, for example, the passageways 45 and the second supply ports 42 with the first liquid LQ.

In addition, the control apparatus 5—by performing the recovery operation, which recovers the first liquid LQ using the liquid recovery port 47, in parallel with the supply operation, which supplies the first liquid LQ using the first supply ports 41 and the second supply ports 42, in the state wherein the supply of the second liquid LC is stopped and the upper surface 13 of the substrate state 1 (the plate member T) is disposed so that it opposes the last optical element 19 and the liquid immersion member 4—can wash away the second liquid LC that remains on the upper surface 13 of the substrate state 1 (the plate member T) with the first liquid LQ.

In addition, the control apparatus 5—by performing the recovery operation, which recovers the first liquid LQ using the liquid recovery port 47, in parallel with the supply operation, which supplies the first liquid LQ using the first supply ports 41 and the second supply ports 42, in the state wherein the supply of the second liquid LC is stopped and the upper surface 14 of the measurement stage 2 is disposed so that it opposes the last optical element 19 and the liquid immersion member 4—can wash away the second liquid LC that remains on the upper surface 14 of the measurement stage 2 with the first liquid LQ.

Thus, after the liquid immersion member 4 and the like are cleaned using the second liquid LC, the first liquid LQ is used to eliminate the second liquid LC, thereby preventing the intermixing of the second liquid LC with the first liquid LQ that fills the optical path of the exposure light EL during subsequent exposures of the substrate P.

After the cleaning process using the second liquid LC and the flushing process using the first liquid LQ are complete, the substrate P to be exposed is held by the first holding part 15 and the exposing process is performed on that substrate P. Prescribed processes, such as the developing process, are then performed on the exposed substrate P.

According to the present embodiment as explained above, it is possible to efficiently and satisfactorily clean the liquid immersion member 4 and the like inside the exposure apparatus EX using the second liquid LC. Accordingly, it is possible to prevent the occurrence of exposure failures and the production of defective devices caused by the contamination of the liquid immersion member 4 and the like.

According to the present embodiment, contact between the second liquid LC and the last optical element 19 is prevented, which, in turn, makes it possible to prevent any changes in the performance of the last optical element 19. Accordingly, it is possible to prevent exposure failures from occurring.

In addition, according to the present embodiment, it is also possible to use the second liquid LC to efficiently and satisfactorily clean surfaces (liquid contact surfaces) of prescribed members that contact the first liquid LQ during the exposure of the substrate P, for example, the upper surface 13 of the substrate stage 1 and the upper surface 14 of the measurement stage 2. Accordingly, it is possible to prevent the occurrence of exposure failures and the production of defective devices caused by the contamination of these prescribed members.

In addition, in the present embodiment, when cleaning the liquid immersion member 4 and the like using the second liquid LC, contact between the second liquid LC and the last optical element 19 may be prevented by supplying via the first supply ports 41 a liquid, other than the first liquid LQ, that does not affect the last optical element 19.

In addition, in the present embodiment, other liquid supply ports may be provided in the vicinity of the first supply ports 41 and contact between the second liquid LC and the last optical element 19 may be prevented by supplying liquid (e.g., the first liquid LQ) to the upper side space 26 via those supplementary liquid supply ports.

<Second Embodiment>

The following explains a second embodiment. In the explanation below, constituent parts that are identical or equivalent to those in the embodiment discussed above are assigned identical symbols, and the explanations thereof are therefore abbreviated or omitted.

The following text explains an exemplary case wherein the substrate state 1 is disposed at a position at which it opposes the liquid immersion member 4 when cleaning using the second liquid LC is performed; however, similar to the embodiment discussed above, it is also possible to dispose the dummy substrate DP, which is held by the first holding part 15, or the measurement stage 2, or both, at this position.

FIG. 10 shows one example of a preventive apparatus 53B according to a second embodiment. In the present embodiment, the preventive apparatus 53B comprises a cover member 70, which is disposed between the last optical element 19 and the substrate stage 1. In addition, in the present embodiment, the preventive apparatus 53B comprises holding apparatuses 71, which releasably hold the cover member 70. In the present embodiment, the holding apparatuses 71 are provided to a liquid immersion member 4B.

In the present embodiment, the cover member 70 is disposed so that it closes the opening 24. The holding apparatuses 71 hold the cover member 70 in order to close the opening 24 therewith.

The cover member 70 is plate shaped. The cover member 70 has an upper surface 72, which is capable of opposing the flat surface 31. The external shape of the cover member 70 within the XY plane is larger than that of the opening 24 and smaller than that of the flat surface 31.

At least part of each of the holding apparatuses 71 is disposed in a circumferential edge area of the flat surface 31. In the present embodiment, the holding apparatuses 71 constitute a so-called electrostatic chuck mechanism. The holding apparatuses 71, which constitute the electrostatic chuck mechanism, can releasably hold the cover member 70.

When the liquid immersion member 4 and the like are being cleaned, the holding apparatuses 71 hold the cover member 70 so that the cover member 70 closes the opening 24, as shown in FIG. 10. The control apparatus 5 supplies the second liquid LC via the second supply ports 42 in the state wherein the opening 24 is closed by the cover member 70. The control apparatus 5 performs the recovery operation, which recovers the second liquid LC using the liquid recovery port 47, in parallel with the supply operation, which supplies the second liquid LC using the second supply ports 42. In the present embodiment, when the second liquid LC is supplied via the second supply ports 42, the supply of the first liquid LQ via the first supply ports 41 is stopped.

In the present embodiment, too, it is possible to clean the liquid immersion member 4 and the substrate state 1 while, at the same time, preventing contact between the last optical element 19 and the second liquid LC.

<Third Embodiment>

The following text explains a third embodiment. In the explanation below, constituent parts that are identical or equivalent to those in the embodiments discussed above are assigned identical symbols, and the explanations thereof are therefore abbreviated or omitted.

FIG. 11 includes views that show one example of a preventive apparatus 53C according to the third embodiment. In the present embodiment, the preventive apparatus 53C comprises a shutter mechanism 74, which comprises shutter members 73A, 73B that are disposed between the last optical element 19 and the substrate stage 1. In the present embodiment, the shutter mechanism 74 is provided to a liquid immersion member 4C.

In the present embodiment, the shutter mechanism 74 comprises: recessed parts 75A, 75B, which are formed in the inner surfaces of the second plate part 23 that define the opening 24; the shutter members 73A, 73B, which are capable of being disposed in the recessed parts 75A, 75B, respectively; and actuators 76A, 76B, which are capable of moving the shutter members 73A, 73B. The recessed part 75A is formed in the +Y side inner surface of the second plate part 23 that defines the opening 24, and the recessed part 75B is formed in the −Y side inner surface of the second plate part 23 that defines the opening 24. The shutter members 73A, 73B are plate shaped. The shutter members 73A, 73B can be moved in the Y axial directions by the operation of the actuators 76A, 76B. The shutter members 73A, 73B are capable of entering and exiting the recessed parts 75A, 75B by the operation of the actuators 76A, 76B, respectively.

Figure 11A:
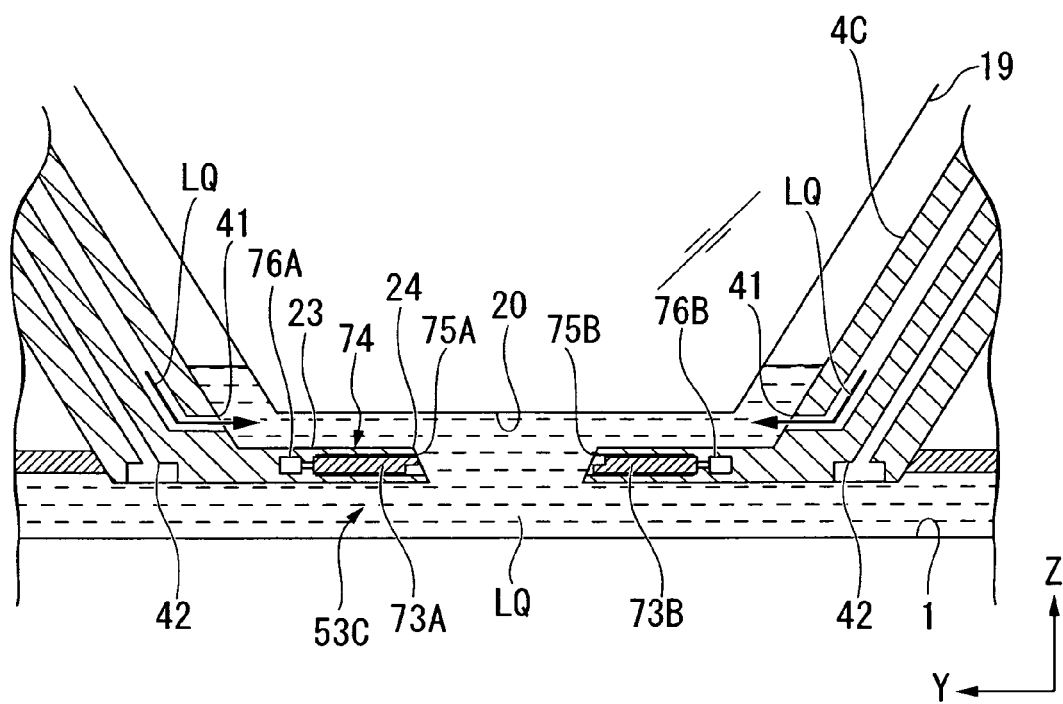
FIG. 11A presents diagrammatic views that show one example of the preventive apparatus according to a third embodiment.

For example, when the substrate P is being exposed, the shutter members 73A, 73B are disposed in the recessed parts 75A, 75B, respectively, as shown in FIG. 11A. The control apparatus 5 supplies the first liquid LQ via the first supply ports 41 in order to form the immersion space LS.

Figure 11B:
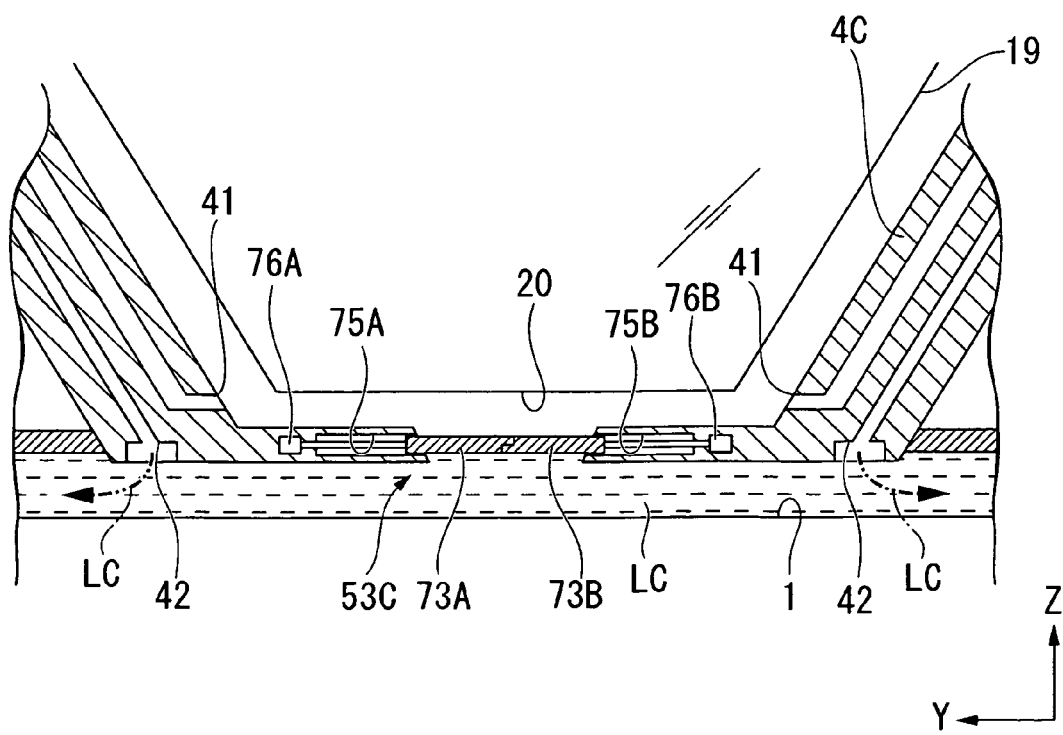
FIG. 11B presents diagrammatic views that show one example of the preventive apparatus according to the third embodiment.

In order to close the opening 24 with the shutter members 73A, 73B during the cleaning of the liquid immersion member 4C and the like, the control apparatus 5 operates the actuators 76A, 76B so as to dispose the shutter members 73A, 73B in the opening 24, as shown in FIG. 11B. Thereby, the opening 24 is closed. The control apparatus 5 supplies the second liquid LC via the second supply ports 42 in the state wherein the shutter members 73A, 73B have closed the opening 24. When the second liquid LC is supplied via the second supply ports 42, the supply of the first liquid LQ via the first supply ports 41 is stopped.

In the present embodiment, too, the liquid immersion member 4C and the like can be cleaned while the last optical element 19 and the second liquid LC are prevented from contacting one another.

Furthermore, in the present embodiment, the shutter members 73A, 73B are disposed in the opening 24 so as to close the opening 24; however, the shutter members 73A, 73B may be disposed below the flat surface 31 or above the upper surface 25.

<Fourth Embodiment>

The following text explains a fourth embodiment. In the explanation below, constituent parts that are identical or equivalent to those in the embodiments discussed above are assigned identical symbols, and the explanations thereof are therefore abbreviated or omitted.

Figure 12:
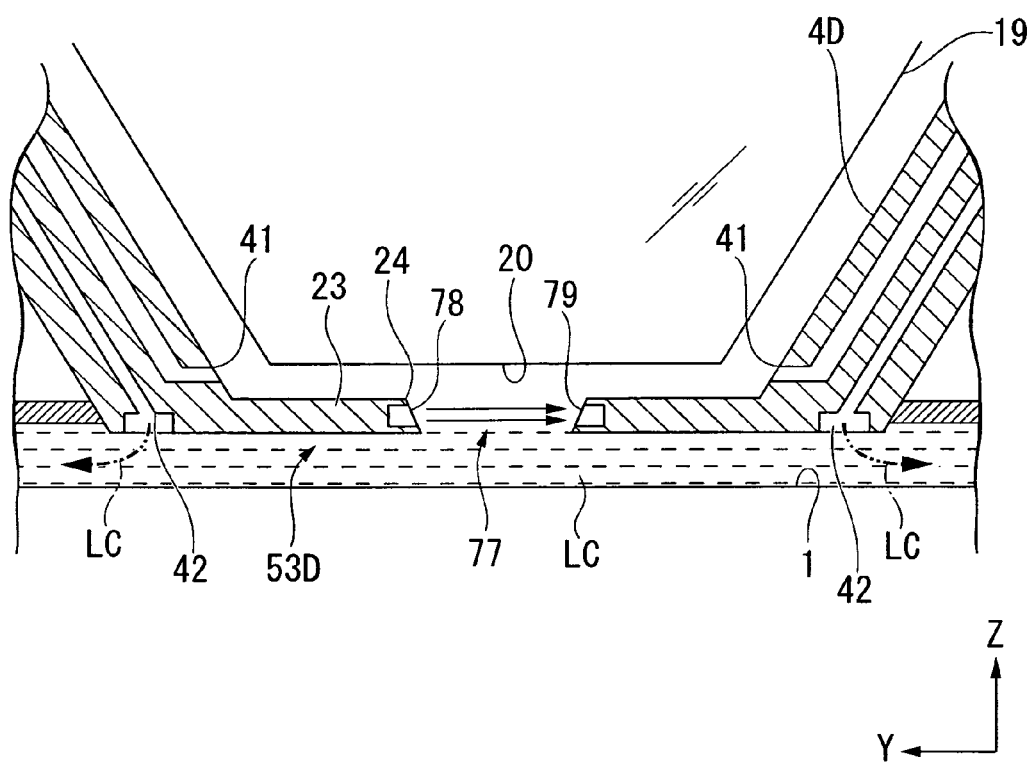
FIG. 12 is a diagram that shows one example of the preventive apparatus according to a fourth embodiment.

FIG. 12 is a view that shows one example of a preventive apparatus 53D according to the fourth embodiment. In the present embodiment, the preventive apparatus 53D forms a fluid curtain 77 in the vicinity of the opening 24.

In the present embodiment, the preventive apparatus 53D comprises a fluid supply port 78, which is disposed on the +Y side inner surface of the second plate part 23 that defines the opening 24, and a fluid suction port 79, which is disposed on the −Y side inner surface of the second plate part 23 that defines the opening 24. In the present embodiment, the fluid is a gas. The fluid supply port 78 supplies the gas.

During the cleaning of a liquid immersion member 4D and the like, the preventive apparatus 53D performs a suction operation, which suctions the gas using the fluid suction port 79, in parallel with a supply operation, which supplies the gas using the fluid supply port 78, as shown in FIG. 12. Thereby, a flow of gas is generated from the +Y side of the opening 24, where the fluid supply port 78 is disposed in the inner surface of the second plate part 23, toward the −Y side, thus forming the fluid curtain 77.

The control apparatus 5 supplies the second liquid LC via the second supply ports 42 in the state wherein the fluid curtain 77 is formed. When the second liquid LC is supplied via the second supply ports 42, the supply of the first liquid LQ via the first supply ports 41 is stopped.

In the present embodiment, while the liquid immersion member 4D and the like are being cleaned, the preventive apparatus 53D forms the fluid curtain 77 in the opening 24 and thereby prevents the last optical element 19 and the second liquid LC from contacting one another.

Furthermore, in the present embodiment, the fluid curtain 77 is formed with the gas, but it may be formed with a liquid. By supplying a liquid (e.g., pure water) that has little effect on the last optical element 19 via the fluid supply port 78 and suctioning that liquid via the fluid suction port 79, the liquid immersion member 4D and the like can be cleaned while preventing the last optical element 19 and the second liquid LC from contacting one another.

Figure 13:
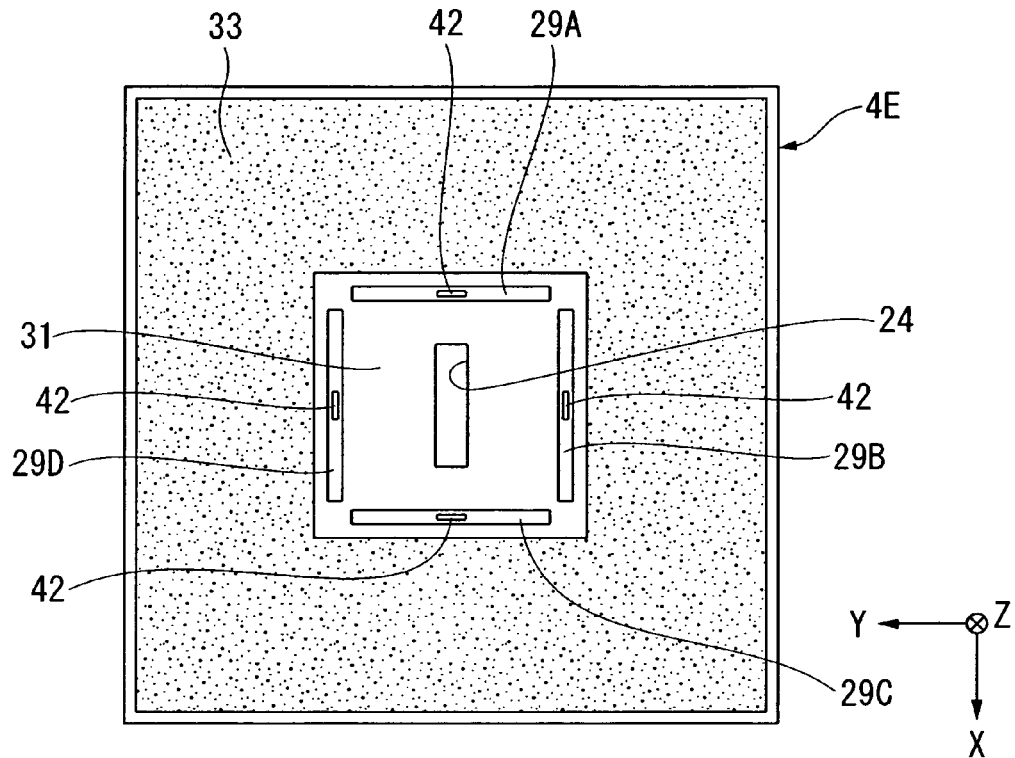
FIG. 13 is a diagram that shows one example of a liquid immersion member.

Furthermore, each of the first through fourth embodiments discussed above explained an exemplary case wherein the groove 29, in which the second supply ports 42 are disposed, has a rectangular ring shape, but the groove 29 may have a circular ring shape; for example, a plurality of grooves 29A, 29B, 29C, 29D may be formed around the flat surface 31 and one of the second supply ports 42 may be disposed in each of the grooves 29A-29D, as in a liquid immersion member 4E shown in FIG. 13.

Figure 14:
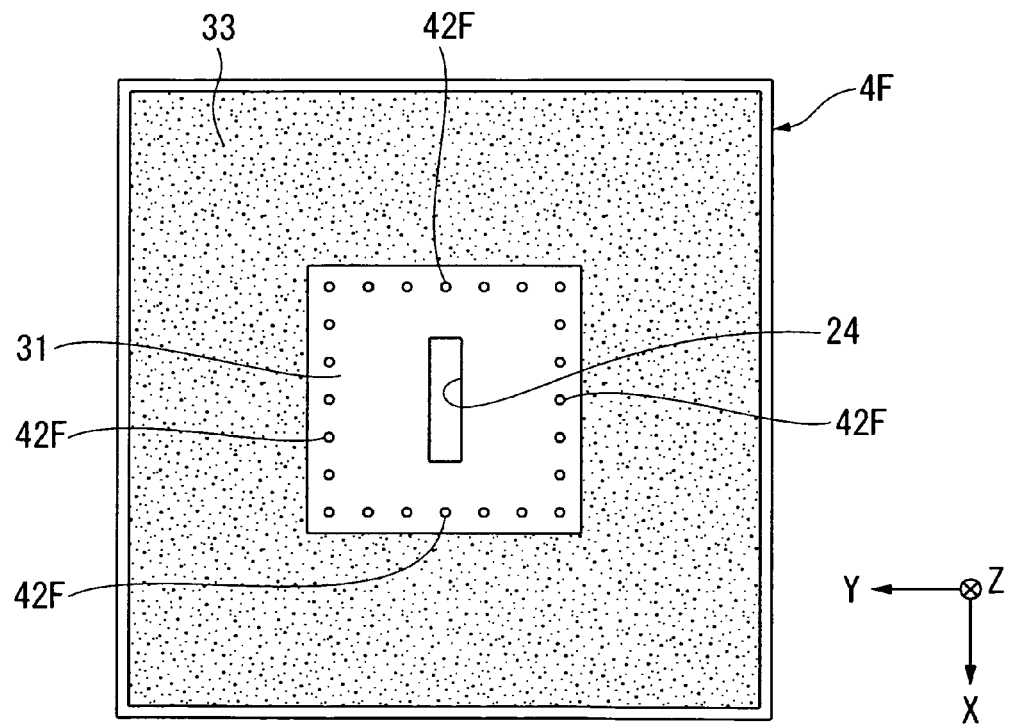
FIG. 14 is a diagram that shows one example of a liquid immersion member.

In addition, as in a liquid immersion member 4F shown in FIG. 14, the groove 29 may be omitted and a plurality of second supply ports 42F may be disposed around the flat surface 31. In addition, as shown in FIG. 14, the second supply ports 42F may be circular.

In addition, in the first through fourth embodiments discussed above, the second supply ports 42 are provided to the flat surface 31 of the liquid immersion member 4, that is, they are provided close to the opening 24. By providing the second supply ports 42 to the flat surface 31, the second liquid LC and the flat surface 31 can be easily brought into contact with one another without moving any member that opposes the last optical element 19.

In addition, in the first through fourth embodiments discussed above, the second supply ports 42 do not have to be provided to the lower surface 21 of the liquid immersion member 4. For example, the second supply ports 42 may be provided to an inner side surface of the second plate part 23 that defines the opening 24, and the second liquid LC may be supplied toward the optical path of the exposure light EL.

Figure 15:
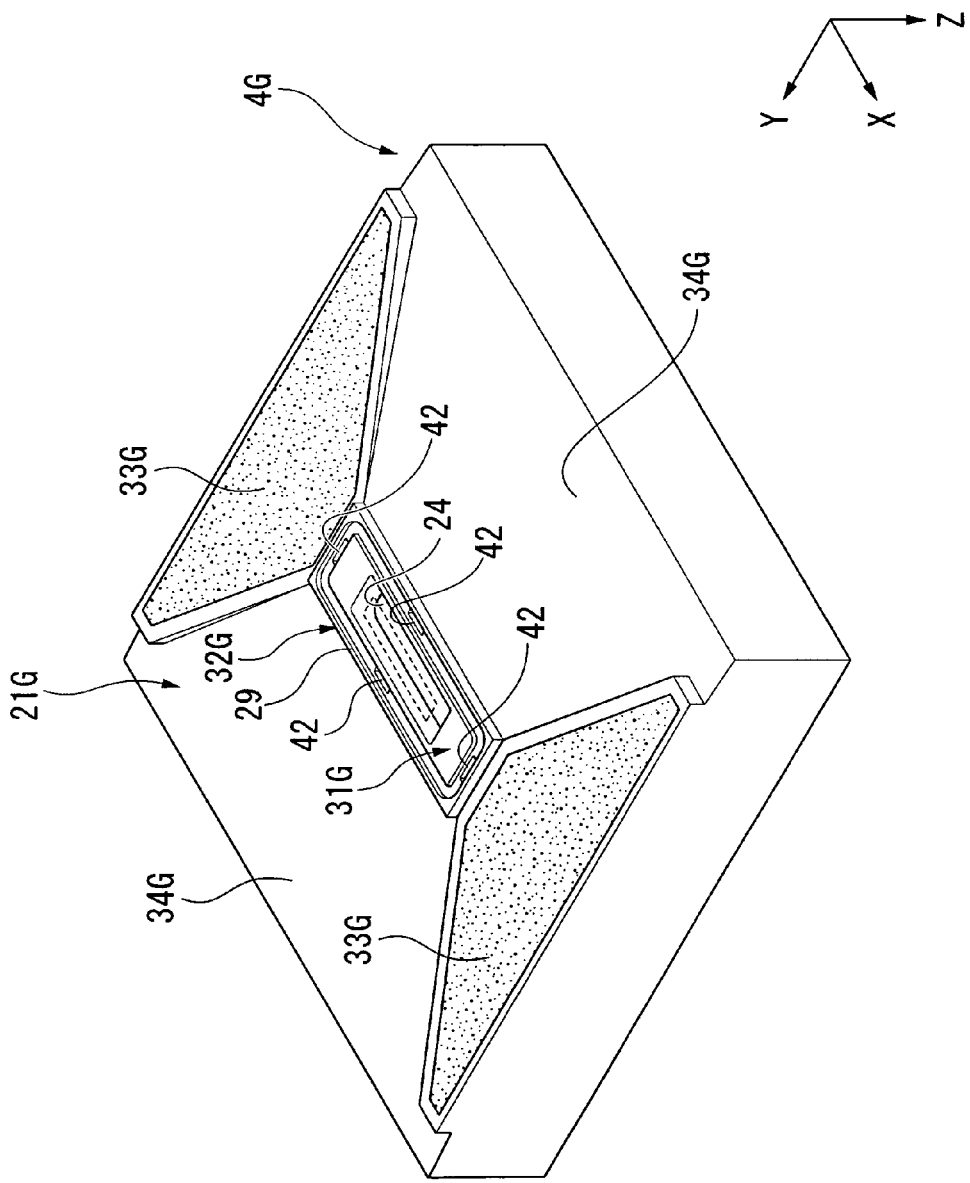
FIG. 15 is a diagram that shows one example of a liquid immersion member.

In addition, each of the embodiments discussed above explained an exemplary case of cleaning the liquid immersion member 4 (4B-4F), which comprises the liquid recovery surface 33 disposed around the flat surface 31, but it is also possible to clean a liquid immersion member 4G, as shown in FIG. 15. FIG. 15 is an oblique view of the liquid immersion member 4G, viewed from the lower side (the −Z side).

In FIG. 15, a lower surface 21G of the liquid immersion member 4G has a first area (flat surface) 31G, which is disposed around the opening 24; a second area 32G, which is disposed around the first area 31G and has the groove 29; liquid recovery surfaces 33G, which are disposed outward from the first and second areas 31G, 32G with respect to the opening 24; and inclined surfaces 34G, which are disposed outward from the first and second areas 31G, 32G with respect to the opening 24. The second supply ports 42 are disposed in the groove 29. One of the liquid recovery surfaces 33G is provided in one of the X axial directions (the +X side) and the other liquid recovery surface 33G is provided in the other X axial direction (the −X side) with respect to the first and second areas 31G, 32G. One of the inclined surfaces 34G is provided in one of the Y axial directions (the +Y side) and the other inclined surface 34G is provided in the other Y axial direction (the −Y side) with respect to the first and second areas 31G, 32G.

The inclined surfaces 34G are capable of holding the first liquid LQ between themselves and the front surface of the substrate P during the exposure of the substrate P. The inclined surfaces 34G are disposed at positions at which they are further from the front surface of the substrate P than the first and second areas 31G, 32G are. The inclined surfaces 34G are inclined in the Y axial directions so that they become gradually spaced apart from the front surface of the substrate P in the directions (the radial directions) that lead away from the optical path of the exposure light EL. The inclined surfaces 34G are not capable of recovering the first liquid LQ.

In the liquid immersion member 4G shown in FIG. 15, too, the lower surface 21G of the liquid immersion member 4G can be cleaned by supplying the second liquid LC via the second supply ports 42 so that the second liquid LC contacts the lower surface 21G.

Furthermore, the details of the liquid immersion member 4G as shown in FIG. 15 are disclosed in, for example, European Patent Application Publication No. 1865542.

Figure 16:
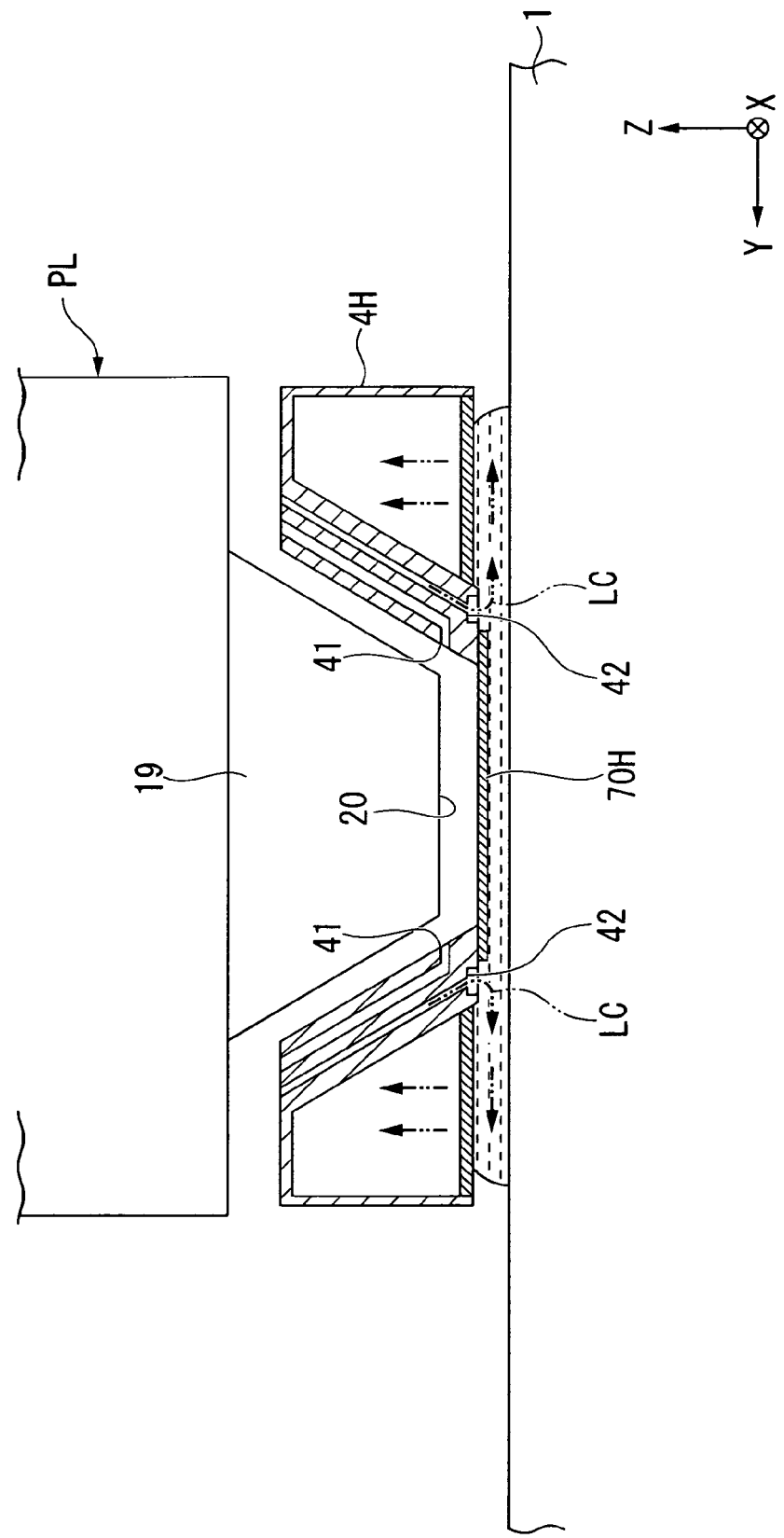
FIG. 16 is a diagram that shows one example of a liquid immersion member.

Furthermore, each of the embodiments discussed above explained an exemplary case wherein the liquid immersion member 4 has the upper surface 25, at least part of which opposes the emergent surface 20 of the last optical element 19; however, a liquid immersion member 4H, from which the upper surface 25 has been omitted, can be cleaned with the second liquid LC as shown in, for example, FIG. 16. For example, similar to the second embodiment, disposing a cover member 70H between the last optical element 19 and the substrate stage 1 makes it possible to prevent the second liquid LC and the last optical element 19 from contacting one another.

In addition, in the liquid immersion member 4H wherein the upper surface 25 is omitted, the first liquid LQ may flow via the first supply ports 41 as in the first embodiment discussed above, the shutter member may be disposed below the last optical element 19 as in the third embodiment discussed above, or the fluid curtain 77 may be provided below the last optical element 19 as in the fourth embodiment discussed above.

Thus, similar to each of the embodiments discussed above, providing a barrier below the last optical element 19 can prevent the second liquid LC and the last optical element 19 from contacting one another in the present embodiment, too.

<Fifth Embodiment>

The following text explains a fifth embodiment. In the explanation below, constituent parts that are identical or equivalent to those in the embodiments discussed above are assigned identical symbols, and the explanations thereof are therefore abbreviated or omitted.

Each of the embodiments discussed above explained an exemplary case wherein the second supply ports 42 are disposed in the liquid immersion member 4; however, the characteristic that differentiates the fifth embodiment from the other embodiments is that second supply ports 42J are provided to a prescribed member, which is disposed at a position at which it opposes the lower surface 21 of a liquid immersion member 4J.

Figure 17:
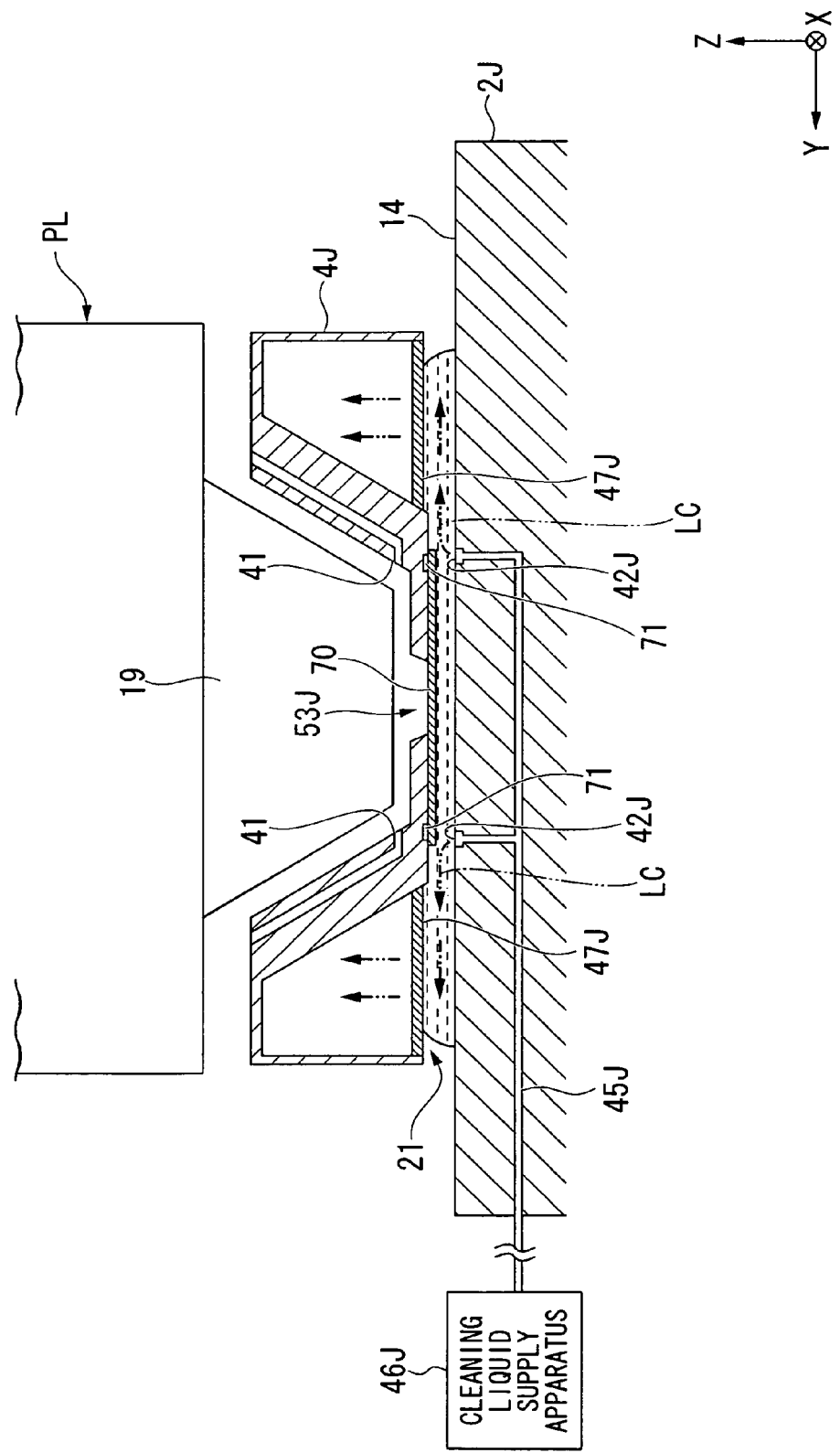
FIG. 17 is a diagram that shows one example of the exposure apparatus according to a fifth embodiment.

FIG. 17 is a view that shows one example of an exposure apparatus EX according to the fifth embodiment. In FIG. 17, a measurement stage 2J comprises the second supply ports 42J, which are disposed in the upper surface 14 of the measurement stage 2J. The second supply ports 42J are capable of opposing the lower surface 21 of the liquid immersion member 4J. The second supply ports 42J are connected to a second supply apparatus 46J via a passageway 45J. The passageway 45J comprises a supply passageway, which is formed inside the measurement stage 2J, and a passageway, which is formed from a supply pipe that connects the supply passageway and the second supply apparatus 46J.

In the present embodiment, a preventive apparatus 53J comprises the cover member 70, which is for closing the opening 24, and the holding apparatuses 71, which releasably hold the cover member 70, as explained in the second embodiment discussed above. Furthermore, in the present embodiment, too, the first liquid LQ may flow via the first supply ports 41 as in the first embodiment discussed above, the shutter member may be disposed below the last optical element 19 as in the third embodiment discussed above, and the fluid curtain 77 may be provided below the last optical element 19 as in the fourth embodiment discussed above.

The control apparatus 5—by performing the recovery operation, which recovers the second liquid LC using a liquid recovery port 47J disposed in the liquid immersion member 4J, in parallel with a supply operation, which supplies the second liquid LC using the second supply ports 42J, in the state wherein the lower surface 21 of the liquid immersion member 4J opposes the second supply ports 42J disposed in the upper surface 14 of the measurement stage 2J—can clean the lower surface 21 of the liquid immersion member 4J, the upper surface 14 of the measurement stage 2J, and the like.

Furthermore, the present embodiment explained an exemplary case wherein the second supply ports 42J are disposed in the measurement stage 2J, but the second supply ports may be disposed in the substrate stage 1. By performing the recovery operation, which recovers the second liquid LC using the liquid recovery ports, in parallel with the supply operation, which supplies the second liquid LC using the second supply ports, in the state wherein the lower surface 21 of the liquid immersion member opposes the second supply ports, which are disposed in the upper surface 13 of the substrate stage 1, it is possible to clean the lower surface 21 of the liquid immersion member, the upper surface 13 of the substrate stage 1, and the like.

In addition, in the present embodiment, the second supply ports that supply the second liquid LC may be also provided in advance to the liquid immersion member 4J, and the second supply ports of the liquid immersion member 4J may be used in parallel with the second supply ports 42J of the prescribed member (the measurement stage 2 and the like), which is disposed at a position at which it opposes the lower surface 21 of the liquid immersion member 4J.

Furthermore, in the first through fifth embodiments discussed above, the first liquid LQ or the second liquid LC, or both, may be recovered using a liquid recovery part disposed at a position at which it opposes the lower surface of the liquid immersion member, either with or without using the liquid recovery port 47 (the liquid recovery surface 33). The liquid recovery part disposed at a position at which it opposes the lower surface of the liquid immersion member can be provided to, for example, the substrate stage 1 or the measurement stage 2, or both.

Furthermore, each of the first through fifth embodiments discussed above explained an exemplary case wherein a prescribed member (e.g., the substrate stage 1, the measurement stage 2, or the dummy substrate DP) is disposed at a position at which it opposes the lower surface 21 of the liquid immersion member 4, the second liquid LC is supplied to the space between the lower surface 21 of the liquid immersion member 4 and the prescribed member, and the immersion space is thereby formed with the second liquid LC; however, as discussed above, if the liquid recovery part is disposed at a position at which it opposes the lower surface of the liquid immersion member, then the second liquid LC may be sprayed from below the liquid immersion member 4 toward the lower surface thereof in the state wherein, for example, the opening 24 is closed by the cover member 70. In addition, as discussed above, if the liquid recovery part is disposed at a position at which it opposes the lower surface of the liquid immersion member, then the second liquid LC may be supplied, for example, via the liquid recovery port 47 of the liquid immersion member.

<Sixth Embodiment>

The following explains a sixth embodiment. In the explanation below, constituent parts that are identical or equivalent to those in the embodiment discussed above are assigned identical symbols, and the explanations thereof are therefore abbreviated or omitted.

Figure 18:
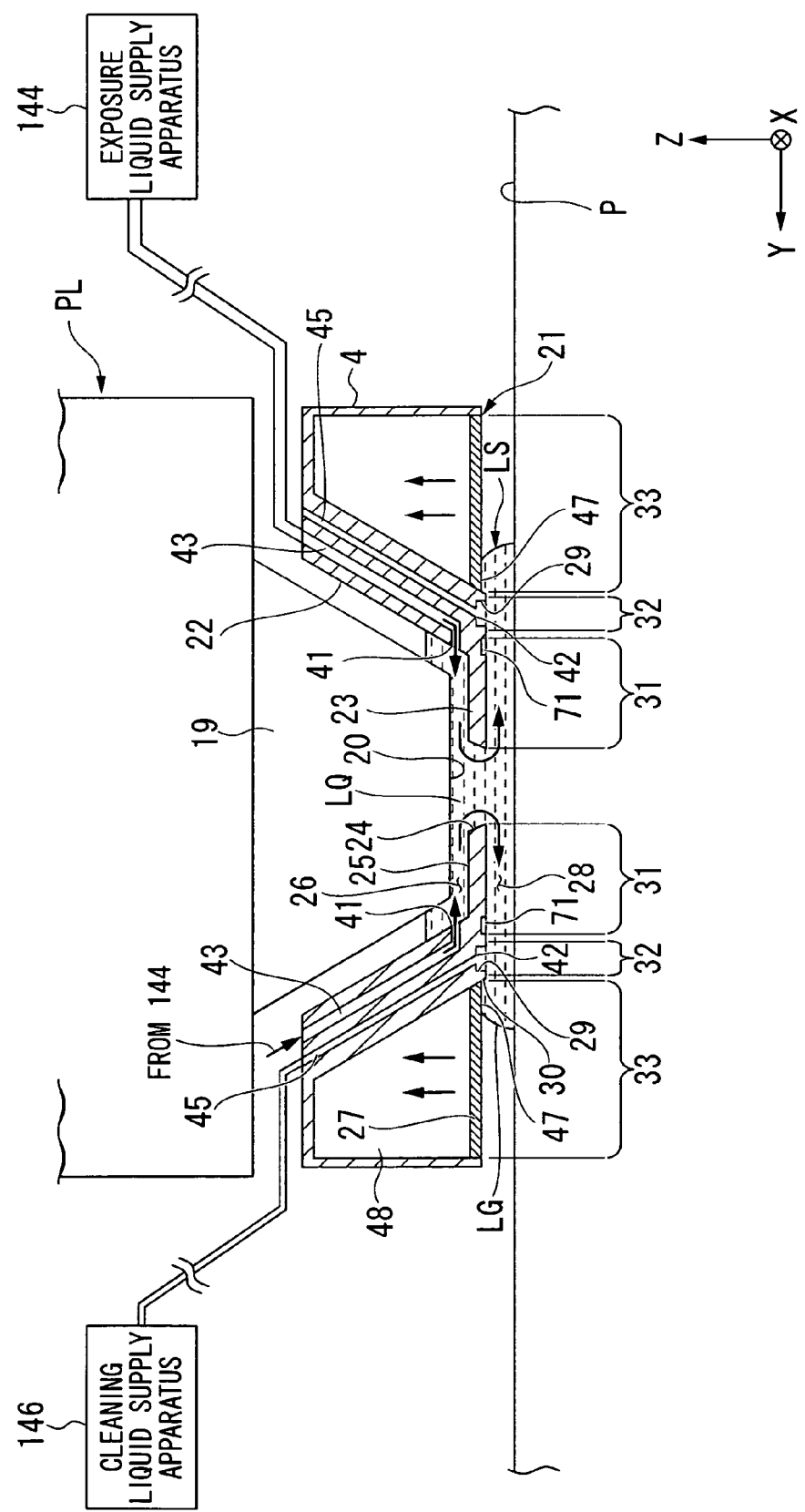
FIG. 18 is a side cross sectional view that is parallel to the YZ plane and shows the vicinity of a liquid immersion member according to the sixth embodiment.

As shown in FIG. 18, in the present embodiment, holding apparatuses 71, which constitute an electrostatic chuck mechanism, are disposed in parts of the flat surface 31. The holding surface of each of the holding apparatuses 71 is disposed within the same plane as (flush with) the flat surface 31. The holding apparatuses 71 releasably hold an object.

The first supply ports 41 are connected to a first supply apparatus 144 via passageways 43. The first supply apparatus 144 is capable of feeding the first liquid LQ, which is pure and temperature adjusted. Each passageway 43 comprises a supply passageway, which is formed inside the liquid immersion member 4, and a passageway, which is formed from a supply pipe that connects the supply passageway and the first supply apparatus 144. The first liquid LQ fed from the first supply apparatus 144 is supplied to the first supply ports 41 through the passageways 43. The first supply ports 41 supply the first liquid LQ from the first supply apparatus 144 to the optical path of the exposure light EL.

The second supply ports 42 are connected to a second supply apparatus 146 via passageways 45. The second supply apparatus 146 is capable of feeding the second liquid LC. Each passageway 45 comprises a supply passageway, which is formed inside the liquid immersion member 4, and a passageway, which is formed from a supply pipe that connects the supply passageway and the second supply apparatus 146. The second liquid LC fed from the second supply apparatus 146 is supplied to the second supply ports 42 through the passageways 45. The second supply ports 42 are capable of supplying the second liquid LC from the second supply apparatus 146 to a space between the lower surface 21 of the liquid immersion member 4 and the front surface of the prescribed member that opposes the lower surface 21. The space between the lower surface 21 of the liquid immersion member 4 and the front surface of the prescribed member includes the lower side space 28.

In addition, the liquid immersion member 4 has a liquid recovery port 47, which is capable of recovering liquid. The liquid recovery port 47 recovers the liquid on the prescribed member that opposes the lower surface 21 of the liquid immersion member 4.

The liquid recovery port 47 is disposed at a prescribed position in the liquid immersion member 4 so that it opposes the front surface of the substrate P. The liquid recovery port 47 is disposed outward from the flat surface 31 and the second supply ports 42 (the second area 32) with respect to the optical path of the exposure light EL. The porous member 27 is disposed in the liquid recovery port 47. The lower surface of the porous member 27 disposed in the liquid recovery port 47 is the liquid recovery surface 33.

The liquid recovery port 47 (the liquid recovery surface 33) is connected to a first liquid recovery apparatus 149 via a passageway 48. The first liquid recovery apparatus 149 comprises a vacuum system and is capable of recovering the liquid via suctioning. The passageway 48 comprises a recovery passageway, which is formed inside the liquid immersion member 4, and a passageway, which is formed from a recovery pipe that connects the recovery passageway and the first liquid recovery apparatus 149. The liquid recovered via the liquid recovery port 47 (the liquid recovery surface 33) is recovered by the first liquid recovery apparatus 149 through the passageway 48.

In addition, in the present embodiment, the liquid immersion member 4 has openings 50, which are disposed in the vicinity of the upper side space 26. In the present embodiment, the openings 50 are provided on opposite sides (one on each side) of the optical path of the exposure light EL in the X axial directions. The openings 50 are connected to a second liquid recovery apparatus 180 via passageways 51. The second liquid recovery apparatus 180 comprises a vacuum system and is capable of recovering the liquid by suctioning. Each of the passageways 51 comprises an internal passageway, which is formed inside the liquid immersion member 4, and a passageway, which is formed from a pipe that connects the internal passageway and the second liquid recovery apparatus 180. The liquid recovered via the openings 50 is recovered by the second liquid recovery apparatus 180 via the passageways 51. Furthermore, the vacuum system of the second liquid recovery apparatus 180 does not have to include a vacuum pump.

Figure 19:
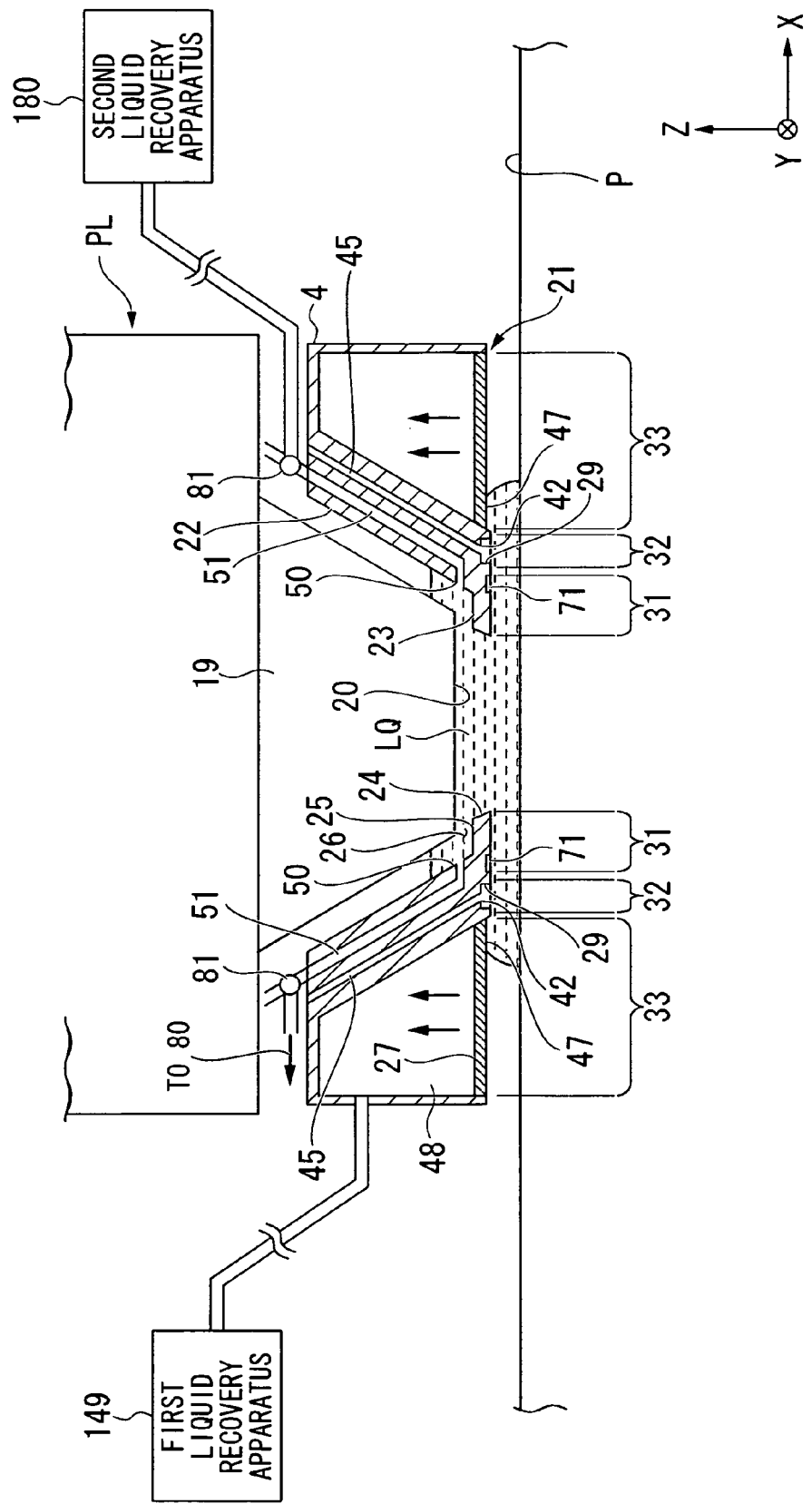
FIG. 19 is a side cross sectional view that is parallel to the XZ plane and shows the vicinity of the liquid immersion member according to the sixth embodiment.
Figure 20:
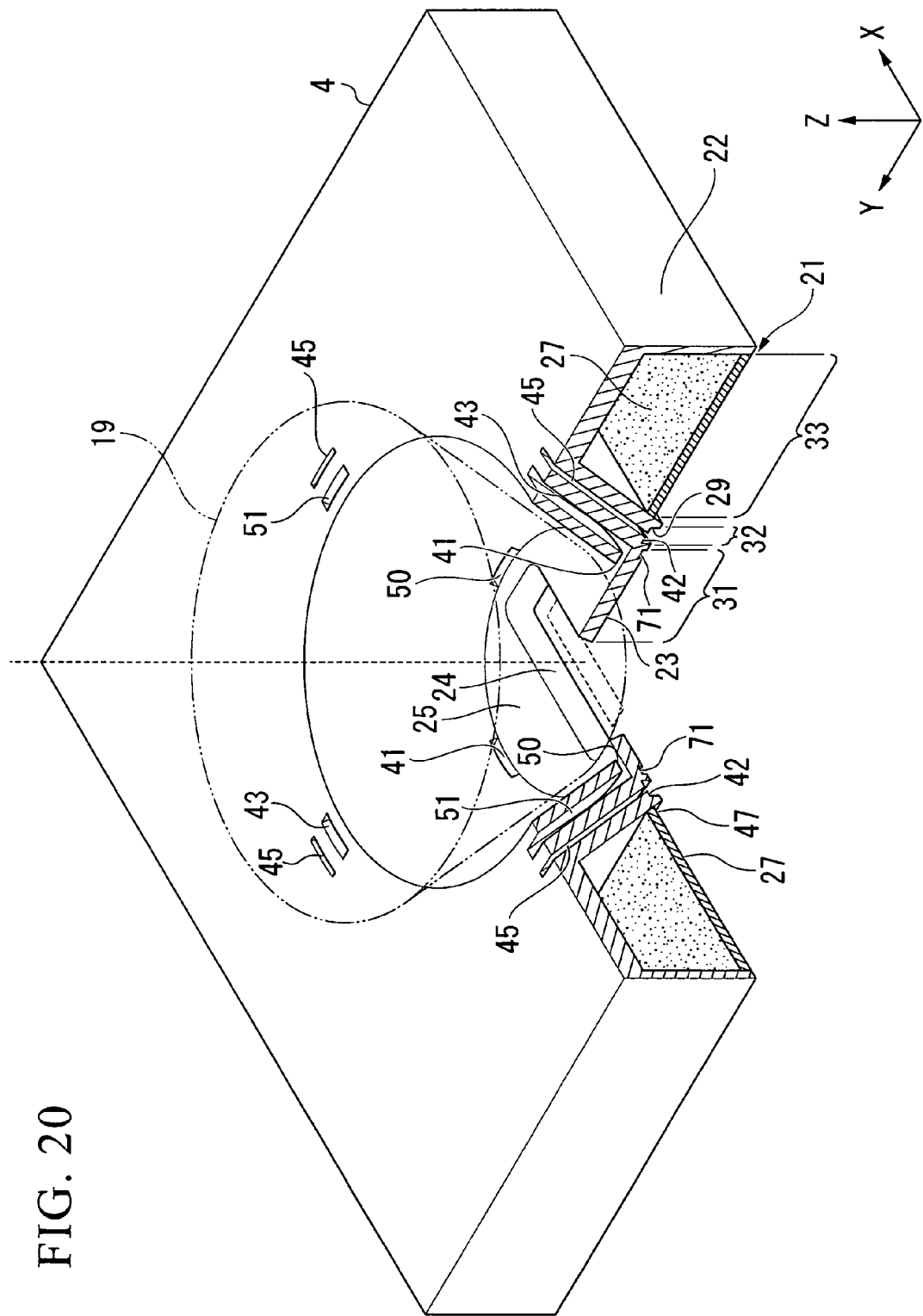
FIG. 20 is a partial, broken, schematic oblique view that shows the liquid immersion member according to the sixth embodiment.
Figure 21:
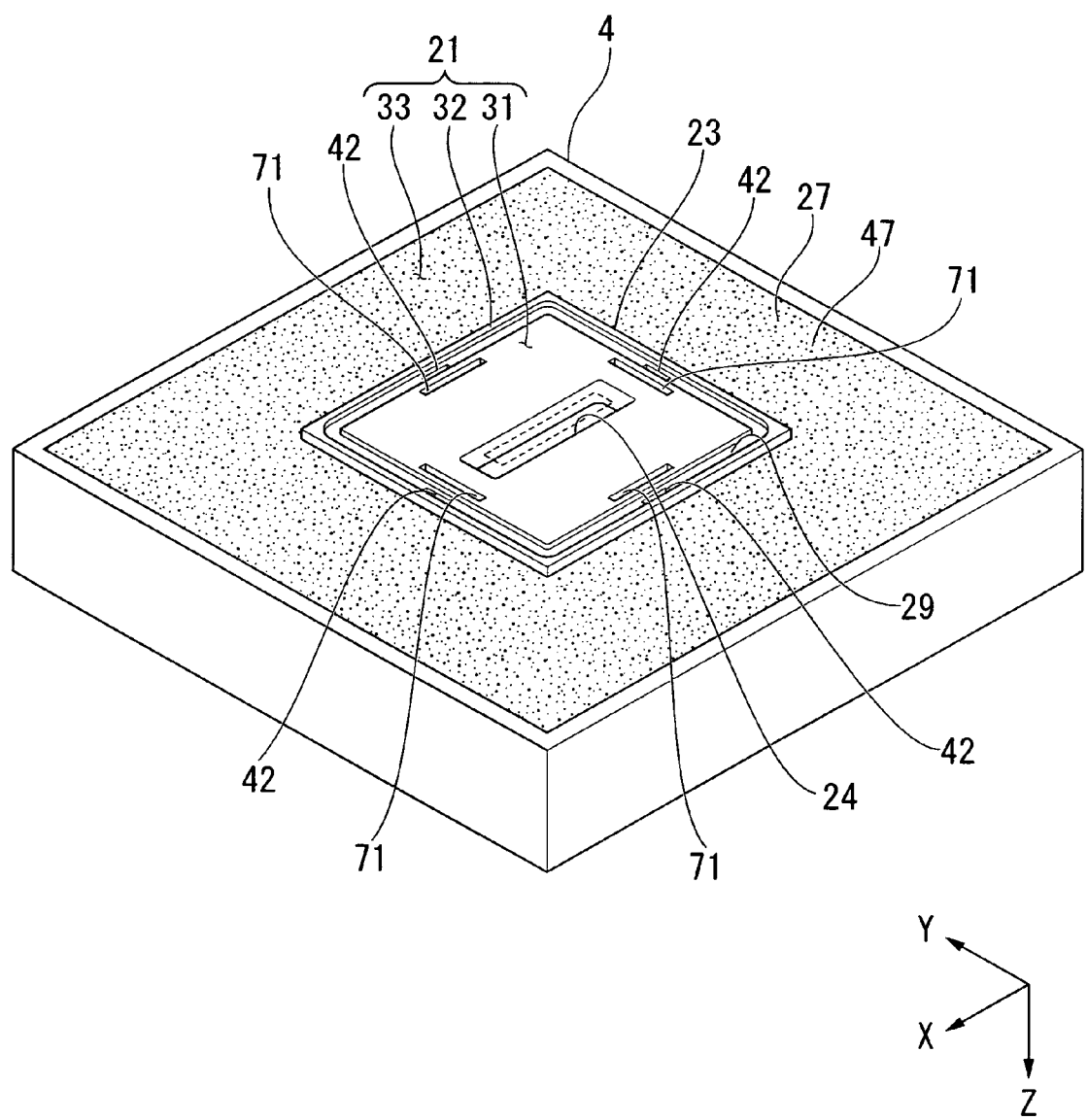
FIG. 21 is an oblique view that shows the liquid immersion member according to the sixth embodiment, viewed from the lower side.

As shown in FIG. 19, in the present embodiment, a passageway switching mechanism 81, which comprises, for example, a valve mechanism, is disposed in each of the passageways 51. In the present embodiment, when the liquid recovery operation that uses the second liquid recovery apparatus 180 is not being performed, the control apparatus 5 forms an opening in part of each of the passageways 51 by controlling the corresponding passageway switching mechanisms 81. The openings of the passageways 51 are disposed in an external space (ambient environment) that surrounds the liquid immersion member 4 (the immersion space LS). Namely, in the present embodiment, when the liquid recovery operation that uses the second liquid recovery apparatus 180 is not being performed, the passageway switching mechanisms 81 are controlled so that the openings 50, which are disposed in the vicinity of the upper side space 26, and the openings of the passageways 51, which are disposed in the external space, are in communication with one another. In the present embodiment, the external space includes the atmospheric space. Accordingly, when the liquid recovery operation that uses the second liquid recovery apparatus 180 is not being performed, the upper side space 26 and the external space (atmospheric space) are in communication and the upper side space 26 is open to the atmosphere via the passageways 51. That said, the upper side space 26 does not have to be brought into communication with the external space (atmospheric space) when the liquid recovery operation that uses the second liquid recovery apparatus 180 is not being performed, and, in this case, the passageway switching mechanisms 81 may be omitted.

One example of an operation that forms the immersion space LS with the first liquid LQ will now be explained. To form the immersion space LS, the control apparatus 5 uses the first supply ports 41 to supply the first liquid LQ to the optical path of the exposure light EL. When the first liquid LQ is being supplied, the control apparatus 5 disposes the prescribed member at a position at which it opposes both the emergent surface 20 of the last optical element 19 and the lower surface 21 of the liquid immersion member 4. The first liquid LQ that is fed from the first supply apparatus 144 is supplied to the first supply ports 41 through the passageways 43. The first supply ports 41 supply the first liquid LQ to the upper side space 26. The first liquid LQ flows through the upper side space 26 and into the lower side space 28 through the opening 24. Thus, the immersion space LS is formed so that the optical path of the exposure light EL between the emergent surface 20 of the last optical element 19 and the front surface of the prescribed member is filled with the first liquid LQ.

In addition, in the present embodiment, the control apparatus 5 performs the operation of recovering the first liquid LQ using the liquid recovery port 47 in parallel with the operation of supplying the first liquid LQ using the first supply ports 41. At least some of the first liquid LQ on the prescribed member contacts the liquid contact surface 33 (the lower surface of the porous member 27) and is recovered thereby. The first liquid LQ that is recovered by the liquid recovery surface 33 is then recovered by the first liquid recovery apparatus 149 through the passageway 48.

By performing the operation of recovering the first liquid LQ using the liquid recovery port 47 in parallel with the operation of supplying the first liquid LQ using the first supply ports 41, the control apparatus 5 can form the immersion space LS with the first liquid LQ between the last optical element 19 and the liquid immersion member 4 on one side and the prescribed member on the other side.

In the present embodiment, the control apparatus 5 can synchronously move the substrate stage 1 and the measurement stage 2 in the X and Y directions with respect to the last optical element 19 while, at the same time, causing the emergent surface 20 of the last optical element 19 to oppose either the upper surface 13 of the substrate stage 1 or the upper surface 14 of the measurement stage 2, or both, in the state wherein one of the linear edges of the upper surface 13 of the substrate state 1 and one of the linear edges of the upper surface 14 of the measurement stage 2 are brought into proximity or contact with one another so that a space capable of holding the liquid between the last optical element 19 and either the substrate stage 1 or the measurement stage 2, or both, is formed continuously, as disclosed in, for example, U.S. Patent Application Publication No. 2006/0023186 and U.S. Patent Application Publication No. 2007/0127006. Thereby, the immersion space of the liquid can move from the upper surface 13 of the substrate stage 1 to the upper surface 14 of the measurement stage 2, or from the upper surface 14 of the measurement stage 2 to the upper surface 13 of the substrate stage 1, and, at the same time, leakage of the liquid can be prevented.

In the present embodiment, when the substrate P is being exposed using the first liquid LQ or when a measurement is being performed with the measuring instruments C using the first liquid LQ, the supply of the second liquid LC via the second supply ports 42 is stopped.

In addition, when the substrate P is to be exposed using the first liquid LQ or when a measurement is to be performed with one of the measuring instruments C using the first liquid LQ, the upper side space 26 is opened to the atmosphere via the passageways 51.

The exposed substrate P is then unloaded from the substrate stage 1. In order to unload the substrate P from the substrate stage 1 after the exposure, the control apparatus 5 moves the substrate state 1 to the substrate exchange position. When the substrate state 1 is to be moved to the substrate exchange position, the control apparatus 5 moves the measurement stage 2 to the exposure position and forms the immersion space LS with the first liquid LQ between the last optical element 19 and the liquid immersion member 4 on one side and the measurement stage 2 on the other side. The control apparatus 5 uses the transport system to unload the exposed substrate P from the substrate stage 1, which is disposed at the substrate exchange position.

The control apparatus 5 successively performs immersion exposures on a plurality of substrates P by repetitively performing the loading operation, which loads the substrate P prior to its exposure, the exposure operation, which exposes the substrate P, and the unloading operation, which unloads the exposed substrate P.

Thus, in the present embodiment, during the exposure of the substrate P, the first liquid LQ contacts the last optical element 19, the liquid immersion member 4, the substrate state 1 (the plate member T), and the measurement stage 2.

During the exposure of the substrate P, it is possible that a substance (e.g., an organic substance like a photosensitive material) produced (eluted) from the substrate P will intermix with the first liquid LQ. It is further possible that the substance that intermixes with the first liquid LQ will adhere as foreign matter (contaminant) to the lower surface 21 of the liquid immersion member 4. In addition, it is possible that, along with the substance produced by the substrate P, foreign matter suspended in midair will intermix with the first liquid LQ and adhere to the lower surface 21 of the liquid immersion member 4. If the foreign matter (contaminant) is left in a state wherein it adheres to the lower surface 21 of the liquid immersion member 4, then it is possible that that foreign matter will likewise adhere to the substrate P during an exposure or will contaminate the first liquid LQ supplied via the first supply ports 41. As a result, exposure failures could occur such as, for example, the generation of defects in the pattern formed on the substrate P.

In addition, it is also possible that the emergent surface 20 of the last optical element 19 will be contaminated. If the emergent surface 20 of the last optical element 19 is left in a contaminated state, then exposure failures could occur.

Accordingly, in the present embodiment, the control apparatus 5 cleans the last optical element 19 and the liquid immersion member 4 according to a prescribed timing.

Next, one example of a method of cleaning the last optical element 19 and the liquid immersion member 4 will be explained, referencing FIG. 22 and FIG. 23.

Figure 22:
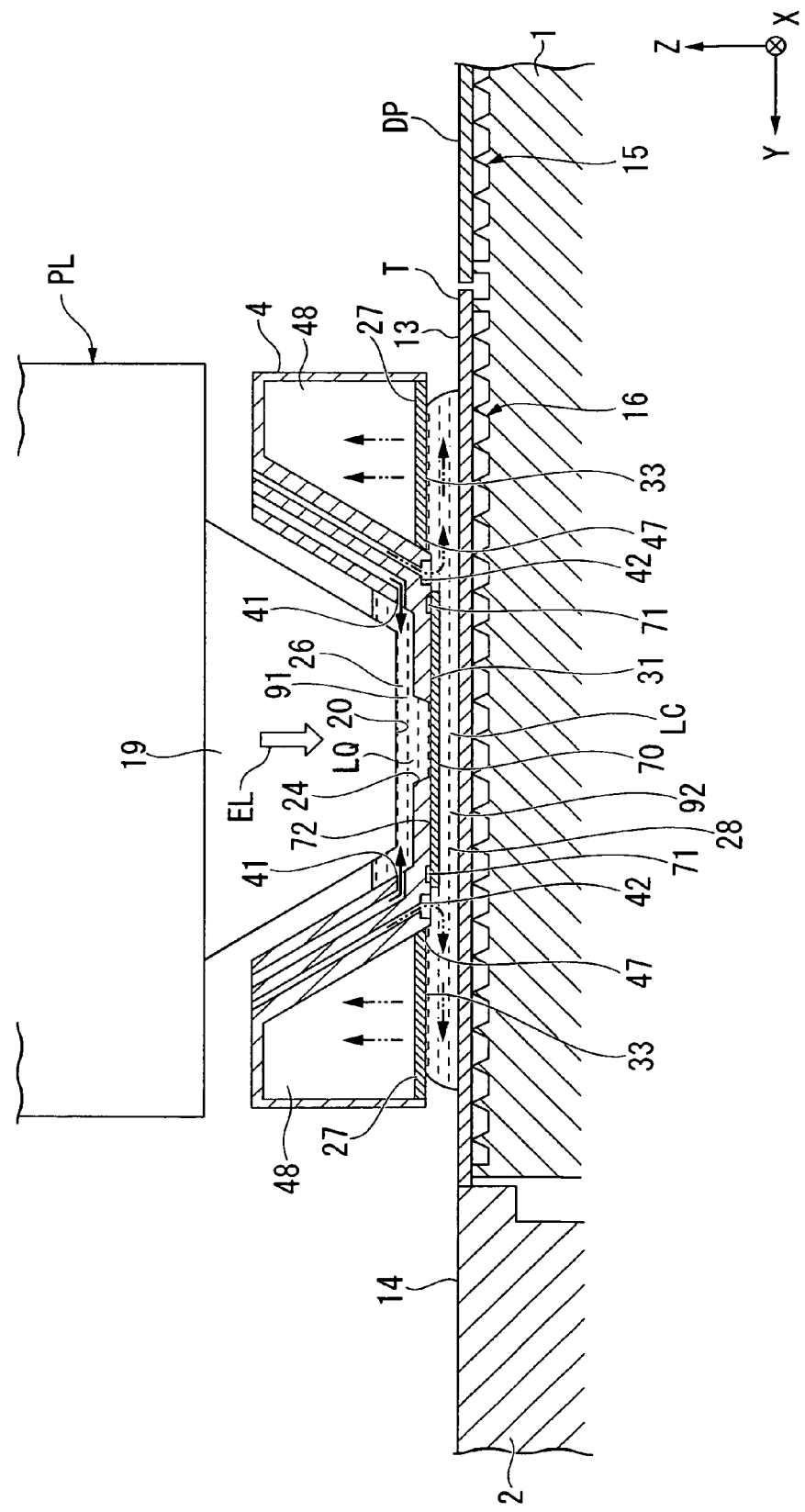
FIG. 22 is a schematic drawing that shows one example of a cleaning method according to the sixth embodiment.
Figure 23:
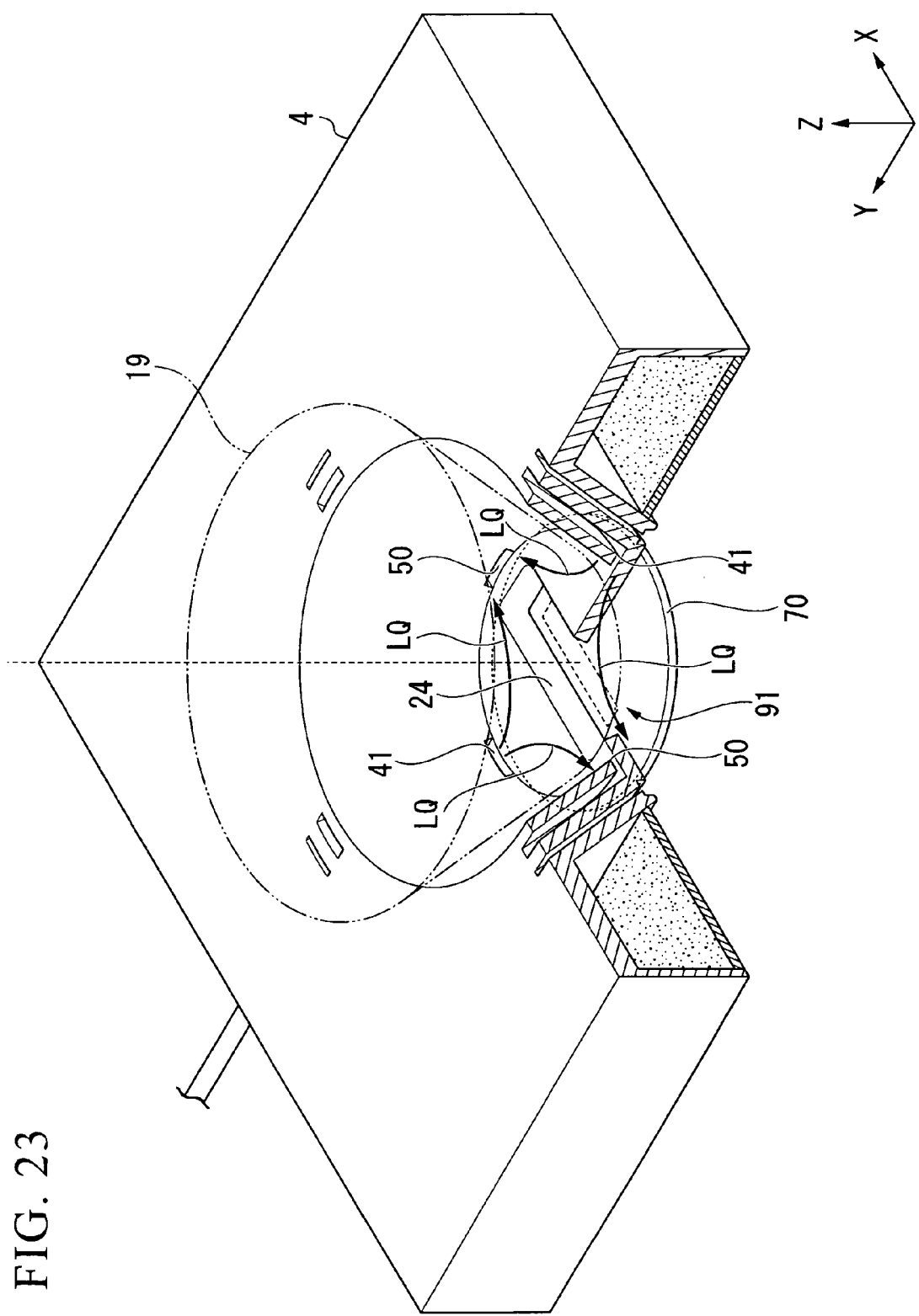
FIG. 23 is a schematic drawing that shows one example of the cleaning method according to the sixth embodiment.

As shown in FIG. 22, when the cleaning process is being performed, a dummy substrate DP is held by the first holding part 15. The dummy substrate DP is a member (a clean member) that is distinct from the substrate P used for exposure and that has a high cleanliness level that tends not to release foreign matter. The external shape of the dummy substrate DP is substantially the same as that of the substrate P, and the first holding part 15 can hold the dummy substrate DP.

The control apparatus 5 disposes the substrate stage 1 or the measurement stage 2, or both, so that it opposes the last optical element 19 and the liquid immersion member 4. In the present embodiment, the control apparatus 5 disposes the substrate stage 1 or the measurement stage 2, or both, so that it opposes the second supply ports 42 in the state wherein the upper surface 13 of the substrate stage 1 and the upper surface 14 of the measurement stage 2 are brought into proximity or contact with one another. FIG. 22 shows an example wherein the upper surface 13 of the substrate stage 1 (the plate member T) is disposed so that it opposes the second supply ports 42. Furthermore, during the cleaning operation, the upper surface 13 of the substrate state 1 and the upper surface 14 of the measurement stage 2 do not have to be proximate or in contact with one another.

As shown in FIG. 22, in the present embodiment, when the liquid immersion member 4 and the like are being cleaned, a cover member 70 is disposed in the optical path of the exposure light EL between the substrate state 1 and the emergent surface 20 of the last optical element 19. The cover member 70 is held by the holding apparatuses 71, which are disposed in the flat surface 31. As discussed above, the holding apparatuses 71 constitute an electrostatic chuck mechanism and can releasably hold the cover member 70. The cover member 70 is transported to the holding apparatuses 71 by a transport apparatus (not shown). The holding apparatuses 71 hold the cover member 70 so that the opening 24 is closed thereby.

The cover member 70 is plate shaped. The cover member 70 has an upper surface 72, which is capable of opposing the flat surface 31. The external shape of the cover member 70 within the XY plane is larger than that of the opening 24 and smaller than that of the flat surface 31.

Disposing the cover member 70 so that it closes the opening 24 forms a first space 91 between the last optical element 19 and the cover member 70 and a second space 92 between the cover member 70 and the substrate stage 1. The first space 91 comprises the upper side space 26, and the second space 92 comprises the lower side space 28.

The control apparatus 5 supplies the first liquid LQ to the first space 91 via the first supply ports 41 and supplies the second liquid LC to the second space 92 via the second supply ports 42.

When supplying the first liquid LQ to the first space 91 in the state wherein the cover member 70 is disposed in the optical path of the exposure light EL, the control apparatus 5 controls the passageway switching mechanisms 81 and the second liquid recovery apparatus 180 and performs the liquid recovery operation using the openings 50. The first supply ports 41 supply the first liquid LQ to the first space 91 so that the first liquid LQ contacts the emergent surface 20 of the last optical element 19. The first liquid LQ in the first space 91 is recovered via the openings 50.

In the present embodiment, the control apparatus 5 performs the recovery operation, which recovers the first liquid LQ using the openings 50, in parallel with the supply operation, which supplies the first liquid LQ using the first supply ports 41. As shown in FIG. 23, the first liquid LQ supplied to the first space 91 via the first supply ports 41 flows through the first space 91 while maintaining contact with the emergent surface 20 of the last optical element 19, after which it is recovered via the openings 50. Thereby, the last optical element 19 is cleaned by the first liquid LQ.

In addition, when the first space 91 is filled with the first liquid LQ, the control apparatus 5 emits the exposure light EL from the last optical element 19. The control apparatus 5 radiates the exposure light EL in order to photoclean the emergent surface 20 of the last optical element 19. The exposure light EL is ultraviolet light and the emergent surface 20 of the last optical element 19 is photocleaned by the radiation of the exposure light EL. Furthermore, it is also possible to just supply the first liquid LQ to the first space 91 without the additional step of radiating the exposure light EL to the emergent surface 20 after the first space 91 has been filled with the first liquid LQ.

In addition, to clean the liquid immersion member 4, the control apparatus 5 supplies the second liquid LC via the second supply ports 42. The second supply ports 42 supply the second liquid LC to the second space 92 so that the second liquid LC contacts the liquid immersion member 4. The liquid recovery port 47 recovers the second liquid LC in the second space 92.

In the present embodiment, the control apparatus 5 performs the operation of recovering the second liquid LC using the liquid recovery port 47 in parallel with the operation of supplying the second liquid LC using the second supply ports 42. Thereby, as shown in FIG. 8, the immersion space is formed with the second liquid LC between the liquid immersion member 4 on one side and the substrate stage 1 on the other side.

The second liquid LC contacts the lower surface (the liquid recovery surface 33) of the porous member 27. Thereby, the second liquid LC cleans the porous member 27. In addition, the second liquid LC flows into the passageway 48 via the holes of the porous member 27, flows through the passageway 48, and is recovered by the first liquid recovery apparatus 149. Accordingly, the inner surfaces of the holes of the porous member 27, the upper surface of the porous member 27, and the inner surface of the passageway 48 are all cleaned by the second liquid LC.

In the present embodiment, the size (within the XY plane) of the immersion space formed with the second liquid LC during cleaning is larger than the size (within the XY plane) of the immersion space formed with the first liquid LQ alone when the substrate P is exposed. Accordingly, a large area of the lower surface 21 of the liquid immersion member 4 contacts the second liquid LC and is cleaned thereby.

In addition, the upper surface 13 of the substrate stage 1 is disposed so that it opposes the second supply ports 42 and contacts the second liquid LC supplied via the second supply ports 42. Thereby, the upper surface 13 of the substrate state 1 (the plate member T) is cleaned by the second liquid LC.

In addition, by moving the substrate stage 1 with respect to the liquid immersion member 4 in the X and Y directions while the second liquid LC is supplied via the second supply ports 42, a larger area of the upper surface 13 of the substrate stage 1 (the plate member T) is cleaned by the second liquid LC.

In the present embodiment, because cleaning with the second liquid LC is performed in the state wherein the first holding part 15 holds the dummy substrate DP, contact between the second liquid LC and the first holding part 15 is prevented. In addition, by supplying the second liquid LC via the second supply ports 42 in the state wherein the dummy substrate DP is disposed at a position at which it opposes the second supply ports 42, the lower surface 21 of the liquid immersion member 4 alone may be cleaned.

In addition, the control apparatus 5 can clean the upper surface 14 of the measurement stage 2 with the second liquid LC by disposing the upper surface 14 of the measurement stage 2, which includes the upper surfaces of the measuring instruments C, so that it opposes the second supply ports 42 and by supplying the second liquid LC via the second supply ports 42.

Thus, in the present embodiment, the process of cleaning the prescribed members (the liquid immersion member 4, the substrate stage 1, the measurement stage 2, and the like) with the second liquid LC is performed in parallel with at least part of the process of cleaning the last optical element 19 with the first liquid LQ.

After cleaning with the second liquid LC is complete, the control apparatus 5 stops the operation of the second supply apparatus 146 and the supply of the second liquid LC using the second supply ports 42. Furthermore, prior to the exposure of the substrate P, the control apparatus 5 performs a process that eliminates the second liquid LC from the liquid immersion member 4.

In the present embodiment, the process that eliminates the second liquid LC from the liquid immersion member 4 includes a flushing process that supplies the first liquid LQ.

Figure 24:
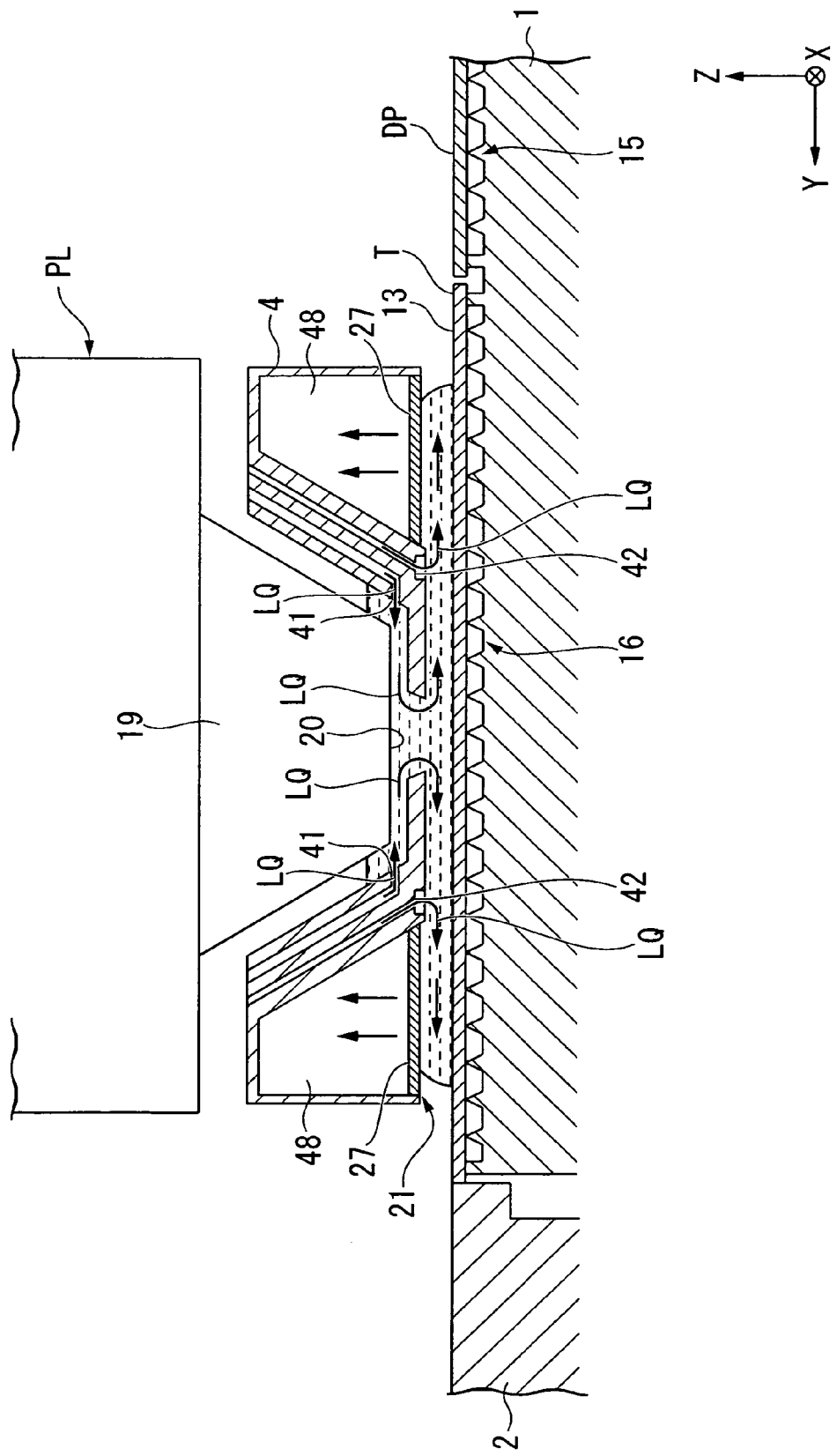
FIG. 24 is a schematic drawing that shows one example of a cleaning method according to the sixth embodiment.

As shown in FIG. 24, after the cover member 70 is retracted from the optical path of the exposure light EL, the control apparatus 5—in the state wherein the supply of the second liquid LC is stopped and the substrate stage 1, on which the dummy substrate DP is held by the first holding part 15, is disposed so that it opposes the last optical element 19 and the liquid immersion member 4—performs the recovery operation, which recovers the first liquid LQ using the liquid recovery port 47, in parallel with the supply operation, which supplies the first liquid LQ using the first supply ports 41. Thereby, the second liquid LC that remains on, for example, the lower surface 21 of the liquid immersion member 4 and the porous member 27, and in, for example, the recovery passageway 48 is washed away.

In addition, by supplying the first liquid LQ from the first supply apparatus 144 to the passageways 45, the second liquid LC that remains in, for example, the passageways 45 and the second supply ports 42 can be washed away with the first liquid LQ.

In addition, the control apparatus 5—by performing the recovery operation, which recovers the first liquid LQ using the liquid recovery port 47, in parallel with the supply operation, which supplies the first liquid LQ using the first supply ports 41 and the second supply ports 42, in the state wherein the supply of the second liquid LC is stopped and the upper surface 13 of the substrate state 1 (the plate member T) is disposed so that it opposes the last optical element 19 and the liquid immersion member 4—can wash away the second liquid LC that remains on the upper surface 13 of the substrate state 1 (the plate member T) with the first liquid LQ.

In addition, the control apparatus 5—by performing the recovery operation, which recovers the first liquid LQ using the liquid recovery port 47, in parallel with the supply operation, which supplies the first liquid LQ using the first supply ports 41 and the second supply ports 42, in the state wherein the supply of the second liquid LC is stopped and the upper surface 14 of the measurement stage 2 is disposed so that it opposes the last optical element 19 and the liquid immersion member 4—can wash away the second liquid LC that remains on the upper surface 14 of the measurement stage 2 with the first liquid LQ.

Thus, after the liquid immersion member 4 and the like are cleaned using the second liquid LC, the first liquid LQ is used to eliminate the second liquid LC, thereby preventing the intermixing of the second liquid LC with the first liquid LQ that fills the optical path of the exposure light EL during subsequent exposures of the substrate P.

After the cleaning process using the second liquid LC and the flushing process using the first liquid LQ are complete, the substrate P to be exposed is held by the first holding part 15 and the exposing process is performed on that substrate P. Prescribed processes, such as the developing process, are then performed on the exposed substrate P.

According to the present embodiment as explained above, it is possible to efficiently and satisfactorily clean the last optical element 19, the liquid immersion member 4, and the like. Accordingly, it is possible to prevent the occurrence of exposure failures and the production of defective devices caused by the contamination of the last optical element 19, the liquid immersion member 4, and the like.

As discussed above, in the present embodiment, an alkali cleaning liquid is used as the second liquid LC. Using an alkali cleaning liquid as the second liquid LC makes it possible to satisfactorily eliminate organic substances (contaminants) that result from, for example, the photosensitive material and adhere to, for example, the lower surface 21 of the liquid immersion member 4.

Moreover, if the second liquid LC, which contains the alkali cleaning liquid, contacts the last optical element 19, then the state of, for example, the front surface of the last optical element 19 could change. For example, if the last optical element 19 is formed from quartz and the second liquid LC and the last optical element 19 contact one another, then, for example, the state of the front surface or the optical characteristics of the last optical element 19 could change.

According to the present embodiment, the cover member 70 prevents contact between the second liquid LC and the last optical element 19, which makes it possible to prevent changes in the performance of the last optical element 19. In addition, it is possible to broaden the selection of liquids that may be used as the second liquid LC to clean the liquid immersion member 4 and the like.

In addition, according to the present embodiment, it is also possible to use the second liquid LC to efficiently and satisfactorily clean surfaces (liquid contact surfaces) of prescribed members that contact the first liquid LQ during the exposure of the substrate P, for example, the upper surface 13 of the substrate stage 1 and the upper surface 14 of the measurement stage 2. Accordingly, it is possible to prevent the occurrence of exposure failures and the production of defective devices caused by the contamination of these prescribed members.

Furthermore, in the present embodiment, at least part of each of the holding apparatuses 71 that hold the cover member 70 is provided to the flat surface 31; however, instead of the holding apparatuses 71, a support apparatus may be provided that supports the cover member 70 so that it can be inserted into and retracted from the lower side of the liquid immersion member 4.

In addition, in the present embodiment, the cover member 70 is disposed on the lower side of the flat surface 31, but the cover member 70 may be disposed inside the opening 24.

<Seventh Embodiment>

The following explains a seventh embodiment. In the explanation below, constituent parts that are identical or equivalent to those in the embodiment discussed above are assigned identical symbols, and the explanations thereof are therefore abbreviated or omitted.

The following text explains an exemplary case wherein the substrate state 1 is disposed at a position at which it opposes the liquid immersion member 4 when the cleaning process is performed; however, similar to the embodiment discussed above, it is also possible to dispose the dummy substrate DP, which is held by the first holding part 15, and the measurement stage 2 at this position.

FIG. 25 includes views that show one example of a liquid immersion member 104C according to the seventh embodiment. In the present embodiment, the liquid immersion member 104C comprises a shutter mechanism 74, which comprises shutter members 73A, 73B that are disposed in the optical path of the exposure light EL between the last optical element 19 and the substrate stage 1.

In the present embodiment, the shutter mechanism 74 comprises: recessed parts 75A, 75B, which are formed in the inner surfaces of the second plate part 23 that define the opening 24; the shutter members 73A, 73B, which are capable of being disposed in the recessed parts 75A, 75B, respectively; and actuators 76A, 76B, which are capable of moving the shutter members 73A, 73B. The recessed part 75A is formed in the +Y side inner surface of the second plate part 23 that defines the opening 24, and the recessed part 75B is formed in the −Y side inner surface of the second plate part 23 that defines the opening 24. The shutter members 73A, 73B are plate shaped. The shutter members 73A, 73B are capable of moving with respect to the optical path of the exposure light EL by the operation of the actuators 76A, 76B. In the present embodiment, the shutter members 73A, 73B are capable of moving in the Y axial directions. The shutter members 73A, 73B are capable of entering and exiting the recessed parts 75A, 75B by the operation of the actuators 76A, 76B, respectively.

Figure 25A:
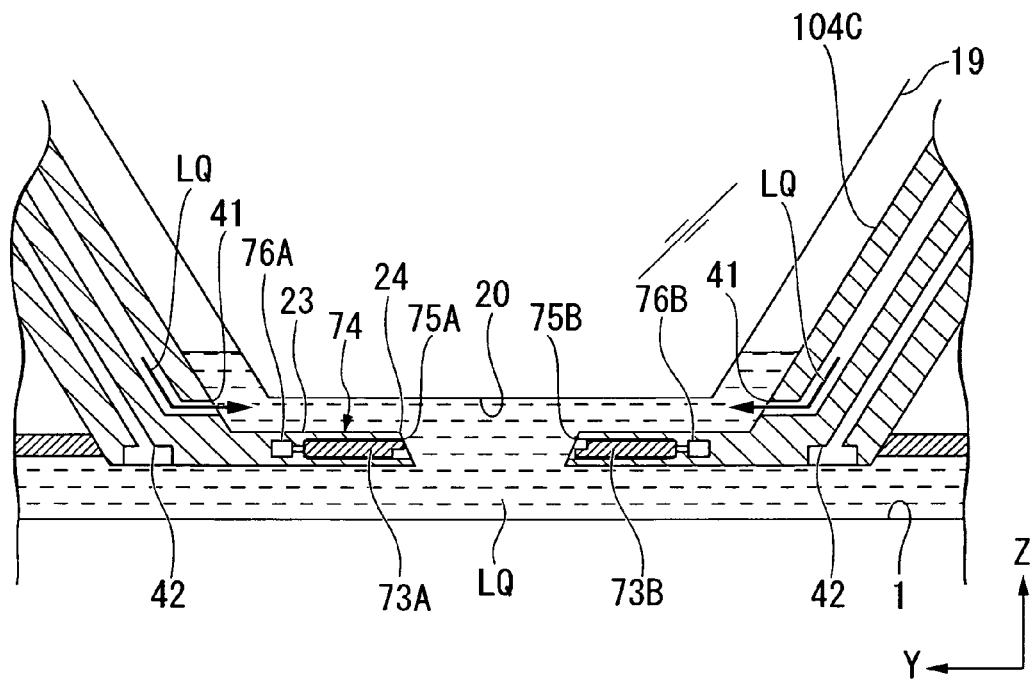
FIG. 25A includes views that show one example of the exposure apparatus according to a seventh embodiment.

For example, when the substrate P is being exposed, the shutter members 73A, 73B are disposed in the recessed parts 75A, 75B, respectively, as shown in FIG. 25A. The control apparatus 5 supplies the first liquid LQ via the first supply ports 41 in order to form the immersion space LS.

Figure 25B:
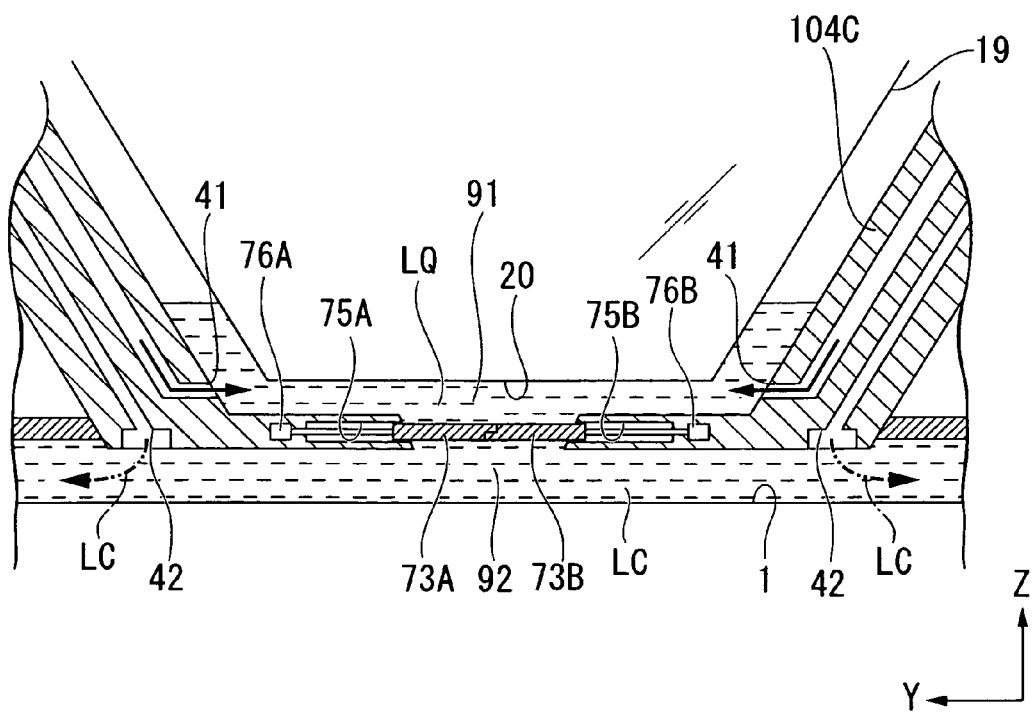
FIG. 25B includes views that show one example of the exposure apparatus according to the seventh embodiment.

In order to close the opening 24 with the shutter members 73A, 73B during the cleaning of the last optical element 19, the liquid immersion member 104C, and the like, the control apparatus 5 operates the actuators 76A, 76B so as to dispose the shutter members 73A, 73B in the opening 24, as shown in FIG. 25B. Thereby, the opening 24 is closed. The first space 91 is formed between the last optical element 19 and the shutter members 73A, 73B, and the second space 92 is formed between the shutter members 73A, 73B and the substrate stage 1.

The control apparatus 5 supplies the first liquid LQ to the first space 91 via the first supply ports 41 and supplies the second liquid LC to the second space 92 via the second supply ports 42 in the state wherein the opening 24 is closed by the shutter members 73A, 73B.

Furthermore, in the present embodiment, the shutter members 73A, 73B are disposed inside the opening 24 and are configured so that they close the opening 24; however, the shutter members 73A, 73B may be disposed below the flat surface 31 or above the upper surface 25 of the liquid immersion member 104C.

In the present embodiment, too, the last optical element 19, the liquid immersion member 4C, the substrate stage 1, and the like can be cleaned.

<Eighth Embodiment>

The following text explains an eighth embodiment. In the explanation below, constituent parts that are identical or equivalent to those in the embodiments discussed above are assigned identical symbols, and the explanations thereof are therefore abbreviated or omitted.

Each of the embodiments discussed above explained an exemplary case wherein the second supply ports 42 are disposed in the liquid immersion member 4; however, the characteristic that differentiates the eighth embodiment from the other embodiments is that second supply ports 142J are provided to a prescribed member, which is disposed at a position at which it opposes the lower surface 21 of a liquid immersion member 104J.

Figure 26:
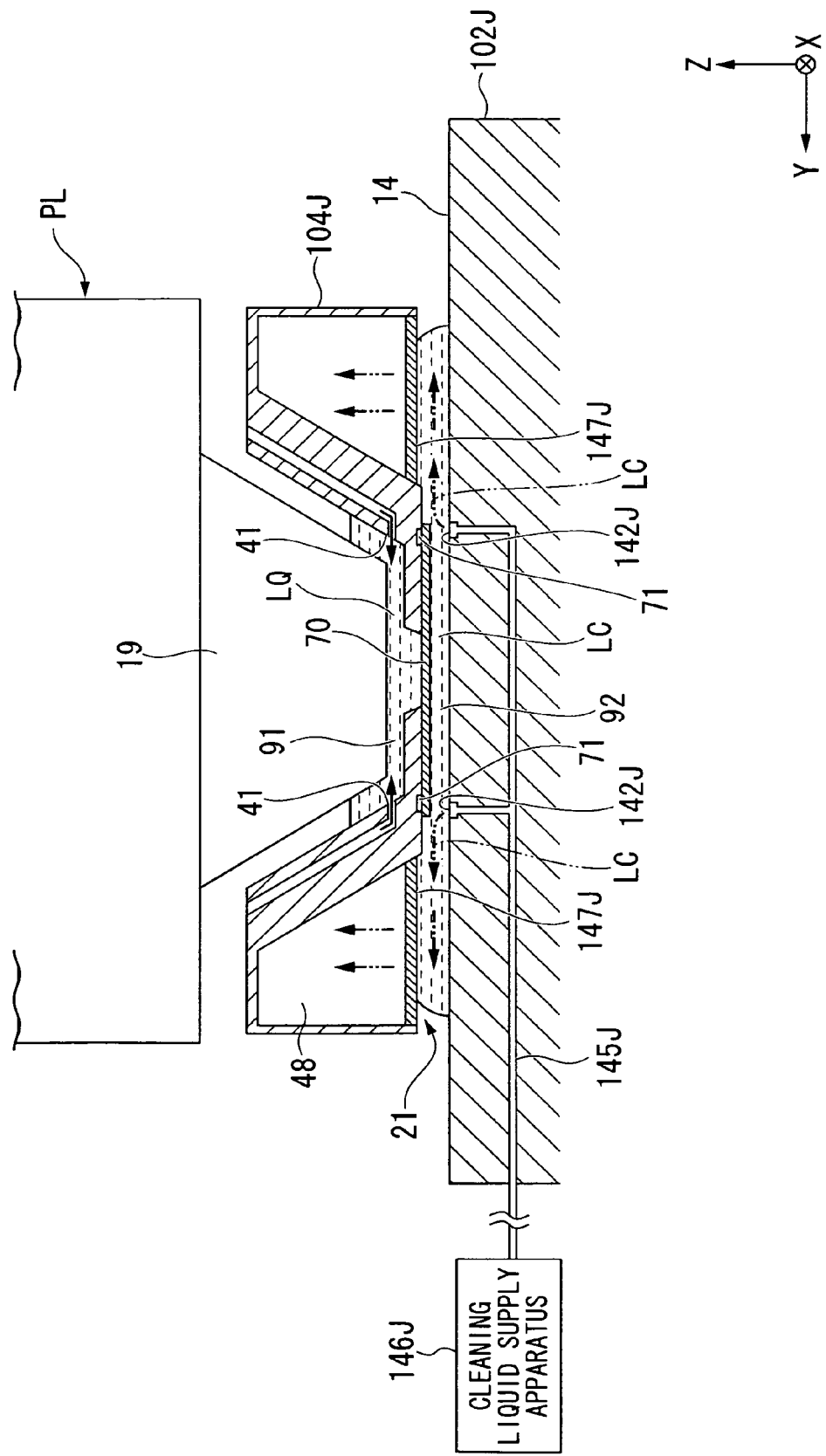
FIG. 26 is a diagram that shows one example of the exposure apparatus according to an eighth embodiment.

FIG. 26 is a view that shows one example of an exposure apparatus EX according to the eighth embodiment. In FIG. 26, a measurement stage 102J comprises the second supply ports 142J, which are disposed in the upper surface 14 of the measurement stage 102J. The second supply ports 142J are capable of opposing the lower surface 21 of the liquid immersion member 104J. The second supply ports 142J are connected to a second supply apparatus 146J via a passageway 145J. The passageway 145J comprises a supply passageway, which is formed inside the measurement stage 102J, and a passageway, which is formed from a supply pipe that connects the supply passageway and the second supply apparatus 146J.

As explained in the sixth embodiment discussed above, the present embodiment comprises a cover member 70, which is for partitioning the optical path of the exposure light EL between the last optical element 19 and the substrate stage 1 into the first space 91 and the second space 92, and holding apparatuses 71, which releasably hold the cover member 70. Furthermore, as explained in the seventh embodiment discussed above, it is also possible to use the shutter mechanism 74 to partition the optical path of the exposure light EL between the last optical element 19 and the substrate stage 1 into the first space 91 and the second space 92.

The control apparatus 5 supplies the first liquid LQ to the first space 91 via the first supply ports 41 and supplies the second liquid LC to the second space 92 via the second supply ports 42 in the state wherein the second supply ports 142J, which are disposed in the upper surface 14 of the measurement stage 102J, and the lower surface 21 of the liquid immersion member 104J are caused to oppose one another and the cover member 70 is disposed in the optical path of the exposure light EL between the last optical element 19 and the substrate stage 1.

The control apparatus 5 can clean, for example, the emergent surface 20 of the last optical element 19 by performing the recovery operation, which recovers the first liquid LQ using the openings 50 in parallel with the supply operation, which supplies the first liquid LQ using the first supply ports 41.

In addition, the control apparatus 5—by performing the recovery operation, which recovers the second liquid LC using a liquid recovery port 147J disposed in the liquid immersion member 104J, in parallel with a supply operation, which supplies the second liquid LC using the second supply ports 142J—can clean the lower surface 21 of the liquid immersion member 104J, the upper surface 14 of the measurement stage 102J, and the like.

Furthermore, the present embodiment explained an exemplary case wherein the second supply ports 142J are disposed in the measurement stage 102J, but the second supply ports may be disposed in the substrate stage 1. By performing the recovery operation, which recovers the second liquid LC using the liquid recovery ports, in parallel with the supply operation, which supplies the second liquid LC using the second supply ports, in the state wherein the lower surface 21 of the liquid immersion member opposes the second supply ports, which are disposed in the upper surface 13 of the substrate stage 1, it is possible to clean the lower surface 21 of the liquid immersion member and the upper surface 13 of the substrate stage 1. In addition, the second supply ports may be provided to a movable member that is distinct from the substrate state 1 and the measurement stage 2.

In addition, in the present embodiment, the supply ports that supply the second liquid LC may be also provided to the liquid immersion member 104J, and the second supply ports of the liquid immersion member 104J may be used in parallel with the second supply ports 142J of the prescribed member (the measurement stage 2 and the like), which is disposed at a position at which it opposes the lower surface 21 of the liquid immersion member 104J.

Furthermore, in the sixth through eighth embodiments discussed above, the first liquid LQ or the second liquid LC, or both, may be recovered using a liquid recovery part disposed at a position at which it opposes the lower surface of the liquid immersion member, either with or without using the liquid recovery port 47 (the liquid recovery surface 33). The liquid recovery part disposed at a position at which it opposes the lower surface of the liquid immersion member can be provided to, for example, the substrate state 1 or the measurement stage 2, or both.

Furthermore, each of the sixth through eighth embodiments discussed above explained an exemplary case wherein a prescribed member (e.g., the substrate stage 1, the measurement stage 2, or the dummy substrate DP) is disposed at a position at which it opposes the lower surface 21 of the liquid immersion member 4, the second liquid LC is supplied to the space between the lower surface 21 of the liquid immersion member 4 and the prescribed member, and the immersion space is thereby formed with the second liquid LC; however, as discussed above, if the liquid recovery part is disposed at a position at which it opposes the lower surface of the liquid immersion member, then the second liquid LC may be sprayed from below the liquid immersion member 4 toward the lower surface thereof in the state wherein, for example, the opening 24 is closed by the cover member 70.

In addition, as discussed above, if the liquid recovery part is disposed at a position at which it opposes the lower surface of the liquid immersion member, then the second liquid LC may be supplied, for example, via the liquid recovery port 47 of the liquid immersion member.

Furthermore, each of the sixth through eighth embodiments discussed above explained an exemplary case wherein the first liquid LQ is supplied to the first space 91 via the first supply ports 41 in order to clean the last optical element 19; however, a cleaning liquid that is distinct from the first liquid LQ may also be supplied to the first space 91 via the first supply ports 41. For example, it is possible to supply a cleaning liquid that contains, for example, aqueous hydrogen peroxide. In so doing, it is possible to clean the emergent surface 20 of the last optical element 19 satisfactorily.

In addition, in each of the sixth through eighth embodiments discussed above, additional liquid supply ports may be separately provided in the vicinity of the first supply ports 41, and the liquid (e.g., the first liquid LQ or a cleaning liquid that is distinct from the first liquid) may be supplied to the upper side space 26 via those additional liquid supply ports. In this case, the supply operation may be performed in parallel with the operation of supplying the first liquid LQ via the first supply ports 41.

Furthermore, in each of the embodiments discussed above, the second liquid LC contains ammonia, but the present invention is not limited thereto; for example, the second liquid LC may contain choline, sodium hydroxide (NaOH), potassium hydroxide (KOH), tetramethylammonium hydroxide, or some combination thereof.

In addition, in each of the embodiments discussed above, ultrasonic cleaning, which imparts vibrations (ultrasonic waves) to the second liquid LC, may be used in parallel with the above cleaning process.

Furthermore, the optical path on the emergent side (image plane side) of the last optical element 19 of the projection optical system PL according to each of the embodiments discussed above is filled with the first liquid LQ; however, it is also possible to adopt, as the projection optical system PL, a projection optical system wherein the optical path on the incident side (object plane side) of the last optical element 19 is also filled with liquid as disclosed in, for example, PCT International Publication WO2004/019128.

Furthermore, although the first liquid LQ in each of the embodiments discussed above is water, it may be a liquid other than water. For example, it is also possible to use hydrofluoro-ether (HFE), perfluorinated polyether (PFPE), Fomblin oil, or the like as the first liquid LQ. In addition, it is also possible to use various fluids, for example, a supercritical fluid, as the first liquid LQ.

Furthermore, the substrate P in each of the embodiments discussed above is not limited to a semiconductor wafer for fabricating semiconductor devices, but can also be adapted to, for example, a glass substrate for display devices, a ceramic wafer for thin film magnetic heads, or the original plate of a mask or a reticle (synthetic quartz or a silicon wafer) that is used by an exposure apparatus.

The exposure apparatus EX can also be adapted to a step-and-scan type scanning exposure apparatus (a scanning stepper) that scans and exposes the pattern of the mask M by synchronously moving the mask M and the substrate P, as well as to a step-and-repeat type projection exposure apparatus (a stepper) that successively steps the substrate P and performs a full field exposure of the pattern of the mask M with the mask M and the substrate P in a stationary state.

Furthermore, when performing an exposure with a step-and-repeat system, the projection optical system PL is used to transfer a reduced image of a first pattern onto the substrate P in a state wherein the first pattern and the substrate P are substantially stationary, after which the projection optical system PL may be used to perform a full-field exposure of the substrate P, wherein a reduced image of a second pattern partially superposes the transferred first pattern in a state wherein the second pattern and the substrate P are substantially stationary (as in a stitching type full-field exposure apparatus). In addition, the stitching type exposure apparatus can also be adapted to a step-and-stitch type exposure apparatus that successively steps the substrate P and transfers at least two patterns onto the substrate P so that they are partially superposed.

In addition, the present invention can also be adapted to, for example, an exposure apparatus that combines on a substrate the patterns of two masks through a projection optical system and double exposes, substantially simultaneously, a single shot region on the substrate using a single scanning exposure, as disclosed in, for example, U.S. Pat. No. 6,611,316. In addition, the present invention can also be adapted to, for example, a proximity type exposure apparatus and a mirror projection aligner.

In addition, the present invention can also be adapted to a twin stage type exposure apparatus, which comprises a plurality of substrate stages, as disclosed in, for example, U.S. Pat. Nos. 6,341,007, 6,208,407, and 6,262,796.

The type of exposure apparatus EX is not limited to a semiconductor device fabrication exposure apparatus that exposes the substrate P with the pattern of a semiconductor device, but can also be widely adapted to exposure apparatuses that are used for fabricating, for example, liquid crystal devices or displays, and to exposure apparatuses that are used for fabricating thin film magnetic heads, image capturing devices (CCDs), micromachines, MEMS devices, DNA chips, or reticles and masks.

Furthermore, in each of the embodiments discussed above, the positions of the mask state 1 and the substrate stage 2 are measured using an interferometer system that comprises laser interferometers, but the present invention is not limited thereto; for example, an encoder system may be used that detects a scale (diffraction grating) provided to each of the stages 1, 2. In this case, a hybrid system that comprises both the interferometer system and the encoder system may also be adopted.

In addition, in each of the embodiments discussed above, an ArF excimer laser may be used as a light source apparatus that generates ArF excimer laser light, which serves as the exposure light EL; however, as disclosed in, for example, U.S. Pat. No. 7,023,610, a harmonic generation apparatus may be used that outputs pulsed light with a wavelength of 193 nm and that comprises: an optical amplifier part, which has a solid state laser light source (such as a DFB semiconductor laser or a fiber laser), a fiber amplifier, and the like; and a wavelength converting part. Moreover, in the abovementioned embodiments, both the illumination region and the projection region are rectangular, but they may be some other shape, for example, arcuate.

Furthermore, in each of the embodiments discussed above, an optically transmissive mask is used wherein a prescribed shielding pattern (or phase pattern or dimming pattern) is formed on an optically transmissive substrate; however, instead of such a mask, a variable pattern forming mask (also called an electronic mask, an active mask, or an image generator), wherein a transmissive pattern, a reflective pattern, or a light emitting pattern is formed based on electronic data of the pattern to be exposed, may be used as disclosed in, for example, U.S. Pat. No. 6,778,257. The variable pattern forming mask comprises a digital micromirror device (DMD), which is one kind of a non-emissive type image display device (spatial light modulator). In addition, instead of a variable pattern forming mask provided with a non-emissive type image display device, a pattern forming apparatus that comprises a self luminous type image display device may be provided. Examples of a self luminous type image display device include a cathode ray tube (CRT), an inorganic electroluminescence display, an organic electroluminescence display (OLED: organic light emitting diode), an LED display, an LD display, a field emission display (FED), and a plasma display (PDP: plasma display panel).

Each of the embodiments discussed above explained an exemplary case of an exposure apparatus that is provided with the projection optical system PL, but the present invention can be adapted to an exposure apparatus and an exposing method that do not use the projection optical system PL. Thus, even if the projection optical system PL is not used, the exposure light can be radiated to the substrate through optical members, such as lenses, and an immersion space can be formed in a prescribed space between the substrate and those optical members.

In addition, by forming interference fringes on the substrate P as disclosed in, for example, PCT International Publication WO2001/035168, the present invention can also be adapted to an exposure apparatus (a lithographic system) that exposes the substrate P with a line-and-space pattern.

As described above, the exposure apparatus EX of the present embodiment is manufactured by assembling various subsystems, as well as each constituent element recited in the claims of the present application, so that prescribed mechanical, electrical, and optical accuracies are maintained. To ensure these various accuracies, adjustments are performed before and after this assembly, including an adjustment to achieve optical accuracy for the various optical systems, an adjustment to achieve mechanical accuracy for the various mechanical systems, and an adjustment to achieve electrical accuracy for the various electrical systems. The process of assembling the exposure apparatus from the various subsystems includes, for example, the mechanical interconnection of the various subsystems, the wiring and connection of electrical circuits, and the piping and connection of the atmospheric pressure circuit. Naturally, prior to performing the process of assembling the exposure apparatus from these various subsystems, there are also the processes of assembling each individual subsystem. When the process of assembling the exposure apparatus from the various subsystems is complete, a comprehensive adjustment is performed to ensure the various accuracies of the exposure apparatus as a whole. Furthermore, it is preferable to manufacture the exposure apparatus in a clean room wherein, for example, the temperature and the cleanliness level are controlled.

Figure 27:
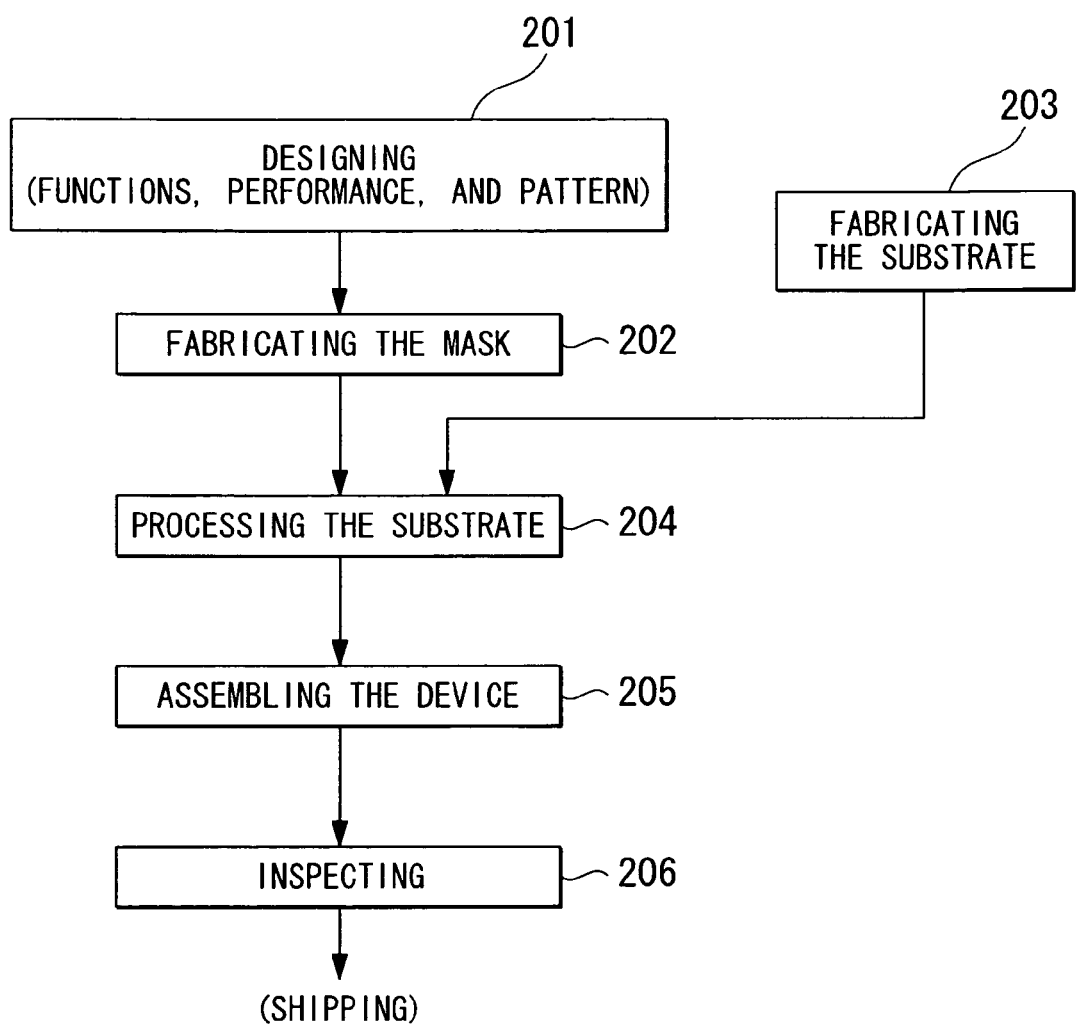
FIG. 27 is a flow chart for explaining one example of a process of fabricating a microdevice.

As shown in FIG. 27, a micro-device, such as a semiconductor device, is manufactured by: a step 201 that designs the functions and performance of the micro-device; a step 202 that fabricates a mask (a reticle) based on this designing step; a step 203 that fabricates a substrate, which is the base material of the device; a substrate processing step 204 that comprises a substrate process (exposure process) that includes, in accordance with the embodiments discussed above, exposing the substrate with the exposure light using the mask pattern and developing the exposed substrate; a device assembling step 205 (which includes fabrication processes such as dicing, bonding, and packaging processes); an inspecting step 206; and the like.

Furthermore, the features of each of the embodiments discussed above can be appropriately combined. There are also cases wherein some of the constituent elements are not used. As far as is permitted, the disclosures in all of the patent documents such as Japanese Patent Publication and U.S. patent and the like cited in the above respective embodiments and modified examples, are incorporated herein by reference.

What is claimed is:

1. An exposure apparatus that exposes a substrate with exposure light that passes through an exposure liquid, comprising:
    an optical member, which has an emergent surface wherefrom the exposure light emerges;
    a first supply port, which supplies the exposure liquid;
    a liquid immersion member having an opening through which the exposure light from the emergent surface can pass, the opening being disposed below the emergent surface and the exposure liquid being supplied from the first supply port to an upper side space on the upper side of the opening;
    a second supply port, which supplies a cleaning liquid to a lower side space on the lower side of the opening, so as to contact the liquid immersion member; and
    a preventive apparatus, which prevents the cleaning liquid from flowing into the upper side space from the lower side space through the opening by supplying the exposure liquid via the first supply port to the upper side space, wherein
        the upper side space and the lower side space are in fluid communication with each other via the opening.

2. An exposure apparatus according to claim 1, wherein the preventive apparatus includes a cover member for closing the opening.

3. An exposure apparatus according to claim 2, wherein the preventive apparatus includes a holding apparatus that releasably holds the cover member.

4. An exposure apparatus according to claim 3, wherein at least part of the holding apparatus is provided to the liquid immersion member.

5. An exposure apparatus according to claim 1, wherein the preventive apparatus forms a fluid curtain in the vicinity of the opening.

6. An exposure apparatus according to claim 5, wherein the fluid curtain is formed by flowing the fluid from one side to the other side of the opening.

7. An exposure apparatus according to claim 5, wherein the fluid includes a gas.

8. An exposure apparatus according to claim 1, wherein the preventive apparatus comprises the first supply port.

9. An exposure apparatus according to claim 8, wherein
    the liquid immersion member has a flat surface that is disposed around the opening and faces the lower side space on the lower side of the opening; and
    the second supply port is disposed outward from the flat surface with respect to the opening.

10. An exposure apparatus according to claim 8, wherein the preventive apparatus prevents the cleaning liquid from contacting the optical member by supplying the exposure liquid via the first supply port.

11. An exposure apparatus according to claim 8, wherein the first supply port is disposed closer to the optical member than the second supply port is.

12. An exposure apparatus according to claim 8, wherein the first supply port is disposed above the second supply port.

13. An exposure apparatus according to claim 1, wherein the cleaning liquid is supplied to a space between the liquid immersion member and a prescribed member.

14. An exposure apparatus according to claim 13, wherein the preventive apparatus prevents the cleaning liquid and the optical member from contacting one another by providing a barrier between the optical member and the prescribed member.

15. An exposure apparatus according to claim 14, wherein the barrier includes a cover member, which is disposed between the optical member and the prescribed member.

16. An exposure apparatus according to claim 15, wherein the preventive apparatus includes a holding apparatus, which releasably holds the cover member.

17. An exposure apparatus according to claim 16, wherein at least part of the holding apparatus is provided to the liquid immersion member.

18. An exposure apparatus according to claim 14 wherein the barrier includes a fluid curtain.

19. An exposure apparatus according to claim 18, wherein the fluid includes a gas.

20. An exposure apparatus according to claim 13, wherein the prescribed member is movable with respect to the liquid immersion member.

21. An exposure apparatus according to claim 20, further comprising:
    a stage, which is movable with respect to the liquid immersion member; wherein the prescribed member constitutes part of the stage.

22. An exposure apparatus according to claim 21, wherein the stage comprises a substrate stage, which holds the substrate.

23. An exposure apparatus according to claim 21, wherein the stage includes a measurement stage, whereon at least one measuring instrument is mounted.

24. An exposure apparatus according to claim 21, wherein the stage includes the second supply port.

25. An exposure apparatus according to claim 13, wherein the prescribed member is cleaned by the cleaning liquid.

26. An exposure apparatus according to claim 25, wherein
    the liquid immersion member comprises the second supply port; and
    the prescribed member is disposed so as to oppose the second supply port.

27. An exposure apparatus according to claim 1, wherein the liquid immersion member comprises the second supply port.

28. An exposure apparatus according to claim 1, wherein the liquid immersion member is cleaned by the cleaning liquid.

29. An exposure apparatus according to claim 1, wherein the liquid immersion member includes the first supply port.

30. An exposure apparatus according to claim 1, wherein the cleaning liquid includes an alkali.

31. An exposure apparatus according to claim 1, further comprising:
 a liquid recovery port configured to recover at least one of the exposure liquid and the cleaning liquid.

32. A device fabricating method comprising:
 exposing a substrate using an exposure apparatus according to claim 1; and
 developing the exposed substrate.

33. A method of cleaning an exposure apparatus that exposes a substrate with exposure light that passes through an exposure liquid, the exposure apparatus including: (1) an optical member, which has an emergent surface wherefrom the exposure light emerges; (2) a liquid immersion member, having an opening through which the exposure light from the emergent surface can pass, the opening being disposed below the emergent surface; and (3) a first supply port, which supplies the exposure liquid, the method comprising:
 disposing a prescribed member so as to oppose the liquid immersion member having the opening;
 supplying the exposure liquid to an upper side space on an upper side of the opening; and
 supplying a cleaning liquid to a lower side space on a lower side of the opening between the liquid immersion member and the prescribed member, wherein
  the cleaning liquid is prevented from flowing to the upper side space from the lower side space through the opening by supplying the exposure liquid via the first supply port to the upper side space so that the cleaning liquid and the optical member are prevented from contacting one another, and
  the upper side space and the lower side space are in fluid communication with each other via the opening.

34. A cleaning method according to claim 33, wherein the prescribed member is movable with respect to the liquid immersion member.

35. A cleaning method according to claim 34, wherein
 the exposure apparatus includes a substrate holding part, which releasably holds the substrate; and
 the prescribed member comprises a dummy substrate, which is held by the substrate holding part.

36. A cleaning method according to claim 33, further comprising:
 stopping the supply of the cleaning liquid; and
 eliminating the cleaning liquid from the prescribed member prior to the exposure of the substrate.

37. A cleaning method according to claim 36, wherein the elimination of the cleaning liquid includes the supply of the exposure liquid.

38. A device fabricating method comprising:
 cleaning an exposure apparatus, which exposes a substrate with exposure light that passes through an exposure liquid, with a cleaning method according to claim 33;
 exposing the substrate using the exposure apparatus after the cleaning is performed; and
 developing the exposed substrate.

\* \* \* \* \*